US 6,566,204 B1

(12) United States Patent
Wang et al.

(10) Patent No.: US 6,566,204 B1
(45) Date of Patent: May 20, 2003

(54) USE OF MASK SHADOWING AND ANGLED IMPLANTATION IN FABRICATING ASYMMETRICAL FIELD-EFFECT TRANSISTORS

(75) Inventors: Fu-Cheng Wang, Sunnyvale, CA (US); Constantin Bulucea, Milpitas, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/540,734

(22) Filed: Mar. 31, 2000

(51) Int. Cl.[7] ............................................. H01L 21/336
(52) U.S. Cl. ...................... 438/286; 438/199; 438/217; 438/275; 438/279; 438/289; 438/525
(58) Field of Search .............................. 438/525, 286, 438/199, 217, 279, 275, 289

(56) References Cited

U.S. PATENT DOCUMENTS

| | | | |
|---|---|---|---|
| H986 H | 11/1991 | Codella et al. ................ 437/41 |
| 5,362,982 A | 11/1994 | Hirase et al. ................ 257/408 |
| 5,364,807 A | 11/1994 | Hwang ........................ 437/44 |
| 5,472,897 A | 12/1995 | Hsu et al. ..................... 437/44 |
| 5,482,878 A | 1/1996 | Burger et al. ................. 437/41 |
| 5,525,822 A | 6/1996 | Vinal ......................... 257/344 |
| 5,576,227 A | 11/1996 | Hsu ........................... 437/35 |
| 5,583,067 A | 12/1996 | Sanchez ....................... 437/44 |
| 5,597,752 A | 1/1997 | Niwa .......................... 437/44 |
| 5,605,855 A | 2/1997 | Chang et al. .................. 437/45 |
| 5,744,372 A | 4/1998 | Bulucea ....................... 437/34 |
| 5,943,576 A | * 8/1999 | Kapoor |
| 5,976,937 A | * 11/1999 | Rodder et al. |
| 6,008,080 A | * 12/1999 | Chuang et al. |
| 6,008,094 A | * 12/1999 | Krivokapic |
| 6,030,871 A | * 2/2000 | Eitan |
| 6,040,208 A | 3/2000 | Honeycutt et al. |
| 6,127,700 A | 10/2000 | Bulucea ...................... 257/335 |
| 6,130,134 A | * 10/2000 | Chen |
| 6,140,214 A | * 10/2000 | Violette et al. |
| 6,188,107 B1 | 2/2001 | Gardner et al. .............. 257/347 |
| 6,190,980 B1 | * 2/2001 | Yu et al. |
| 6,194,293 B1 | 2/2001 | Krivokapic ................... 438/525 |
| 6,200,862 B1 | 3/2001 | Gardner et al. .............. 438/279 |
| 6,211,011 B1 | * 4/2001 | Chen |
| 6,284,615 B1 | * 9/2001 | Pinto et al. |
| 6,291,325 B1 | * 9/2001 | Hsu |
| 6,297,111 B1 | * 10/2001 | Krivokapic |
| 6,358,824 B1 | * 3/2002 | Gossmann et al. |
| 6,372,587 B1 | * 4/2002 | Cheek et al. |
| 6,373,102 B1 | 4/2002 | Huang ......................... 257/345 |

FOREIGN PATENT DOCUMENTS

| | | |
|---|---|---|
| EP | 0 083 447 | 7/1983 |
| EP | 0 359 530 A2 | 3/1990 |

OTHER PUBLICATIONS

Anholt et al., "A Process and Device Model for GaAs MESFET Technology: GATES," *IEEE Trans. CAD*, vol. 8, No. 4, Apr. 1989, pp. 350–359.

(List continued on next page.)

*Primary Examiner*—Long Pham
(74) *Attorney, Agent, or Firm*—Skjerven Morrill LLP; Ronald J. Meetin

(57) ABSTRACT

To furnish an IGFET (120 or 122) with an asymmetrically doped channel zone (144 or 164), a mask (212) is provided over a semiconductor body and an overlying electrically insulated gate electrode (148P or 168P). Ions of a semiconductor dopant species are directed toward an opening (213) in the mask from two different angular orientations along paths that originate laterally beyond opposite respective opening-defined sides of the mask. The location and shape of the opening are controlled so that largely only ions impinging from one of the angular orientations enter the intended location for the channel zone. Ions impinging from the other angular orientation are shadowed by the mask from entering the channel zone location. Although the ions impinging from this other angular orientation do not significantly dope the channel zone location, they normally enter the semiconductor body elsewhere, e.g., the intended location for the channel zone of another IGFET.

44 Claims, 24 Drawing Sheets

OTHER PUBLICATIONS

Antoniadis et al., "Physics and Technology of Ultra Short Channel MOSFET Devices," *IEDM Tech. Dig.*, Int'l Elect. Devs. Meeting, Dec. 8–11, 1991, pp. 21–24.

Aoki et al., "Design and Performance of 0.1$\mu$m CMOS Devices Using Low–Impurity–Channel Transistors (LICT's)," *IEEE Elect. Dev. Lett.*, vol. 13, No. 1, Jan. 1992, pp. 50–52.

Buti et al., "Asymmetrical Halo Source GOLD Drain (HS–GOLD) Deep Sub–Half Micron n–MOSFET Design for Reliability and Performance," *IEDM Tech. Dig.*, Int'l Elect. Devs. Meeting, Dec. 3–6, 1989, pp. 617–620.

Buti et al., "A New Asymmetrical Halo Source GOLD Drain (HS–GOLD) Deep Sub–Half Micrometer n–MOSFET Design Reliability and Performance," *IEEE Trans. Elect. Devs.* Aug. 1991, pp. 1751–1764.

Chang et al., "A High–Performance 0.25–$\mu$m CMOS Technology: I–Design and Characterization," *IEEE Trans. Elect. Dev.*, vol. 39, No. 4, Apr. 1992, pp. 959–966.

Chen, *CMOS Devices and Technology for VLSI* (Prentice Hall), Chapter 6, pp. 174–232.

Codella et al., "Halo Doping Effects in Submicron DI–LDD Device Design," *IEDM Tech. Dig.*, Int'l Elect. Devs. Meeting, Dec. 1–4, 1985, pp. 230–233.

Davari et al., "A High–Performance 0.25–$\mu$m CMOS Technology: II–Technology," *IEEE Trans. Elect. Devs.*, vol. 39, No. 4, Apr. 1992, pp. 967–975.

Dennard et al., "Design of Ion–Implanted MOSFET's With Very Small Physical Dimensions," *IEEE J. Solid–State Circs.*, vol. SC–9, No. 5, Oct. 1974, pp. 256–268.

Hori, "A 0.1–$\mu$m CMOS Technology With Tilt–Implanted Punchthrough Stopper (TIPS)," *IEDM Tech. Dig.*, Int'l Elect. Devs. Meeting, Dec. 11–14, 1994, pp. 75–78.

Hu et al., "Design and Fabrication of P–channel FET for 1–$\mu$m CMOS Technology," *IEDM Tech. Dig.*, Int'l Elect. Devs. Meeting, Dec. 11–15, 1982, pp. 710–713.

Hwang et al., "Degradation of MOSFETs Drive Current Due to Halo Ion Implantation," *IEDM Tech. Dig.*, Int'l Elect. Devs. Meeting, Dec. 8–11, 1996, pp. 567–570.

Kurata et al., "Self–Aligned Control of Threshold Voltages in Sub–0.2$\mu$m MOSFET's," *IEEE Trans. Elect. Devs.*, vol. 45, No. 10, Oct. 1998, pp. 2161–2166.

Liu et al., "Threshold Voltage Model for Deep–Submicrometer MOSFET's," *IEEE Trans. Elect. Devs.*, vol. 40, No. 1, Jan. 1993, pp. 86–95.

Mii et al., "Experimental High Performance Sub–0.1$\mu$m Channel nMOSFET's," *IEEE Elect. Dev. Lett.*, vol. 15, No. 1, Jan. 1994, pp. 28–30.

Moore, "Progress in Digital Integrated Electronics," *IEDM Tech. Dig.*, 1975 Int'l Elect. Devs. Meeting, Dec. 1–3, 1975, pp. 11–13.

Ogura et al., "Design and Characteristics of the Lightly Doped Drain–Source (LDD) Insulated Gate Field–Effect Transistor," *IEEE Trans. Elect. Devs.*, vol. ED–27, No. 8, Aug. 1980, pp. 1359–1367.

Ogura et al., "A Half Micron MOSFET Using Double Implanted LDD," *IEDM Tech. Dig.*, Int'l Elect. Devs. Meeting, Dec. 11–15, 1982, pp. 718–721.

Peressini et al., "Threshold Adjustment of N–Channel Enhancement Mode FETs by Ion Implantation," *IEDM Tech. Dig.*, Int'l Elect. Devs. Meeting, Dec. 3–5, 1973, pp. 467–468.

Rodder et al., "A Sub–0.18$\mu$m Gate Length CMOS Technology for High Performance (1.5V) and Low Power (1.0V)," *IEDM Tech. Dig.*, Int'l Elect. Devs. Meeting, Dec. 8–11, 1996, pp. 563–566.

Sanchez et al., "Drain–Engineered Hot–Electron–Resistant Device Structures: A Review," *IEEE Trans. Elect. Devs.*, vol. 36, Jun. 1989, pp. 1125–1132.

Shahidi et al., "High Performance Devices For A 0.15–$\mu$m CMOS Technology," *IEEE Elect. Dev. Lett.*, vol. 14, No. 10, Oct. 1993, pp. 466–468.

Su, "Tilt Angle Effect on Optimizing HALO PMOS Performance," 1997 Int'l Conf. Simulation Semicon. Procs. and Devs., Dec. 8–10, 1997, pp. 33–36.

Takeda et al., "An As–P(n+n–) Double Diffused Drain MOSFET for VLSIs," *IEEE Trans. Elect. Devs.*, Jun. 1983, vol. ED–30, pp. 652–657.

Taur et al., "High Performance 0.1 $\mu$m CMOS Devices With 1.5V Power Supply," *IEDM Tech. Dig.*, Int'l Elect. Devs. Meeting, Dec. 5–8, 1993, pp. 127–130.

Thompson et al,. "MOS Scaling: Transistor Challenges for the 21$^{st}$ Century," *Intel Technology J.*, Q398, 1998, pp. 1–9.

Yan et al., "Scaling the Si metal–oxide–semiconductor field–effect transistor into the 0.1$\mu$m regime using vertical doping engineering," *Appl. Phys. Lett.*, vol. 59, No. 25, Dec. 1991, pp. 3315–3317.

Yau, "A Simple Theory to Predict the Threshold Voltage of Short–Channel IGFET's," *Solid–State Electronics*, Oct. 1974, pp. 1059–1069.

Schuegraf et al., "Ultra–thin Silicon Dioxide Leakage Current and Scaling Limit," 1999 *Symp. VLSI Tech., Dig. Tech. Paps.*, Jun. 2–4, 1992, pp. 18 and 19.

\* cited by examiner

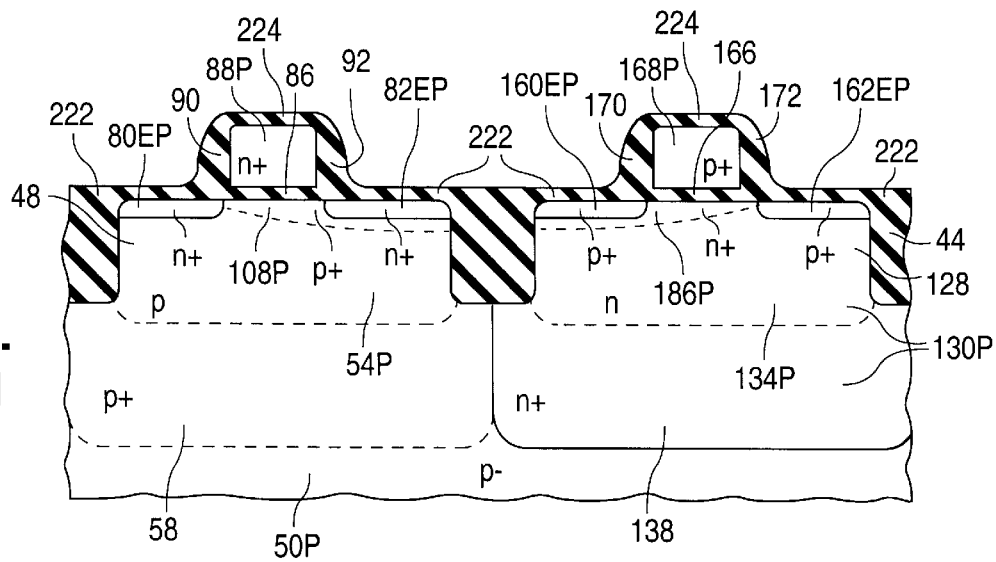
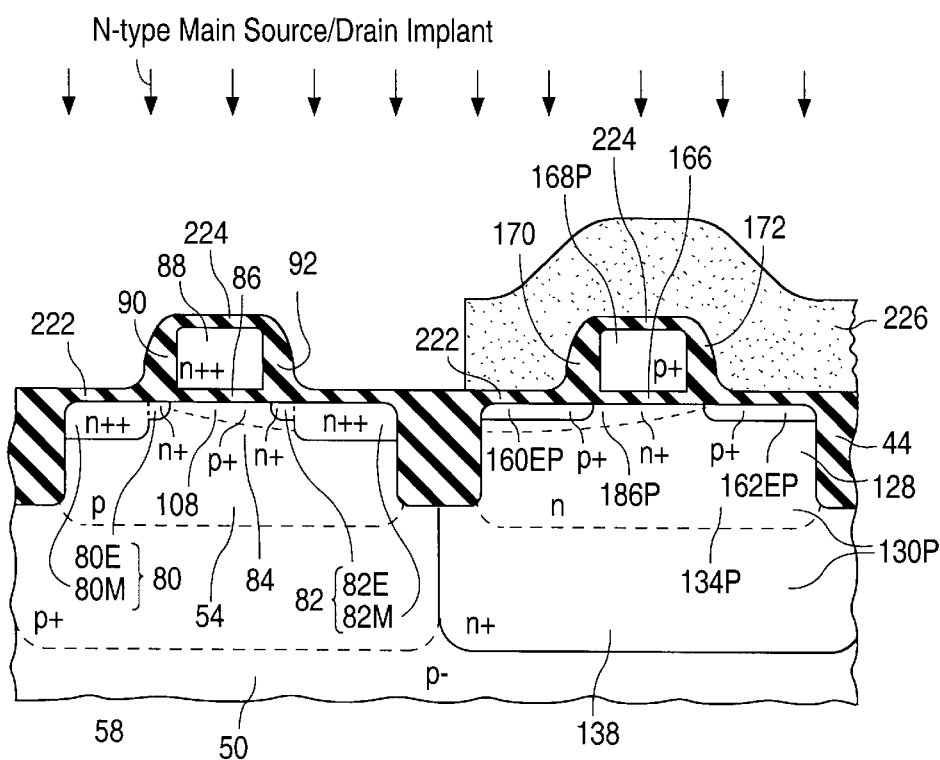

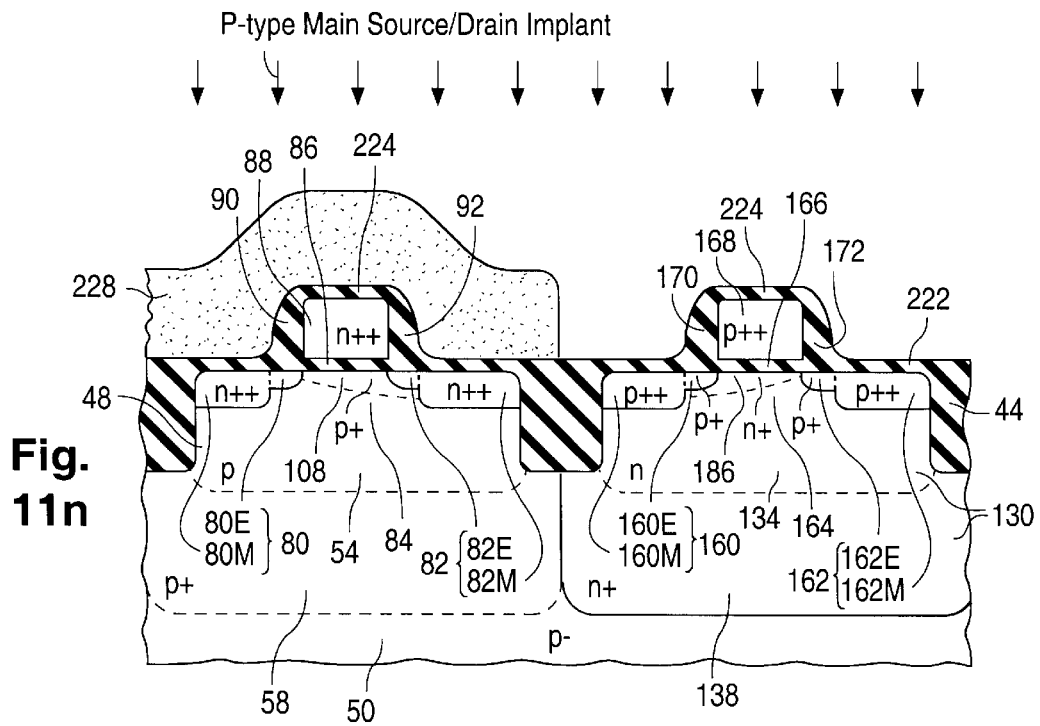
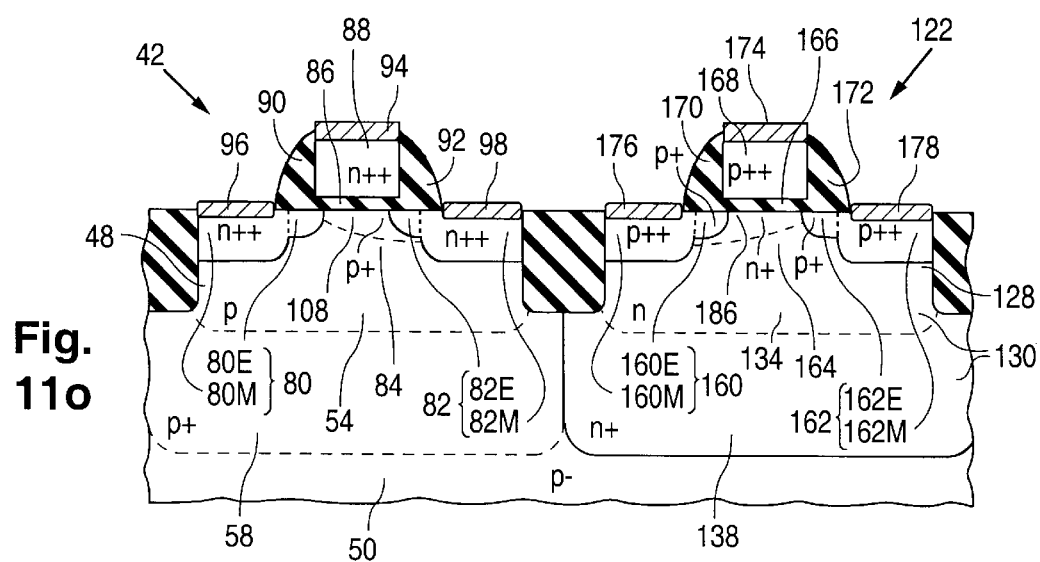

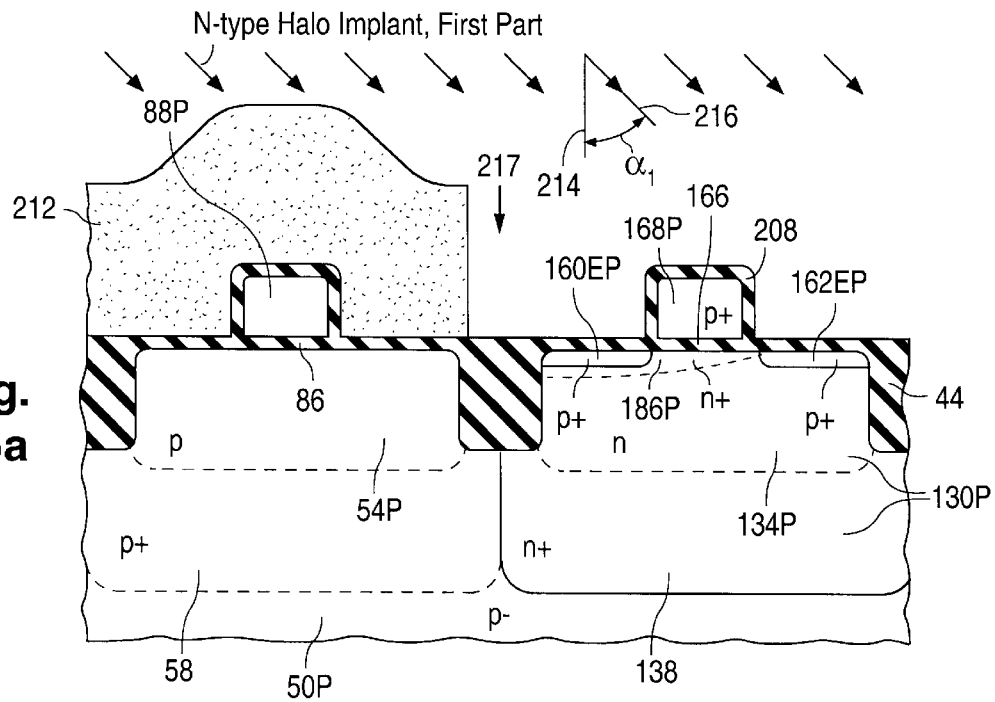
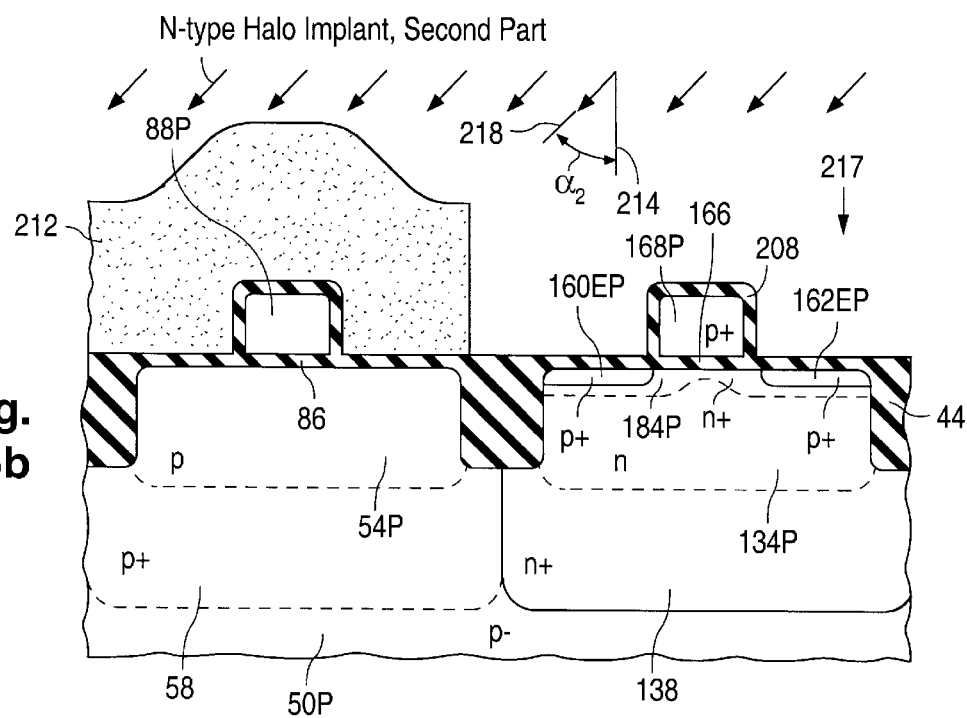

USE OF MASK SHADOWING AND ANGLED IMPLANTATION IN FABRICATING ASYMMETRICAL FIELD-EFFECT TRANSISTORS

FIELD OF USE

This invention relates to the fabrication and structure of field-effect transistors ("FETs") of the insulated-gate type. All of the insulated-gate FETs ("IGFETs") described below are enhancement-mode devices except as otherwise indicated.

BACKGROUND

An IGFET is a semiconductor device in which a gate dielectric layer electrically insulates a gate electrode from a channel zone that extends between a source and a drain. The channel zone in an enhancement-mode IGFET is part of a body region that forms respective pn junctions with the source and drain. In an enhancement-mode IGFET, the channel zone consists of all semiconductor body material between the source and drain.

FIG. 1 illustrates a conventional symmetrical n-channel enhancement-mode IGFET 10 provided with a two-part drain for reducing undesired hot-carrier injection. IGFET 10 is created from a monocrystalline silicon semiconductor body having region 12 of lightly doped p-type body material. IGFET 10 has n-type source 14, n-type drain 16, intervening p-type channel zone 18, gate electrode 20, gate dielectric layer 22, and gate sidewall spacers 24 and 26. Drain 16 consists of heavily doped main portion 16M and more lightly doped extension 16E. Source 14 similarly consists of heavily doped main portion 14M and more lightly doped extension 14E. When IGFET 10 is turned on, electrons travel from source 14 to drain 16 by way of a thin channel induced in channel zone 18 along the upper semiconductor surface.

A pair of depletion regions extend respectively along the drain/body and source/body junctions. Under certain conditions, especially when the channel length is small, the drain depletion region can extend laterally to, and merge with, the source depletion region. This phenomenon is termed punchthrough. If the drain depletion region punches through to the source depletion region, the operation of IGFET 10 cannot be controlled with gate electrode 20. Accordingly, punchthrough normally needs to be avoided.

One conventional technique for inhibiting punchthrough in an IGFET as channel length is reduced, and also for alleviating roll-off of the threshold voltage at short channel length, is to increase the net dopant concentration of the channel zone in a pocket along the source. See Ogura et al, "A Half Micron MOSFET Using Double Implanted LDD," IEDM Tech. Dig., Int'l Elec. Devs. Meeting, Dec. 11–15, 1982, pages 718–721. As an artifact of creating the increased-concentration pocket along the source, the dopant concentration in the channel zone is commonly increased in a corresponding pocket along the drain. Per Codella et al, "Halo Doping Effects in Submicron DI-LDD Device Design," IEDM Tech. Dig., Int'l Elec. Devs. Meeting, Dec. 1–4, 1985, pages 230–233, the pockets are commonly referred to as "halo".

FIG. 2 depicts a conventional symmetrical n-channel enhancement-mode halo IGFET 30 as configured in Ogura et al or Codella et al. Except as described below, IGFET 30 contains the same regions as IGFET 10 in FIG. 1. As shown in FIG. 2, channel zone 18 in n-channel IGFET 30 includes a pair of p-type halo pockets 31 and 32 doped more heavily than the remainder of channel zone 18. Halo pockets 31 and 32 are situated along the inner boundaries of source 14 and drain 16 so as to inhibit punchthrough. Metal silicide layers 33, 34, and 35 respectively contact components 14M, 16M, and 20. Portion 36 of channel zone 18 contains ion-implanted p-type threshold-adjust dopant.

Halo pockets 31 and 32 can be created in various ways. For example, p-type halo dopant is typically ion implanted through the upper semiconductor surface into the semiconductor body using gate electrode 20 as an implantation shield. The halo implant can be performed roughly perpendicular to the upper semiconductor surface as indicated in Ogura et al.

The halo implant can also be performed at a substantial angle to a perpendicular to the upper semiconductor surface. In this regard, see (a) Su, "Tilt Angle Effect on Optimizing HALO PMOS Performance," 1997 Int'l Conf. Simulation Semicon. Procs. and Devs., Sep. 8–10, 1997, pages 33–36, (b) Rodder et al, "A Sub-0.18 $\mu$m Gate Length CMOS Technology for High Performance (1.5 V) and Low Power (1.0 V)," IEDM Tech. Dig., Int'l Elec. Devs. Meeting, Dec. 8–11, 1996, pages 563–566, and (c) Hori, "A 0.1-$\mu$m CMOS Technology with Tilt-Implanted Punchthrough Stopper (TIPS)," IEDM Tech. Dig., Int'l Elec. Devs. Meeting, Dec. 11–14, 1994, pages 75–78.

As indicated above, a halo pocket is needed only at the source to alleviate the short-channel effects of punchthrough and threshold voltage roll-off. In fact, having a halo pocket at the drain can increase the threshold voltage and lower the drive current. Consequently, the performance of symmetrical IGFET 30 can be less than what would occur if halo pocket 32 were not present along drain 16.

FIG. 3 depicts a conventional asymmetrical n-channel enhancement-mode halo IGFET 38 configured as described in Hwang, U.S. Pat. No. 5,364,807, so as to have a halo pocket only along the source. Except as described below, IGFET 38 contains the same regions as IGFET 10 in FIG. 1. As illustrated in FIG. 3, halo pocket 31 is situated along source 14 in IGFET 38. IGFET 38 does not have a halo pocket along drain 16. With gate dielectric layer 22 extending laterally beyond gate electrode 20, IGFET 38 has gate sidewall spacer 26 along the drain side of electrode 20 but lacks a sidewall spacer along the source side of electrode 20.

FIG. 4 illustrates how halo pocket 31 is formed along source 14 without forming a corresponding halo pocket along drain 16. A source-side gate sidewall spacer is utilized in creating source 14. After source 14 and drain 16 are formed, a photoresist mask 39 having a opening above the source-side spacer is provided along the upper surface of the structure. The source-side spacer is removed. P-type dopant is ion implanted vertically through the mask opening to define source-adjoining halo pocket 31. Mask 39 and drain-side spacer 26 prevent a corresponding halo pocket from being formed along drain 16.

While the asymmetrical structure of IGFET 38 can enhance device performance, the technique utilized to create source-adjoining halo pocket 31 without creating a drain-adjoining halo pocket requires an extra masking step. This is disadvantageous since masking operations tend to be relatively costly. The photolithographic layout of mask 39 has to be very accurate because the opening in mask 39 needs to overlie the source-side spacer. Also, it is typically desirable to provide metal silicide regions along components 14, 16, and 20 at a point near the end of the IGFET fabrication process. Since a source-side gate sidewall spacer is not present in the final structure of IGFET 38, attempting to provide such metal silicide regions can result in the metal silicide along gate electrode 20 bridging to the metal silicide along source 14. Consequently, electrode 20 can be electrically shorted to source 14, thereby making IGFET 38 useless as a switching device.

Other techniques have been investigated for creating asymmetrical IGFETs in which a halo pocket is present along the source but not along the drain. For example, see Buti et al, "Asymmetrical Halo Source GOLD Drain (HS-GOLD) Deep Sub-Half Micron n-MOSFET Design for Reliability and Performance," *IEDM Tech. Dig.*, Int'l Elec. Devs. Meeting, Dec. 3–6, 1989, pages 617–620. In general, each of these other techniques requires an additional masking operation or/and incurs other disadvantages. It is desirable to create an asymmetrical IGFET so that its channel zone is doped more heavily along the source than along the drain without necessitating any additional masking operation and without causing performance degradation.

GENERAL DISCLOSURE OF THE INVENTION

The present invention utilizes a combination of mask shadowing and angled ion implantation for doping a channel zone of an insulated-gate field-effect transistor more heavily along one of the IGFET's two source/drain zones than along the other source/drain zone. Since one end of the channel zone is doped more heavily at one end than the other, the IGFET is an asymmetrical device. The source/drain zone that adjoins the more heavily doped end of the channel zone normally functions permanently as the source. The other source/drain zone then normally functions permanently as the drain.

More particularly, according to one aspect of the invention, a gate electrode for an IGFET is furnished generally above, and vertically separated by gate dielectric material from, an intended location for a channel zone in a semiconductor body. A mask, typically formed with actinic material, is provided over the semiconductor body and the gate electrode. The mask has a mask opening which at least partially overlies the gate electrode. The mask opening defines a pair of transverse mask sides (or edges) located laterally beyond the gate electrode and any material situated on the gate electrode's two transverse sides.

Angled ion implantation, i.e., implantation in which ions impinge significantly non-perpendicularly on the structure being implanted, is now performed with semiconductor dopant through the mask opening to dope the channel-zone location more heavily along one end than along the other end. The asymmetrical doping characteristic is achieved by causing ions of a species of the dopant to pass in an angled manner through the opening and enter the semiconductor body close to the lower edge of largely only one of the transverse sides of the gate electrode. The ions then enter the channel-zone location and, because they pass close to the lower edge of largely only one of the gate electrode's transverse sides, are more heavily concentrated at the end of the channel-zone location closest to that transverse side of the gate electrode than at the other end of the channel-zone location. When the primary dopant is of the same conductivity type as the channel-zone location, the end of the channel zone receiving the heavier ion concentration is more heavily doped.

Angled implantation in this aspect of the invention is performed from two significantly different angular orientations relative to the semiconductor body. Each angular orientation is characterized by an average tilt angle to the vertical and an average azimuthal angle as measured in a plane extending generally along the upper surface of the semiconductor body. While the tilt angles are normally close to each other, preferably the same, the azimuthal angles are very different, typically 180° apart.

The location and shape (or size) of the mask opening are controlled during the mask-providing step so that the dopant species ions impinging from largely only one of the two angular orientations pass close to the indicated lower transverse edge of the gate electrode and enter the channel-zone location. The ions that impinge from the other angular orientation are substantially blocked by the mask, the gate electrode, and any material along the gate electrode from entering the channel-zone location. In particular, the ions impinging from this other orientation are shadowed (blocked) by the mask from passing close to the other lower transverse edge of the gate electrode. While these ions do not cause a significant doping change in the channel-zone location, they normally enter the semiconductor body elsewhere during the angled implantation and thus cause doping changes elsewhere in the semiconductor body.

The angled implantation at one of the angular orientations specifically entails directing first ions of the semiconductor species toward the mask at an average tilt angle of at least 15°, normally at least 25°, along paths that originate laterally beyond one of the mask's transverse sides. The angled implantation at the other angular orientation then entails directing second ions of the dopant species toward the mask at a second average tilt angle of at least 15°, likewise preferably at least 25°, along paths that originate laterally beyond the mask's other transverse side.

The mask opening utilized for asymmetrically doping the channel zone is preferably also employed for introducing further semiconductor dopant into the semiconductor body to at least partially form a pair of source/drain zones for the IGFET. Consequently, no additional masking operation is needed to asymmetrically dope the channel zone. There is no need to perform any operation which might damage the IGFET's performance. For example, when a sidewall spacer is provided along the gate electrode in forming each source/drain zone as a main portion and a more lightly doped extension, neither of the sidewall spacers needs to be removed in order to asymmetrically dope the channel zone. The invention thus avoids the disadvantages of Hwang cited above.

At a given leakage current, an asymmetrical IGFET fabricated according to the invention has greater drive current than an otherwise comparable symmetrical halo-doped IGFET. That is, the ratio of drive current to leakage current is increased in the invention. This enables the present asymmetrical IGFET to switch faster between the on and off states than an otherwise comparable symmetrical halo-doped IGFET. Accordingly, the invention furnishes a highly economical technique for asymmetrically doping an IGFET's channel zone to achieve high performance.

Mask shadowing and angled ion implantation are typically utilized in accordance with the invention to doped intended locations for the channel zones of two IGFETs so that one of the channel-zone locations is doped asymmetrically while the other is doped symmetrically or asymmetrically. Specifically, in a further aspect of the invention, primary and additional gate electrodes are respectively furnished over, and vertically separated by gate dielectric material from, laterally separated primary and additional channel-zone locations in a semiconductor body. A mask is provided over the semiconductor body and the gate electrodes. The mask has one or more mask openings which at least partially overlie the gate electrodes and which, for each gate electrode, define first and second mask sides located laterally beyond that gate electrode and any material situated on its two transverse sides.

First ions of a semiconductor dopant species are directed towards the mask at a first average tilt angle of at least 15° along paths that originate laterally beyond the mask's first transverse sides. The location and shape (or size) of the mask opening(s) is controlled so that an electrically significant amount of the first ions passes through one such mask opening and enters the primary channel-zone location while the combination of the mask, the additional gate electrode, and any material along the additional gate electrode substantially blocks any electrically significant amount of the first ions from entering the additional channel-zone location.

Second ions of the dopant species are directed toward the mask at a second average tilt angle of at least 15° along paths that originate laterally beyond the mask's second transverse sides. The location and shape of the mask opening(s) can be controlled in such a way that the mask, the primary gate electrode, and any material along the primary gate electrode substantially block any electrically significant amount of the second ions from entering the primary channel-zone location while allowing an electrically significant amount of the second ions to pass through one such mask opening and enter the additional channel-zone location. The end result is that both channel-zone locations are doped asymmetrically with the asymmetries arranged in an opposite orientation relative to each other.

Alternatively, the location and shape of the mask opening(s) can be controlled so that an electrically significant amount of the second ions passes through the mask opening(s) and enters both channel-zone locations. As a further alternative, the location and shape of the mask opening(s) can be controlled so that the mask, the gate electrodes, and any material along the gate electrodes substantially block any electrically significant amount of the second ions from entering either channel-zone location. By using either of these two alternatives, one of the channel zones is doped asymmetrically while the other channel zone is doped symmetrically.

The present invention furnishes a semiconductor structure containing two like-polarity IGFETs such as those produced by using the first-mentioned alternative in which the second ions enter both channel-zone locations. The two IGFETs are provided along an upper surface of a semiconductor body having body material. Each IGFET has a channel zone of the body material, a pair of source/drain zones separated by the channel zone, a gate dielectric layer overlying the channel zone, and a gate electrode overlying the gate dielectric layer above the channel zone.

The channel zone of one of the IGFETs is doped more heavily along one of its source/drain zones than along its other source/drain zone and thus is asymmetrically doped. The channel zone of the other IGFET is doped more heavily close to both of its source/drain zones than at an intermediate location between them. More particularly, the channel zone of the second IGFET is typically symmetrically doped.

The multi-IGFET structure of the invention is particularly suitable for applications in which an IGFET, implemented with the symmetrically doped device, having source/drain zones that efficiently switch between functioning as source and functioning as drain needs to be combined with an IGFET, implemented with the asymmetrically doped device, having source/drain zones that permanently function respectively as source and drain. Although the symmetrical IGFET may have lower drive current than the asymmetrical IGFET, the ability to have the source/drain zones of one of the two IGFETs switch efficiently between functioning as source and functioning as drain compensates for reduced drive current.

In short, an IGFET having an asymmetrically doped channel zone is fabricated in a highly economical, highly efficient manner by employing the principles of the invention. No additional masking step(s) need be employed to asymmetrically dope the channel zone according to the invention. An IGFET having the so-doped channel zone performs very well with a high ratio of drive current to leakage current. The principles of the invention can readily be applied to combining an IGFET having a symmetrically doped channel zone with an IGFET having an asymmetrically doped channel zone. Accordingly, the invention provides a substantial advance over the prior art.

BRIEF DESCRIPTION OF THE DRAWINGS

FIG. 12a models the threshold point at which the channel-zone location of the p-channel IGFET is on the verge of receiving halo doping. FIG. 12b models the situation in which the channel-zone location of the p-channel IGFET is fully asymmetrically halo doped.

FIGS. 15a and 15b are cross-sectional front views which illustrate how the process of FIGS. 11a–11o is utilized in manufacturing the symmetrical p-channel IGFETs of FIGS. 10a and 10b. The cross sections of FIGS. 15a and 15b are respectively produced at the same times as the cross sections of FIGS. 11g and 11h.

FIG. 16 models the situation in which the p-channel IGFET is symmetrically halo doped. FIG. 17 models the situation in which the p-channel IGFET receives substantially no halo doping.

Like reference symbols are employed in the drawings and in the description of the preferred embodiments to represent the same, or very similar, item or items.

DESCRIPTION OF THE PREFERRED EMBODIMENTS

Reference Notation and Other Conventions

Figure 1:
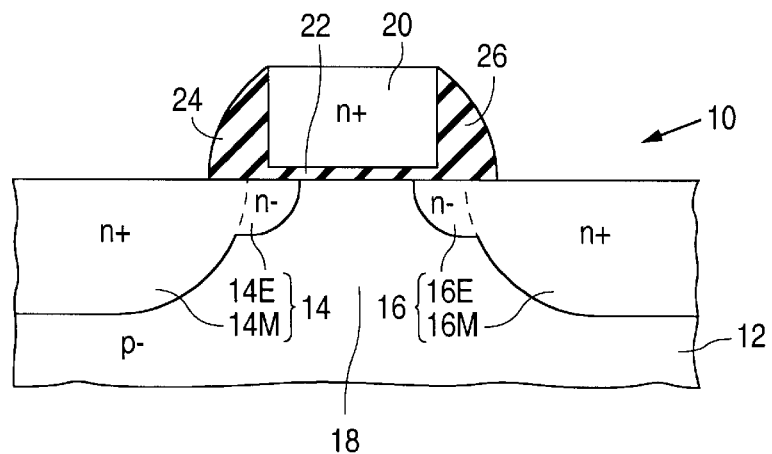
FIGS. 1 and 2 are front cross-sectional views of conventional symmetrical n-channel IGFETs.
Figure 2:
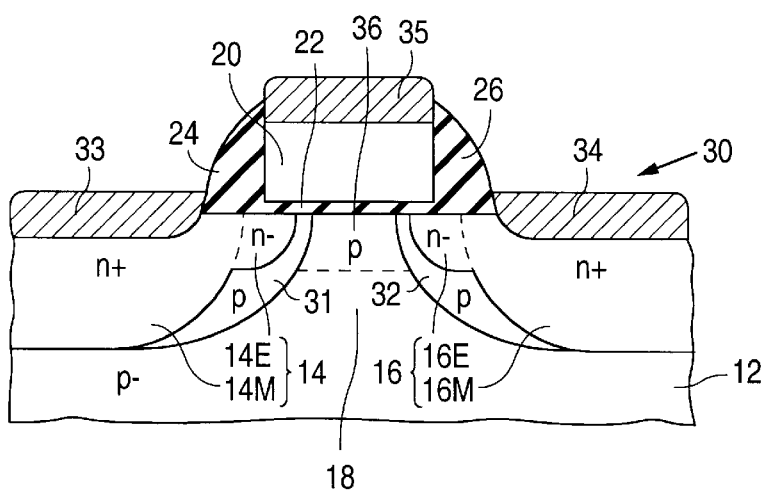
Figure 3:
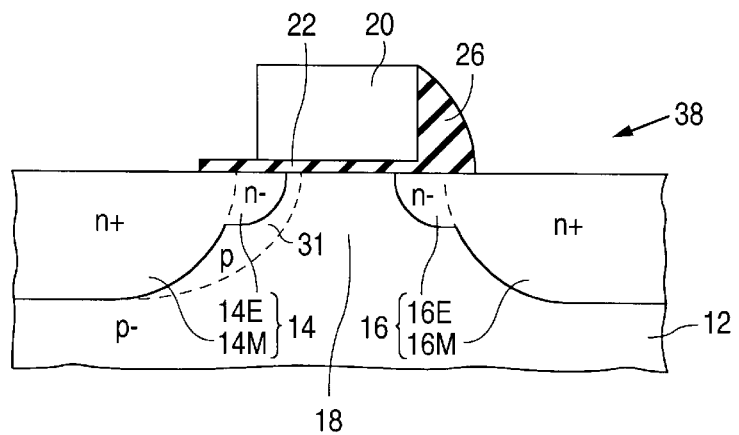
FIG. 3 is a front cross-sectional view of a conventional asymmetrical n-channel IGFET.
Figure 4:
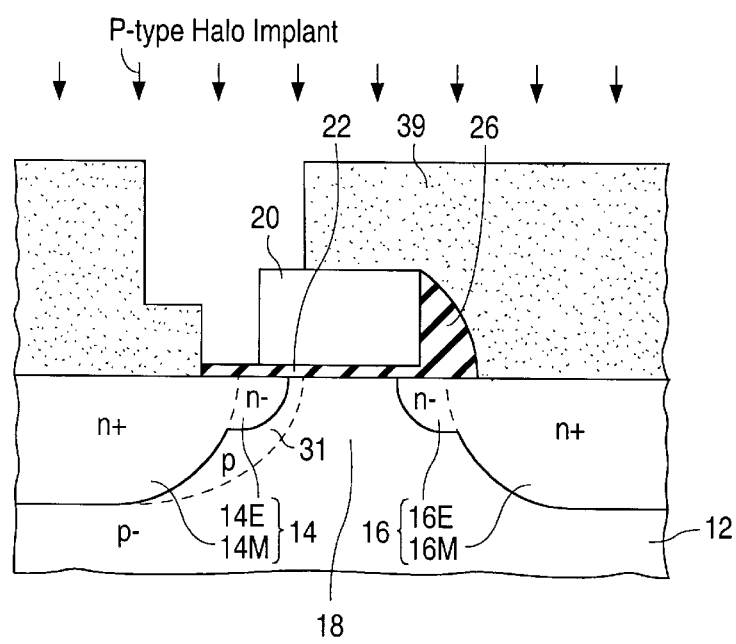
FIG. 4 is a front cross-sectional view representing a step in conventionally fabricating the asymmetrical IGFET of FIG. 3.

The reference symbols employed below and in the drawings have the following meanings:

$d_D$≡longitudinal distance from gate electrode structure across location for drain-acting source/drain zone to photoresist mask $d_S$≡longitudinal distance from gate electrode structure across location for source-acting source/drain zone to photoresist mask $d_{SD1}$≡longitudinal distance from one opening-defined transverse side of photoresist mask to gate electrode structure $d_{SD2}$≡longitudinal distance from other opening-defined transverse side of photoresist mask to gate electrode structure $d_X$≡threshold value of longitudinal distance at verge of receiving halo ion implantation $d_Y$≡transitional value of longitudinal distance at verge of receiving full halo ion implantation $E$≡energy along upper semiconductor surface $h_M$≡height of photoresist mask above gate dielectric layer $I_D$≡widthwise drain current density or drain current per unit drain width $I_{ON}$≡widthwise drive current density or drive current per unit drain width $I_{OFF}$≡widthwise leakage current density or leakage current per unit drain width $L$≡channel length along upper semiconductor surface $L_{DR}$≡drawn value of channel length L as given by drawn value of gate length $N_N$≡general net dopant concentration $R_{Halo}$≡vertical range (average depth) of ions of halo dopant $t_{GD}$≡thickness of gate dielectric layer $t_{Halo}$≡longitudinal thickness of halo pocket portion after halo implantation at depth equal to vertical range $R_{Halo}$ $V_D$≡drain voltage $V_{DD}$≡drain supply voltage $V_{DS}$≡drain-to-source voltage $V_{GS}$≡gate-to-source voltage $V_T$≡threshold voltage $x$≡lateral distance from channel center along upper semiconductor surface in direction of channel length $\alpha$≡average tilt angle at which ions of halo dopant impinge on photoresist mask relative to direction generally perpendicular to upper semiconductor surface $\beta$≡average azimuthal angle, as measured in plane extending along upper semiconductor surfaces at which ions of halo dopant impinge on photoresist mask relative to channel length direction $\Delta E_B$≡energy barrier along upper semiconductor surface Long-channel and short-channel n-channel IGFETs are respectively referred to here, i.e., both below and above in the Brief Description of the Drawings, as long and short n-channel IGFETs. Similarly, long-channel and short-channel p-channel IGFETs are respectively referred to here as long and short p-channel IGFETs.

An IGFET is described below as symmetrical when it is configured in largely a mirror-image manner along both of its source/drain zones and into the intervening channel zone. For instance, an IGFET having a separate halo pocket portion along each source/drain zone is typically described here as symmetrical provided that the source/drain zones are, except possibly for their lengths, largely mirror images of each other. However, due to factors such as partial shadowing during ion implantation into the location of one of the halo pockets, the dopant profiles in the halo pockets along the upper semiconductor surface may not largely be mirror images. In such cases, there is typically some asymmetry in the IGFET's operation even though the IGFET may be described as a symmetrical device.

Structure of IGFETs Manufactured According to Invention

Figure 5A:
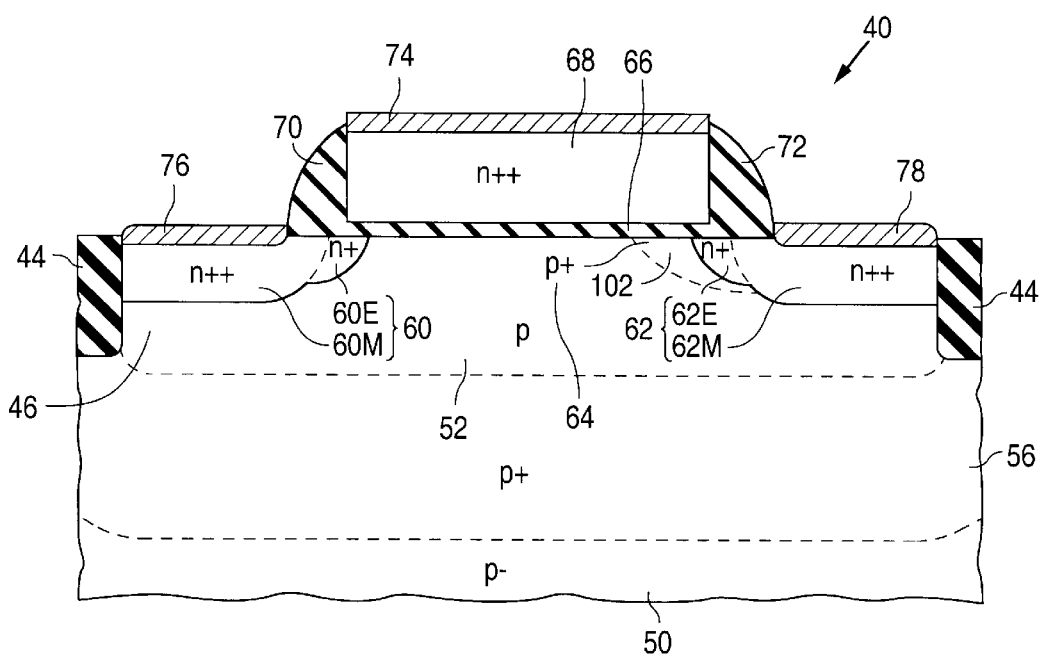
FIGS. 5a and 5b are front cross-sectional views of respective asymmetrical long and short n-channel IGFETs manufactured according to the invention.
Figure 5B:
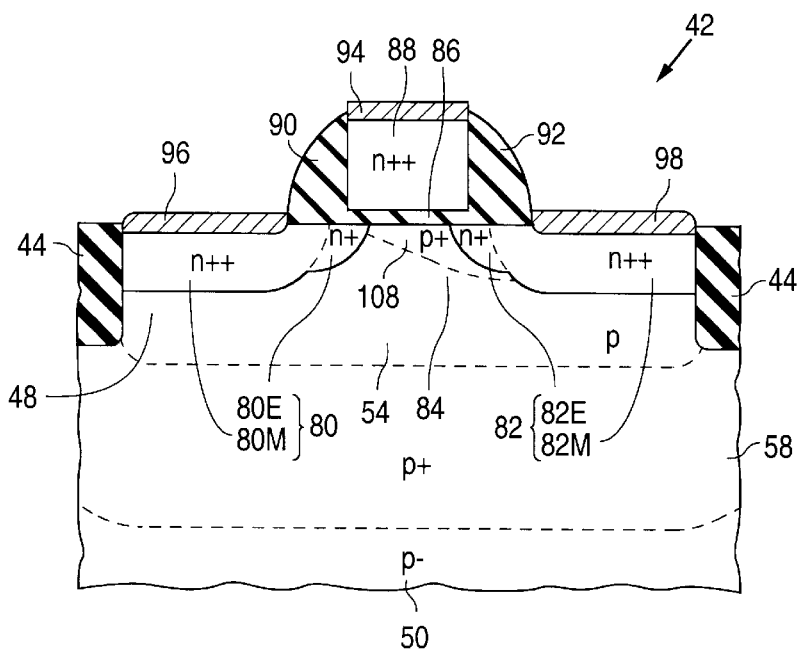

FIGS. 5a and 5b respectively illustrate cross sections of a pair of asymmetrical n-channel enhancement-mode IGFETs 40 and 42 manufactured according to the same, or largely the same, fabrication process of the invention so as to be of different channel length. IGFET 40 is a long-channel device. IGFET 42 is a short-channel device. IGFETs 40 and 42 may be parts of the same semiconductor structure or different semiconductor structures. In any event, IGFETs 40 and 42 are asymmetrically halo doped in accordance with the invention to help alleviate short-channel effects, including punchthrough and threshold voltage roll-off.

When n-channel IGFETs 40 and 42 are part of the same semiconductor structure, IGFETs 40 and 42 are created from a monocrystalline silicon ("monosilicon") semiconductor body along whose upper surface is situated a recessed field region 44 of electrically insulating material. Field-insulating region 44 laterally separates a group of active regions in the monosilicon semiconductor body. The semiconductor portions of IGFETs 40 and 42 are respectively provided in active regions 46 and 48.

The semiconductor body contains p-type body material 50. The bulk of body material 50 is lightly doped. Body material 50 includes a pair of upper portions 52 and 54, most of which is moderately doped, and a pair of heavily doped well portions 56 and 58 situated respectively below upper body-material portions 52 and 54. P+ wells 56 and 58 may form a single, continuous p+ well.

Long n-channel IGFET 40 in FIG. 5a has a pair of composite n-type source/drain zones 60 and 62 situated in active region 46 along the upper semiconductor surface. Source/drain zone 60 consists of a very heavily doped main portion 60M and a more lightly doped extension 60E. Source/drain zone 62 consists of a very heavily doped main portion 62M and a more lightly doped extension 62E. Although more lightly doped than n++ main source/drain portions 60M and 62M, source/drain extensions 60E and 62E are still heavily doped n-type.

A channel zone 64 of p-type upper body-material portion 52 laterally separates source/drain zones 60 and 62. A gate dielectric layer 66 lies on channel zone 64. A gate electrode 68 consisting of very heavily doped n-type polycrystalline silicon ("polysilicon") lies on gate dielectric layer 66 above channel zone 64. Gate electrode 68 partially overlies source/drain extensions 60E and 62E.

A pair of electrically insulating spacers 70 and 72 are situated along the opposite transverse sidewalls of gate electrode 68 respectively above source/drain zones 60 and 62. Metal silicide layers 74, 76, and 78 are respectively situated on gate electrode 68 and main source/drain portions 60M and 62M.

Short n-channel IGFET 40 in FIG. 5b has a pair of composite n-type source/drain zones 80 and 82 situated in active region 48 along the upper semiconductor surface. Source/drain zone 80 consists of a very heavily doped main portion 80M and a more lightly doped extension 80E. Source/drain zone 82 consists of a very heavily doped main portion 82M and a more lightly doped extension 82E. Source/drain extensions 80E and 82E, while being more lightly doped than n++ main source/drain portions 80M and 82M, are heavily doped n-type.

A channel zone 84 of p-type upper body-material portion 54 laterally separates source/drain zones 80 and 82. A gate dielectric layer 86 lies on channel zone 84. A gate electrode 88 consisting of very heavily doped n-type polysilicon lies on gate dielectric layer 86 above channel zone 84. Gate electrode 88 partially overlies source/drain extensions 80E and 82E.

A pair of electrically insulating spacers 90 and 92 are situated along the opposite transverse sidewalls of gate electrode 88 respectively above source/drain zones 80 and 82. Metal silicide layers 94, 96, and 98 are respectively situated on gate electrode 88 and main source/drain portions 80M and 82M.

In IGFETs 40 and 42, sidewall spacers 70, 72, 90, and 92 may be formed with various electrical insulators or combinations of electrical insulators. For simplicity and to maintain generality, the (potential) presence of different electrically insulating regions in any of spacers 70, 72, 90, and 92 is not indicated in the drawings.

P-type channel zones 64 and 84 are configured in the following way. As indicated in FIG. 5a, channel zone 64 in long-channel IGFET 40 contains a heavily doped halo pocket portion 102 which adjoins source/drain extension 62E along all of the pn-junction portion between extension 62E and channel zone 64. P+ halo pocket 102 extends below source/drain extension 62E to meet main source/drain portion 62M. Due to halo pocket 102, source/drain zone 62 normally functions permanently as the source during IGFET operation. Source/drain zone 60 then functions permanently as the drain.

P+ halo pocket 102 provides channel zone 64 of IGFET 40 with a net dopant concentration that reaches a local surface maximum along the upper semiconductor surface in the longitudinal direction, i.e., in the direction of the IGFET's channel length, at a location close to source/drain zone 62 and spaced substantially apart from source/drain zone 60. An understanding of the shape of the dopant profile in channel zone 64 along the upper semiconductor surface is facilitated with the assistance of FIG. 6a which presents an example of how the net dopant concentration $N_N$ in long-channel IGFET 40 varies along the upper semiconductor surface in the longitudinal direction. Curve segments 64*, 102*, 60E*, 62E*, 60M*, and 62M* in FIG. 6a respectively represent the net dopant concentrations of components 64, 102, 60E, 62E, 60M, and 62M along the upper semiconductor surface.

Figure 6A:
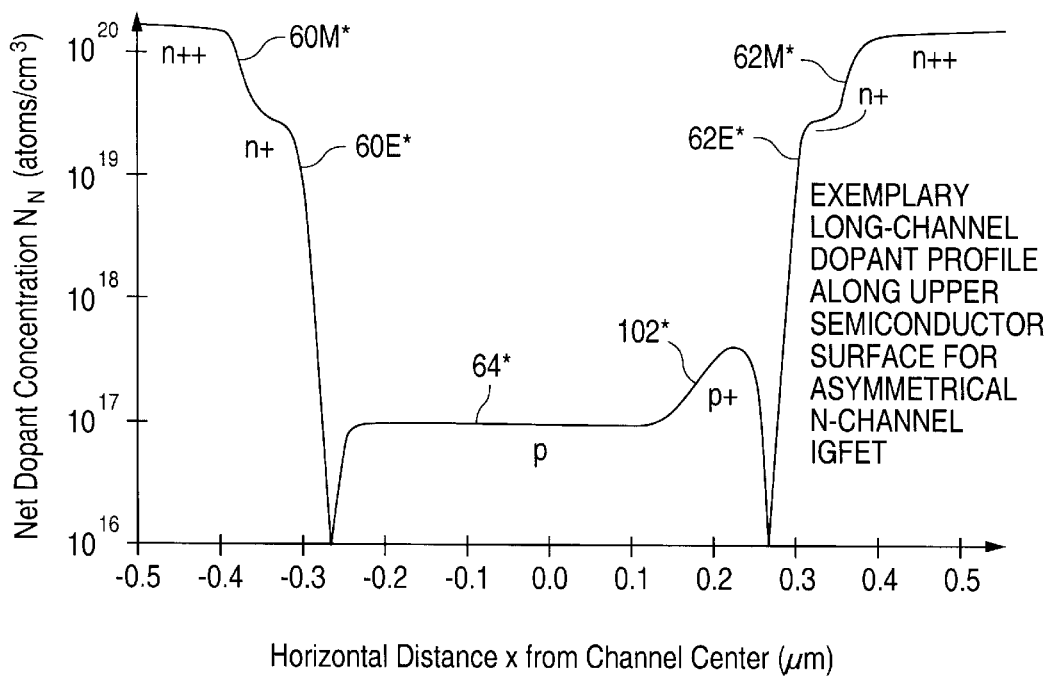
FIGS. 6a and 6b are exemplary graphs of net dopant concentration as a function of longitudinal horizontal distance from the channel center for the respective asymmetrical n-channel IGFETs of FIGS. 5a and 5b.

Curve segment 102* in FIG. 6a illustrates the local surface maximum in the net dopant concentration of channel zone 64 in the longitudinal direction. In going from source/drain zone 62 longitudinally to source/drain zone 60, curve segment 64* shows that the net surface dopant concentration of channel zone 64 drops from the longitudinal local surface maximum down to a longitudinal local surface minimum and remains largely at the longitudinal local surface minimum for a non-zero distance from halo pocket 102 to a location close to source/drain zone 60.

Referring back to FIG. 5b, p-type channel zone 84 in short-channel IGFET 42 contains a heavily doped halo pocket portion 108 which adjoins source/drain extension 82E along all of the pn-junction portion between extension 82E and channel zone 84. P+ halo pocket 108 extends below source/drain extension 82E and meets main source/drain portion 62M. Also, halo pocket 108 extends fully across channel zone 84 and adjoins source/drain zone 80 along a smaller area than where halo pocket 108 adjoins source/drain zone 82. Due to this asymmetrical nature of halo pocket 108, source/drain zone 82 normally functions permanently as the source during IGFET operation. Source/drain zone 80 then functions permanently as the drain.

Figure 6B:
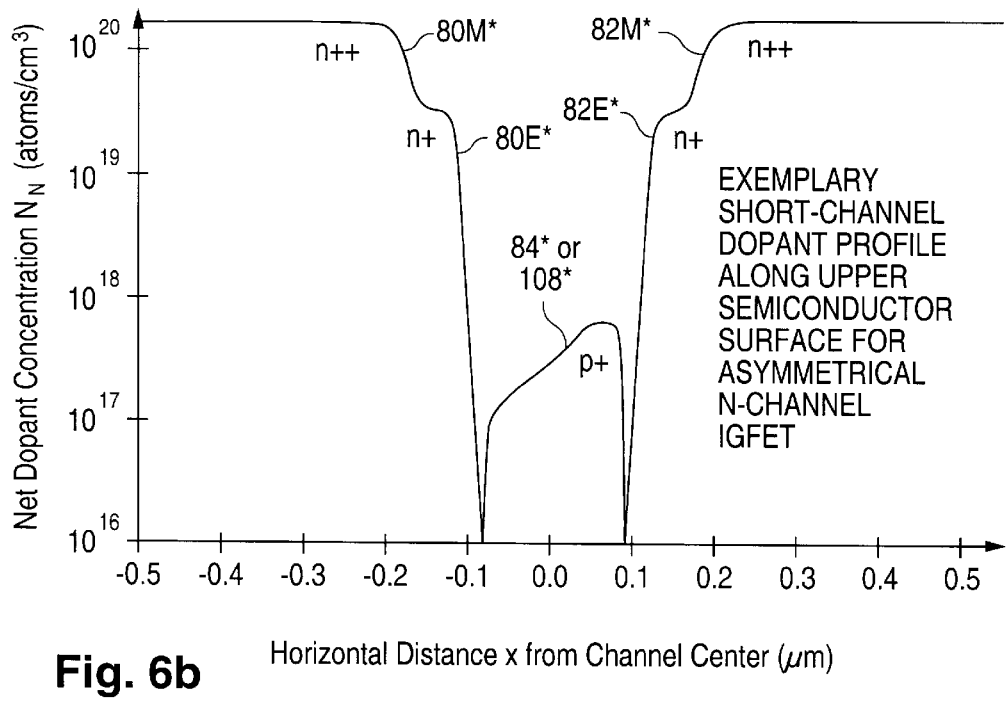

Along the upper semiconductor surface, the net dopant concentration of channel zone 84 in short-channel IGFET 42 has a longitudinal shape that basically constitutes the limit of the net surface dopant concentration of channel zone 64 in long-channel IGFET 40 as the channel length is made quite small. In this regard, FIG. 6b presents an example of how net dopant concentration $N_N$ in short-channel IGFET 42 varies along the upper semiconductor surface in the longitudinal direction. Curve segments 84*, 108*, 80E*, 82E*, 80M*, and 82M* respectively represent the net dopant concentrations of components 84, 108, 80E, 82E, 80M, and 82M along the upper semiconductor surface.

As indicated by curve segment 84* in FIG. 6b, the net surface dopant concentration of channel zone 84 reaches a local surface maximum along the upper semiconductor surface in the longitudinal direction at a location near source/drain zone 82 and decreases progressively in going from the location of the longitudinal local surface maximum longitudinally to source/drain zone 80. The longitudinal local surface maximum in the net surface dopant concentration of channel zone 84 is, of course, caused by halo pocket 108.

Source/drain zones 60 and 62 of long-channel IGFET 40 are typically configured so that the pn junction between upper body-material portion 52 and each of zones 60 and 62 has a "graded" characteristic so as to reduce junction capacitance, thereby increasing the switching speed. The graded-junction characteristic is achieved by providing each source/drain zone 60 or 62 with a lower portion (not shown) which underlies, and is more lightly doped than, main portion 60M or 62M. Source/drain zones 80 and 82 of short-channel IGFET 42 are typically configured in the same way so that the pn junction between upper body-material portion 54 and each of zones 80 and 82 is a graded junction.

The semiconductor structure containing asymmetrical n-channel IGFET 40 and/or asymmetrical IGFET n-channel IGFET 42 may, in accordance with invention, include a symmetrical long n-channel IGFET and/or a symmetrical short n-channel IGFET. The symmetrical n-channel IGFETs typically are, but need not be, halo doped to alleviate short-channel effects.

Figure 7A:
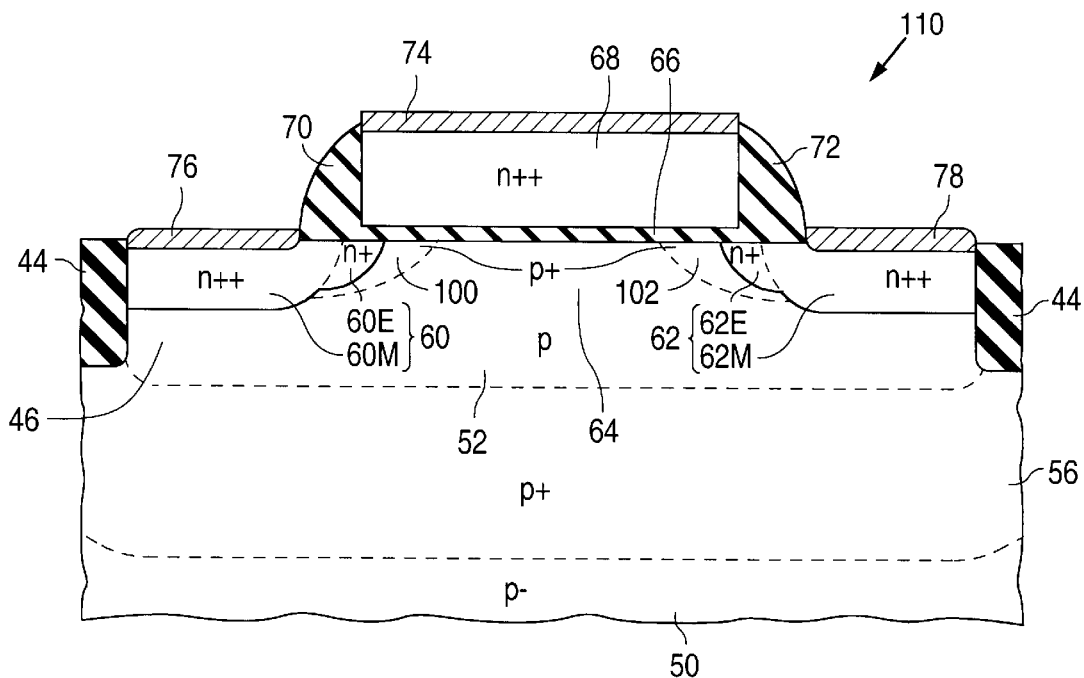
FIGS. 7a and 7b are front cross-sectional views of respective symmetrical long and short n-channel IGFETs manufactured, in conjunction with one or both of the asymmetrical n-channel IGFETs of FIGS. 5a and 5b, according to the invention.
Figure 7B:
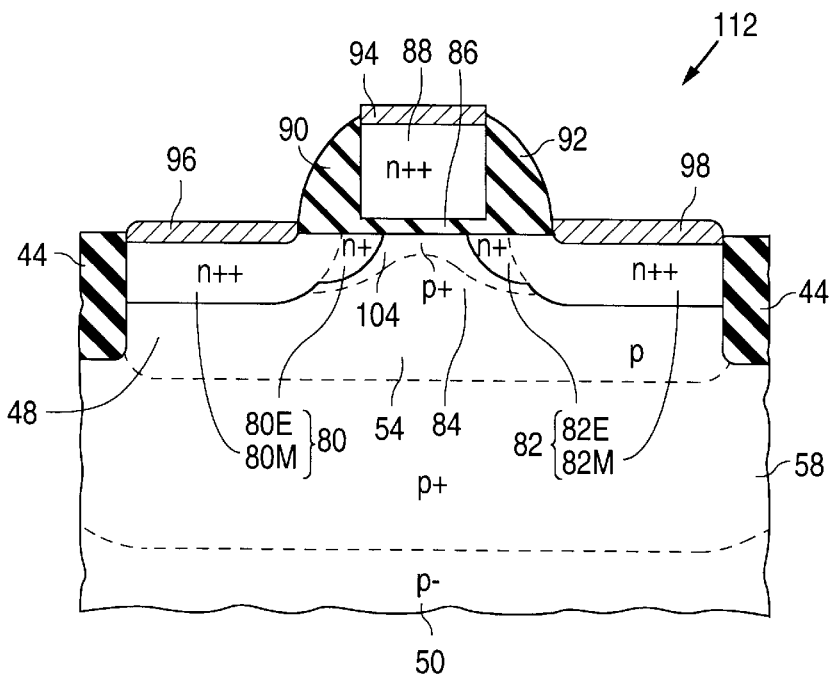

FIGS. 7a and 7b respectively illustrate a symmetrical halo-doped long n-channel IGFET 110 and a symmetrical halo-doped short n-channel IGFET 112. Symmetrical IGFETs 110 and 112 are configured respectively the same as asymmetrical IGFETs 40 and 42 except for the halo doping. For convenience, the reference symbols used to identify the various regions in IGFETs 40 and 42 are utilized to identify the corresponding regions in IGFETs 110 and 112.

Channel zones 64 and 84 of IGFETs 110 and 112 are symmetrically halo doped as respectively shown in FIGS. 7a and 7b. Instead of single halo pocket 102, channel zone 64 of IGFET 110 contains laterally separated heavily doped p-type halo pocket portions 100 and 102. Halo pocket 100 is situated along source/drain zone 60 in the same way that halo pocket 102 is situated along source/drain zone 62. In place of asymmetrical halo pocket 108, channel zone 84 of IGFET 112 contains a pair of heavily doped p-type halo pocket portions merged together to form a single symmetrical heavily doped p-type composite halo pocket portion 104 which extends fully across channel zone 84. Composite halo pocket 104 adjoins source/drain zones 80 and 82 in the same way that halo pocket 108 adjoins source/drain zone 82 in IGFET 42. Further information on IGFETs 110 and 112 is presented in Bulucea et al, co-filed U.S. patent application Ser. No. 09/540,442, the contents of which are incorporated by reference to the extent not repeated herein.

Figure 8A:
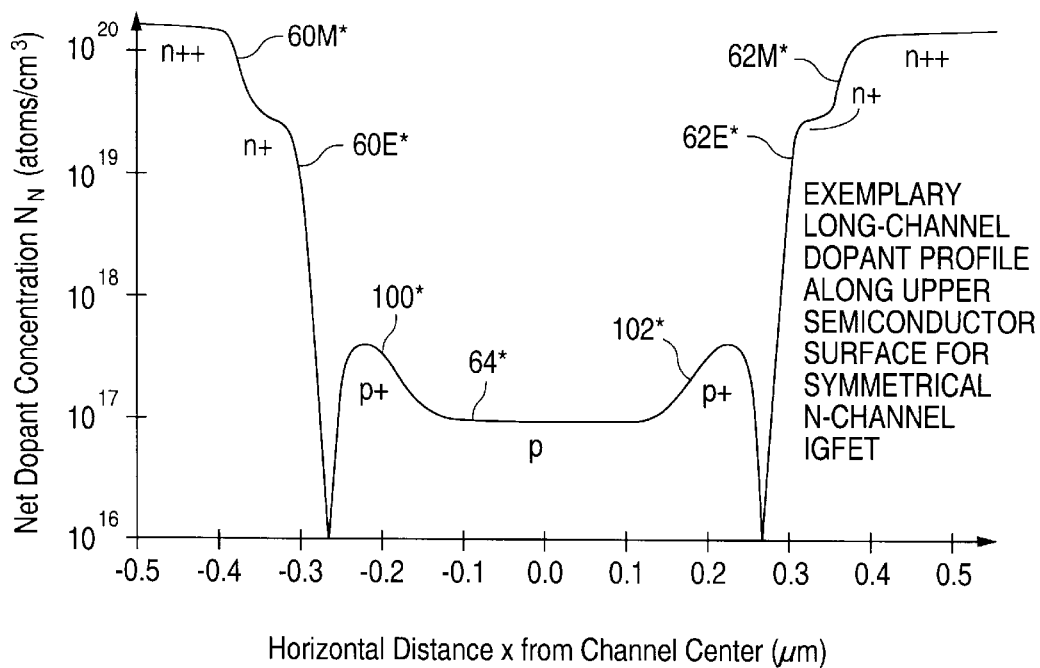
FIGS. 8a and 8b are exemplary graphs of net dopant concentration as a function of longitudinal horizontal distance from the channel center for the respective symmetrical n-channel IGFETs of FIGS. 7a and 7b.
Figure 8B:
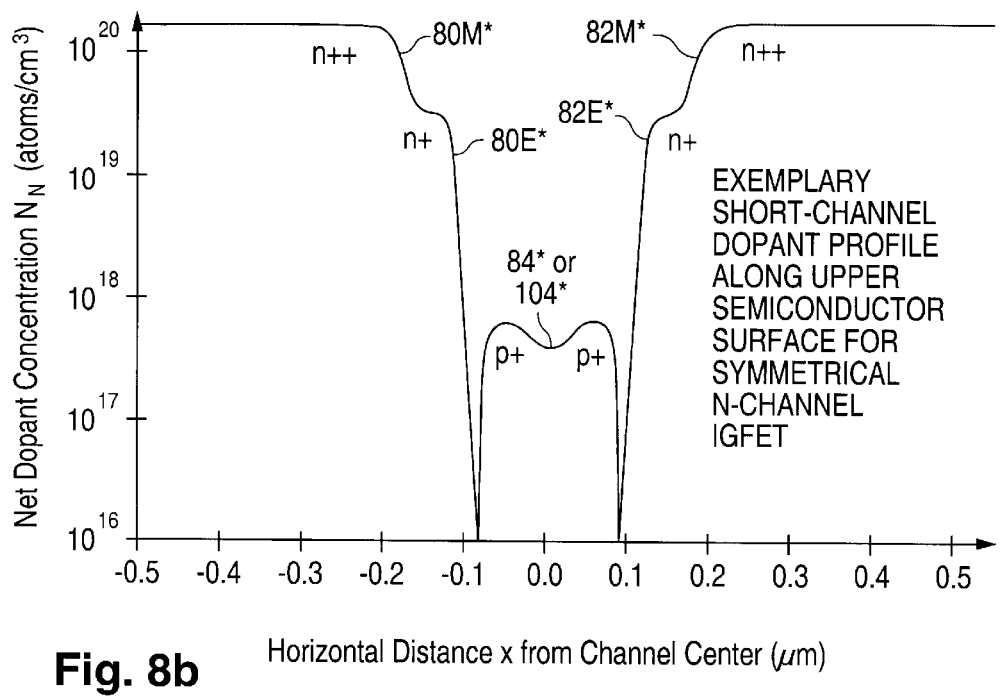

FIG. 8a presents an example of how net dopant concentration $N_N$ in symmetrical long-channel IGFET 110 varies along the upper semiconductor surface in the longitudinal direction. FIG. 8b similarly presents an example of how dopant concentration $N_N$ in symmetrical short-channel IGFET 112 varies along the upper semiconductor surface in the longitudinal direction. Curve segments 100* and 104* in FIG. 8a and 8b respectively represent the net dopant concentrations in halo pockets 100 and 104 along the upper semiconductor surface.

As indicated by curve segment 64* in FIG. 8a, the presence of halo pockets 100 and 102 causes channel zone 64 in IGFET 110 to be doped more heavily close to source/drain zones 60 and 62 than at an intermediate location between zones 60 and 62. Curve segment 64* shows that the net dopant concentration of channel zone 64 is longitudinally largely constant at a local surface minimum for a non-zero portion of the longitudinal distance between zones 60 and 62. As indicated by curve segment 84* in FIG. 8b, the presence of symmetrical halo pocket 104 causes channel zone 84 in IGFET 112 to be doped more heavily close to source/drain zones 80 and 82 than at an intermediate location between zones 80 and 82. Curve segment 84* shows that the net dopant concentration of channel zone 84 longitudinally drops to a local surface minimum at largely a single point, typically at the channel center, of the longitudinal distance between zones 80 and 82.

The semiconductor structure containing long n-channel IGFET 40 and/or short n-channel IGFET 42, typically in combination with long n-channel IGFET 110 and/or short n-channel IGFET 112, normally also contains a long p-channel IGFET and/or a short p-channel IGFET. The p-channel IGFETs typically are, but need not be, configured analogously to n-channel IGFETs 40 and 42.

Figure 9A:
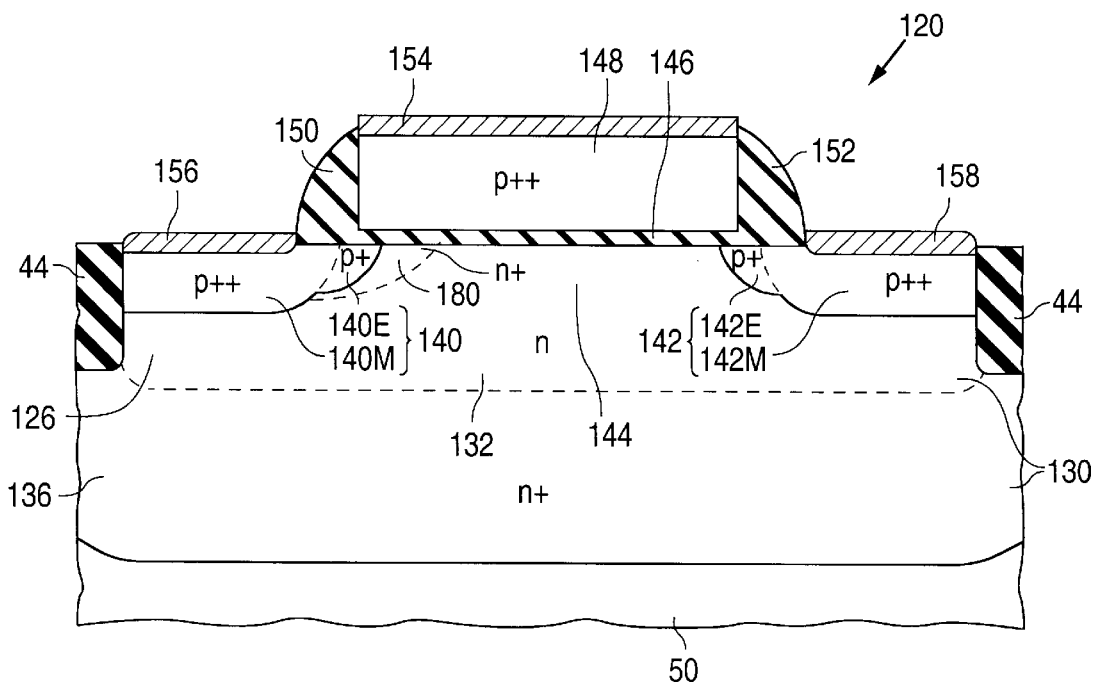
FIGS. 9a and 9b are front cross-sectional views of respective asymmetrical long and short p-channel IGFETs manufactured, normally in conjunction with one or more of the n-channel IGFETs of FIGS. 5a, 5b, 7a, and 7b, according to the invention.
Figure 9B:
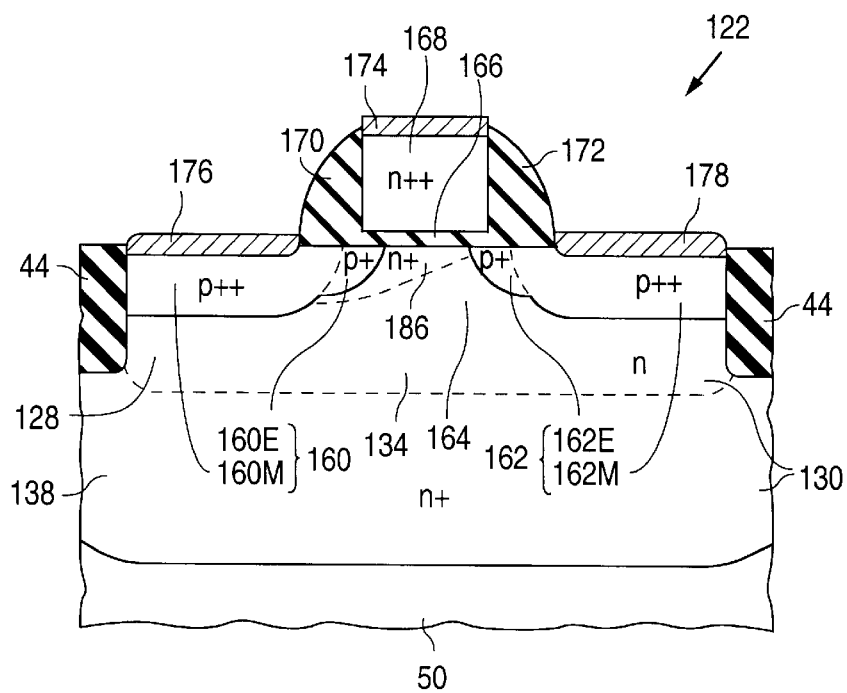

FIGS. 9a and 9b respectively illustrate an asymmetrical long p-channel IGFET 120 and an asymmetrical short p-channel IGFET 122 manufactured according to the same, or largely the same, fabrication process of the invention. IGFETs 120 and 122 are asymmetrically halo doped according to the invention to alleviate short-channel effects, including punchthrough and threshold voltage roll-off. IGFETs 120 and 122 may be parts of the same semiconductor structure or parts of different semiconductor structures. The semiconductor structure or structures containing p-channel IGFETs 120 and 122 normally contains one or more of n-channel IGFETs 40, 42, 110, and 112.

When p-channel IGFETs 120 and 122 are part of the same semiconductor structure as n-channel IGFETs 40 and 42, the active semiconductor portions of IGFETs 120 and 122 are respectively formed in active regions 126 and 128 laterally surrounded by field-insulating region 44. The semiconductor body utilized for creating IGFETs 120 and 122 contains n-type body material 130 situated over the lightly doped bulk of p-type body material 50. N-type body material 130 includes a pair of upper portions 132 and 134 respectively analogous to, and doped in a complementary way, to upper portions 52 and 54 of p-type body material 50. N-type body material 130 also includes a pair of heavily doped well portions 136 and 138 respectively analogous to p+ well portions 56 and 58 of body material 50.

P-channel IGFETs 120 and 122 contains source/drain zones, channel zones, gate dielectric layers, doped polysilicon gate electrodes, gate sidewall spacers, and metal silicide layers configured the same as the corresponding elements in n-channel IGFETs 40 and 42 but, except as described below, indicated by reference symbols 80 higher in FIGS. 9a and 9b. Each of the semiconductor regions in p-channel IGFETs 120 and 122 is of the same relative dopant concentration level, but of opposite conductivity type, to the corresponding semiconductor region in n-channel IGFETs 40 and 42.

N-type channel zone 144 in long-channel IGFET 120 contains a heavily doped halo pocket 180 which adjoins source/drain zone 140 in the same way that halo pocket 102 adjoins source/drain zone 62 in long-channel IGFET 40. Due to halo pocket 180, source/drain zone 140 in IGFET 120 normally functions permanently as the source while source/drain zone 142 functions permanently as the drain. N-type channel zone 164 in short-channel IGFET 122 contains a heavily doped halo pocket portion 186 which is situated primarily along source/drain zone 160 in the same manner that halo pocket 108 is situated primarily along source/drain zone 82 in short-channel IGFET 42. Similar to halo pocket 106, halo pocket 186 extends fully across channel zone 164 to adjoin source/drain zone 162 along a smaller area than where pocket 186 adjoins zone 160. Due to the asymmetrical nature of halo pocket 186, source/drain zone 160 in IGFET 122 normally functions permanently as the source, source/drain zone 162 then functioning permanently as the drain.

In accordance with the invention, a semiconductor structure containing IGFET 40 and/or IGFET 42, typically in combination with one or more of IGFETs 110, 112, 120, and 122, may include a symmetrical long p-channel IGFET and/or a symmetrical short p-channel IGFET. The symmetrical p-channel IGFETs typical are, but need not be, halo doped to alleviate short-channel effects.

Figure 10A:
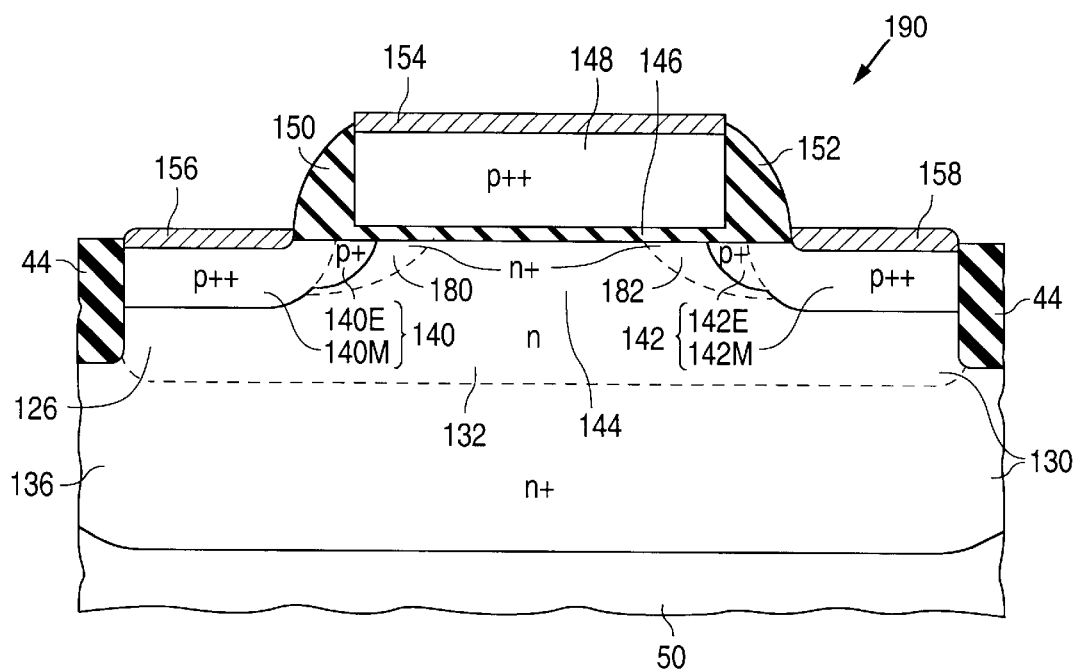
FIGS. 10a and 10b are front cross-sectional views of respective symmetrical long and short p-channel IGFETs manufactured, in conjunction with one or both of the asymmetrical p-channel IGFETs of FIGS. 9a and 9b and normally in conjunction with one or more of the n-channel IGFETs of FIGS. 5a, 5b, 7a, and 7b, according to the invention.
Figure 10B:
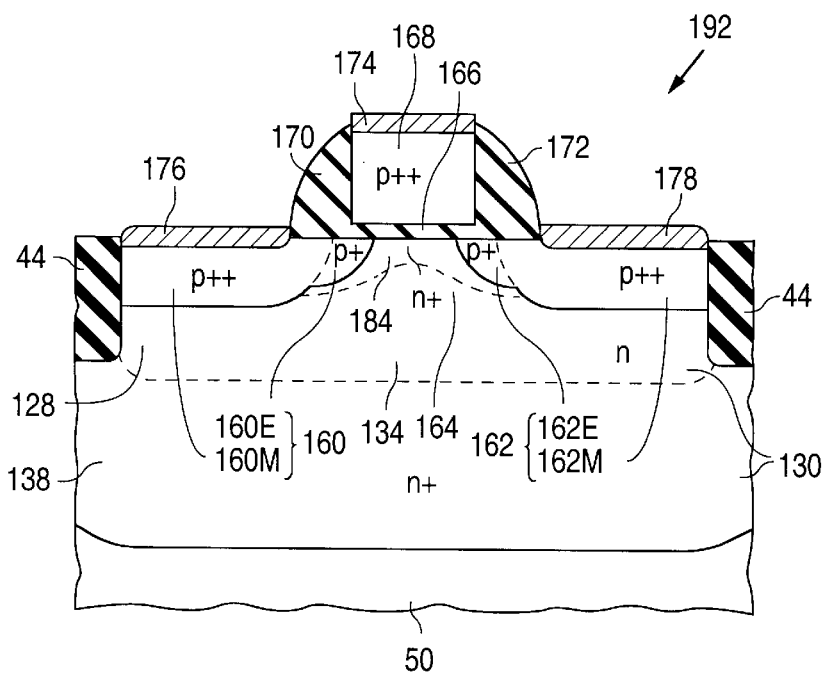

FIGS. 10a and 10b respectively illustrate a symmetrical halo-doped long p-channel IGFET 190 and a symmetrical halo-doped short p-channel IGFET 192. Symmetrical p-channel IGFETs 190 and 192 are configured respectively the same as asymmetrical p-channel IGFETs 120 and 122 except for the halo doping. For convenience, the reference symbols employed to identify the various regions in asymmetrical IGFETs 120 and 122 are used to identify the corresponding regions in symmetrical IGFETs 190 and 192.

N-type channel zones 144 and 164 of IGFETs 190 and 192 are doped symmetrically as shown respectively in FIGS. 10a and 10b. Instead of single halo pocket 180, channel zone 144 of IGFET 190 contains laterally separated heavily doped n-type halo pocket portions 180 and 182. Halo pocket 182 is situated along source/drain zone 162 in the same way that halo pocket 180 is situated along source/drain zone 160. In place of asymmetrical halo pocket 186, channel zone 164 of IGFET 192 contains a pair of heavily doped n-type halo pocket portions merged together to form a single symmetrical heavily doped n-type halo pocket portion 184 which extends fully across channel zone 164. Halo pocket 184 adjoins source/drain zones 160 and 162 in the same way that halo pocket 186 adjoins source/drain zone 160 in IGFET 122.

Fabrication of IGFET Structure According to Invention

Figure 11A:
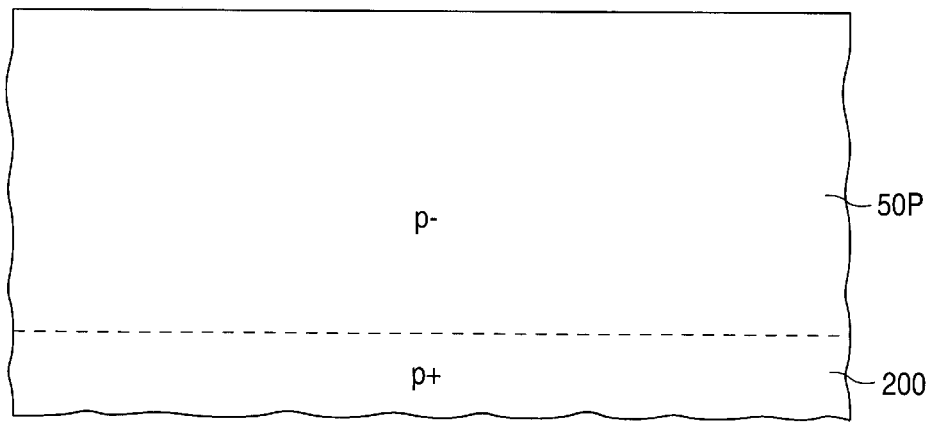
FIGS. 11a–11o are front cross-sectional views representing steps in a fabrication process according to the invention for manufacturing the asymmetrical IGFETs of FIGS. 5a, 5b, 9a, and 9b.
Figure 11B:
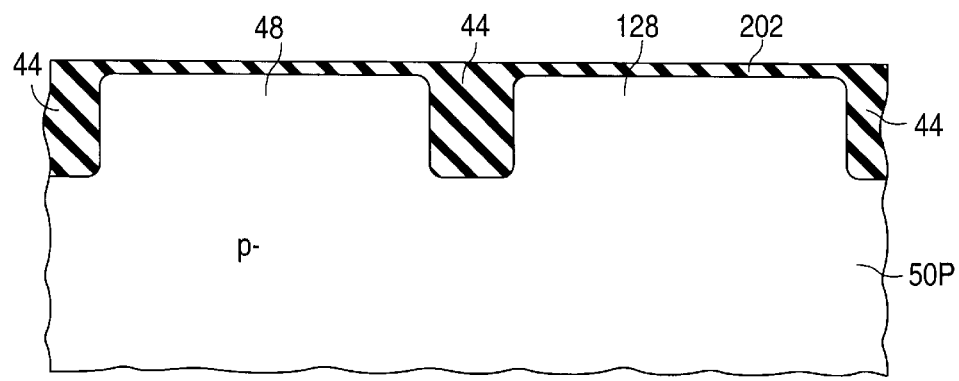

FIGS. 11a–11o (collectively "FIG. 11") illustrate a complementary-IGFET process in accordance with the invention for manufacturing asymmetrical n-channel IGFETs 40 and 42 and asymmetrical p-channel IGFETs 120 and 122. Only the fabrication of short-channel IGFETs 42 and 122 is, for simplicity, actually depicted in FIG. 11. Long-channel IGFETs 40 and 120 are manufactured according to the same fabrication steps utilized to manufacture short-channel IGFETs 42 and 122. The only difference in fabrication is that IGFETs 40 and 120 are respectively laid out to be of greater channel length than IGFETs 42 and 122. To help clarify the fabrication of long-channel IGFETs 40 and 120, reference symbols particular to the manufacture of IGFETs 40 and 120 are generally indicated parenthetically after the respective reference symbols for short-channel IGFETs 42 and 122 in the fabrication process described below.

Although the semiconductor structure created according to the present complementary-IGFET fabrication process is described below as having all of IGFETs 40, 42, 120, and 122, the semiconductor structure may have only one of n-channel IGFETs 40 and 42 and/or only one of p-channel IGFETs 120 and 122. The fabrication steps unique to the manufacture of p-channel IGFETs 120 and 122 can be deleted from the fabrication process so that the semiconductor structure only contains n-channel IGFET 40 and/or n-channel IGFET 42, and vice versa.

The fabrication process of FIG. 11 is also typically utilized to manufacture symmetrical n-channel IGFETs 110 and 112 and symmetrical p-channel IGFETs 190 and 192. All of the process steps used in forming the various regions of n-channel IGFETs 40 and 42 are also employed to form the corresponding regions of n-channel IGFETs 110 and 112. The only difference is that the sections of the photoresist mask utilized in the p-type halo doping of IGFETs 110 and 112 are adjusted differently from the photoresist mask sections employed in the simultaneous p-type halo doping of IGFETs 40 and 42.

Likewise, all of the process steps used in forming the various regions of p-channel IGFETs 120 and 122 are also employed to form the corresponding regions of p-channel IGFETs 190 and 192. The only difference is that the sections of the photoresist mask employed in the n-type halo doping of IGFETs 190 and 192 are adjusted differently from the photoresist mask sections used in the simultaneous n-type halo doping of IGFETs 120 and 122. In the following fabrication discussion, the manufacture of symmetrical IGFETs 110, 112, 190, and 192 is, for simplicity, specifically mentioned only in connection with the halo doping operations.

Except for the p-type and n-type halo ion implantation steps, all of the ion implantation steps in the present fabrication process are performed roughly perpendicular to the lower semiconductor surface and thus roughly perpendicular to the upper semiconductor surface. More particularly, all of the non-halo implantation steps are performed at a selected angle, typically 7°, to the vertical so as to avoid undesirable ion channeling effects. For simplicity, the small non-halo deviation from perpendicularity is not indicated in FIG. 11.

Unless otherwise indicated, the species of n-type dopant utilized in each of the n-type ion implantations in the fabrication process of FIG. 11 consists of the specified n-type dopant in elemental form. That is, each n-type ion implantation is performed with ions of the specified n-type dopant element rather than with ions of a chemical compound that contains the n-type dopant. The species of p-type dopant employed in each of the p-type ion implantations variously consists of the p-type dopant, normally boron, in elemental or compound form. Hence, each p-type ion implantation is normally performed with boron ions or with ions of a boron-containing compound.

The starting point for the fabrication process of FIG. 11 is a monocrystalline semiconductor body consisting of a heavily doped p-type substrate 200 and an overlying lightly doped p-type epitaxial layer 50P. See FIG. 11a. P+ substrate 200 is a semiconductor wafer formed with <100> monosilicon doped with boron to achieve a typical resistivity of 0.015 ohm-cm. For simplicity, substrate 200 is not shown in the remainder of FIG. 16.

P− epitaxial layer 50P consists of epitaxially grown <100> monosilicon doped with boron to achieve a typical resistivity of 30 ohm-cm. Epitaxial layer 50P is a precursor to body material 50, the letter "P" at the end of a reference symbol being utilized here to indicate a precursor to a region identified by the portion of the reference symbol preceding the letter "P".

Field-insulating region 44 is provided along the upper surface of p− epitaxial layer 50P so as to define active regions 48 (46) and 128 (126) for IGFETs 42 (40) and 122 (120). See FIG. 11b. Field insulation 44 is preferably created according to a trench-oxide technique such as that described in Wang, U.S. patent application Ser. No. 09/211,703, filed Dec. 14, 1998, now allowed, the contents of which are incorporated by reference. Field insulation 44 may also be created according to a local-oxidation technique. In providing field insulation 44, a thin screen insulating layer 202 of silicon oxide is thermally grown along the upper surface of epitaxial layer 50P.

Figure 11C:
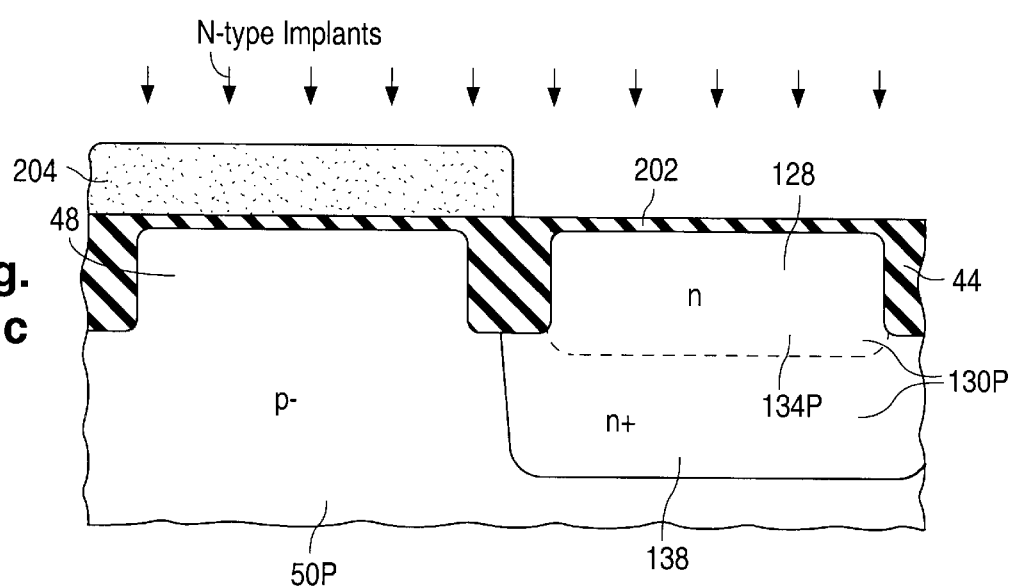
Figure 11D:
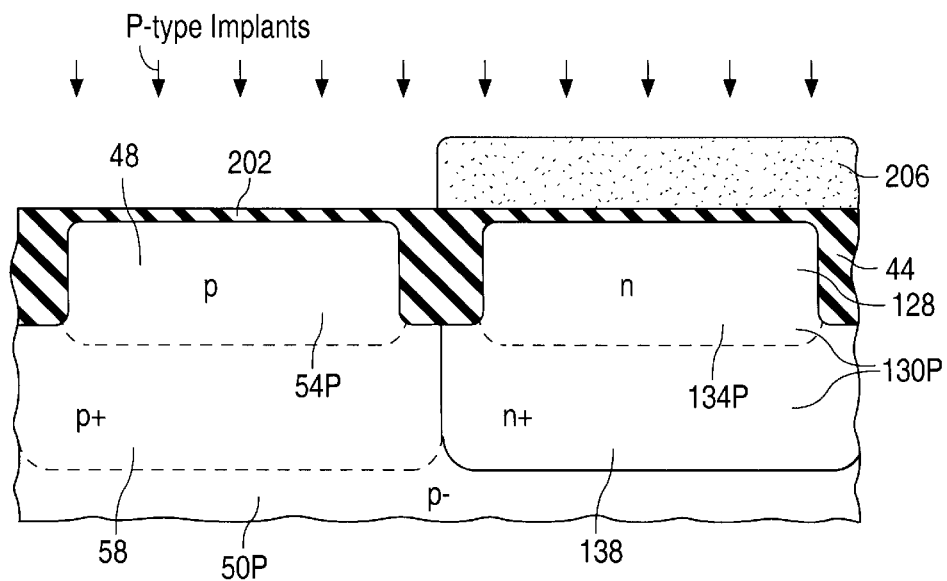
Figure 11E:
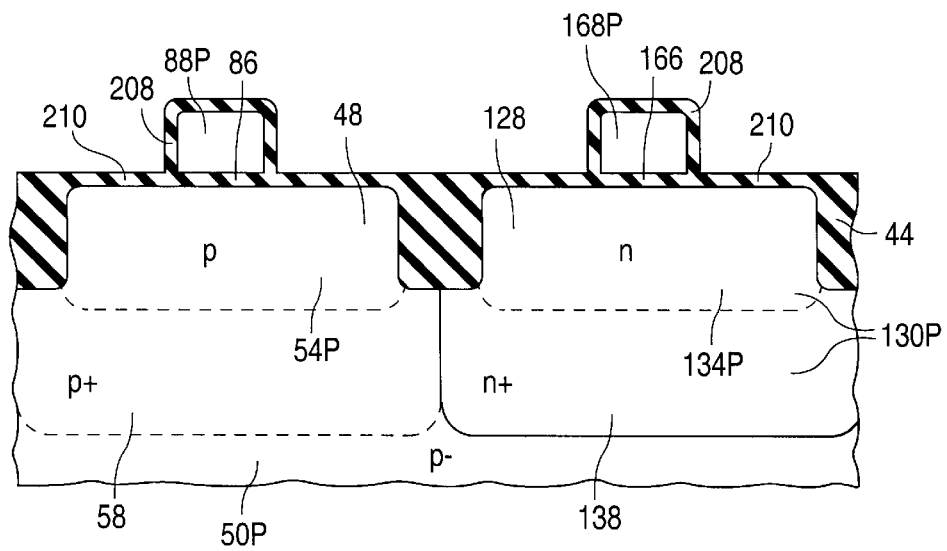

A photoresist mask 204 is formed on screen-oxide layer 202 above active region 48 (46) as indicated in FIG. 11c. Precursor n-type body material 130P is formed in p− epitaxial layer 50P by introducing n-type dopant through the section of screen oxide 202 not covered by photoresist 204 and into the underlying semiconductor material. Body material 130P consists of a moderately doped n-type precursor upper portion 134P (132P) and an underlying heavily doped n-type well portion 138 (136). N+ well 138 (136) is defined by ion implanting phosphorus at a typical heavy dosage of $2 \times 10^{13}$ ions/cm$^2$ and a typical implantation energy of 500 KeV. N upper body-material portion 134P (132P) is defined by ion implanting phosphorus at a typical moderate dosage of $3 \times 10^{12}$ ions/cm$^2$ and a typical implantation energy of 130 KeV so as to help alleviate punchthrough.

After removing photoresist 204, a photoresist mask 206 is formed on screen oxide 202 above active region 128 (126). See FIG. 11d. P-type dopant is introduced through the section of screen oxide 202 not covered by photoresist 206 and into the underlying semiconductor material to provide epitaxial layer 50P with a moderately doped p-type precursor upper portion 54P (52P) and a heavily doped p-type well portion 58 (56).

P+ well 58 (56) is defined by ion implanting elemental boron at a typical heavy dosage of $2 \times 10^{13}$ ions/cm$^2$ and a typical implantation energy of 210 KeV. P upper body-material portion 54P (52P) is defined by ion implanting elemental boron at a typical moderate dosage of $5'10^{12}$ ions/cm$^2$ and a typical implantation energy of 60 KeV so as to help alleviate punchthrough.

After removing photoresist 206, a thermal anneal is optionally performed on the resultant semiconductor structure to repair lattice damage and place the implanted n-type and p-type dopants in energetically more stable sites so as to minimize further diffusion of these dopants during subsequent thermal operations. This optional anneal is preferably a rapid thermal anneal ("RTA") typically at 1075° C. for 10 sec. in a non-reactive environment typically nitrogen. Although the above-mentioned implantation steps define precursor upper body-material portions 54P (52P) and 134P (132P) and wells 58 (56) and 138 (136), the anneal completes their formation.

Screen oxide 202 is removed. A composite gate dielectric layer is thermally grown along the upper semiconductor surface to a typical thickness of 4 nm. See FIG. 11e. The composite gate dielectric layer may consist of silicon oxide or silicon oxynitride.

A layer of largely undoped (intrinsic) polysilicon is deposited on top of the composite gate dielectric layer to a typical thickness of 250 nm. Utilizing a suitable photoresist mask (not shown), the polysilicon layer is patterned to produce precursor gate electrodes 88P (68P) and 168P (148P) respectively for IGFETs 42 (40) and 122 (120). The portions of the composite gate dielectric underlying precursor gate electrodes 88P (68P) and 168P (148P) respectively constitute gate dielectric layers 86 (66) and 166 (146) for IGFETs 42 (40) and 122 (120). Surface-adjoining parts of upper body-material portions 54P (52P) and 134P (132P) situated generally below, and extending laterally slightly beyond, the opposite ends length-wise of precursor gate electrodes 88P (68P) and 168P (148P), respectively constitute intended locations for channel zones 84 (64) and 164 (144) of IGFETs 42 (40) and 122 (120).

A dielectric layer 208 of silicon oxide is thermally grown along the exposed surface of precursor polysilicon gate electrodes 88P (68P) and 168P (148P) to seal them. Seal-oxide layer 208 is typically 8 nm in thickness. During the polysilicon sealing step, the thickness of the gate dielectric material located along the portions of the upper semiconductor surface not covered by gate electrodes 88P (68P) and 168P (148P) increases slightly. This composite surface dielectric layer is indicated by reference symbol 210 in FIG. 16e.

Figure 11F:
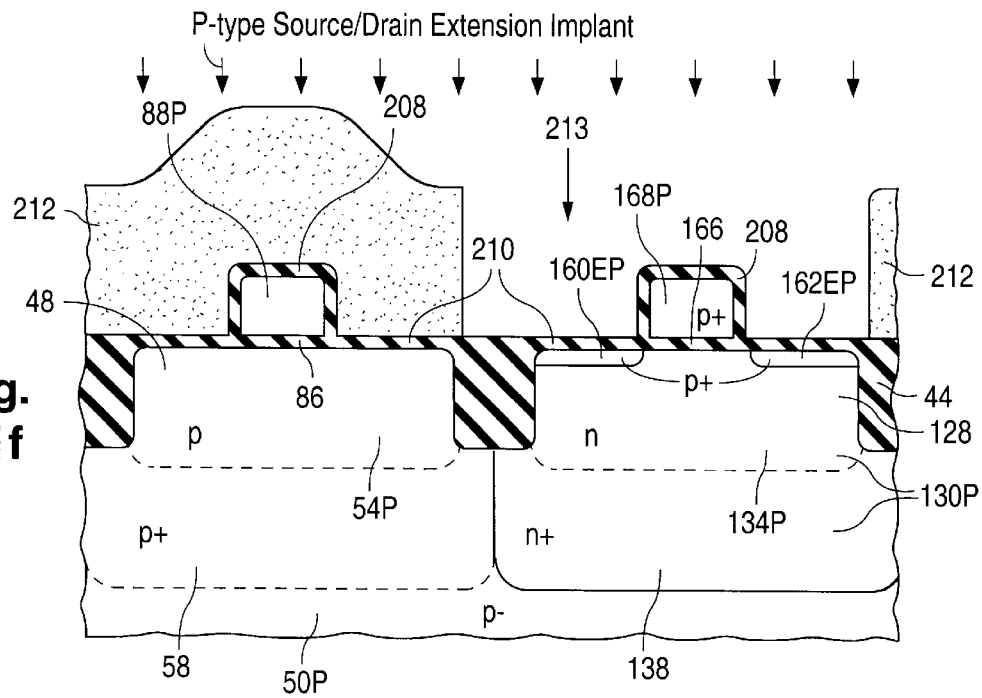

A photoresist mask 212 is formed on the portions of dielectric layers 208 and 210 overlying active region 48 (46) as shown in FIG. 11f. Photoresist mask 212 has an opening 213 above active region 128 where p-channel IGFET 122 is being formed. Photoresist 212 also has a mask opening, typically separate from mask opening 213 but potentially the same as opening 213, above active region 126 where IGFET 120 is being formed. For simplicity, the mask opening above active region 126 is not identified by a parenthetical reference symbol.

As shown in FIG. 11f, photoresist mask 212 has left-hand and right-hand transverse mask sides (or edges) defined by opening 213. For reasons presented below in connection with the n-type halo doping operation, the combination of gate electrode 168 and the portions of dielectric layer 208 situated on the opposite transverse sides of electrode 168P are further away from the left-hand transverse mask side than from the right-hand transverse mask side. The combination of gate electrode 148P and the portions of layer 208 situated on the opposite transverse sides of electrode 148P has the same relationship to the left-hand and right-hand transverse mask sides defined by the (unshown) mask opening for IGFET 120.

A pair of laterally separated heavily doped p-type precursor source/drain extensions 160EP and 162EP (140EP and 142EP) for p-channel IGFET 122 (120) are defined by ion implanting a species of a p-type dopant through mask opening 213, through the underlying uncovered portions of surface dielectric layer 210, and into a pair of laterally separated portions of upper body-material portion 134P (132P). The material consisting of photoresist mask 212, field insulation 44, and gate electrode 168P (148P), including the overlying portion of seal oxide 208, forms a shield that largely blocks the p-type source/drain extension dopant from simultaneously passing through the upper semiconductor surface section directly underlying the shield. The p-type source/drain extension dopant is typically boron in the form of boron difluoride at a typical heavy dosage of $6\times10^{13}$ ions/cm$^2$ and a typical implantation energy of 10 KeV.

Figure 11G:
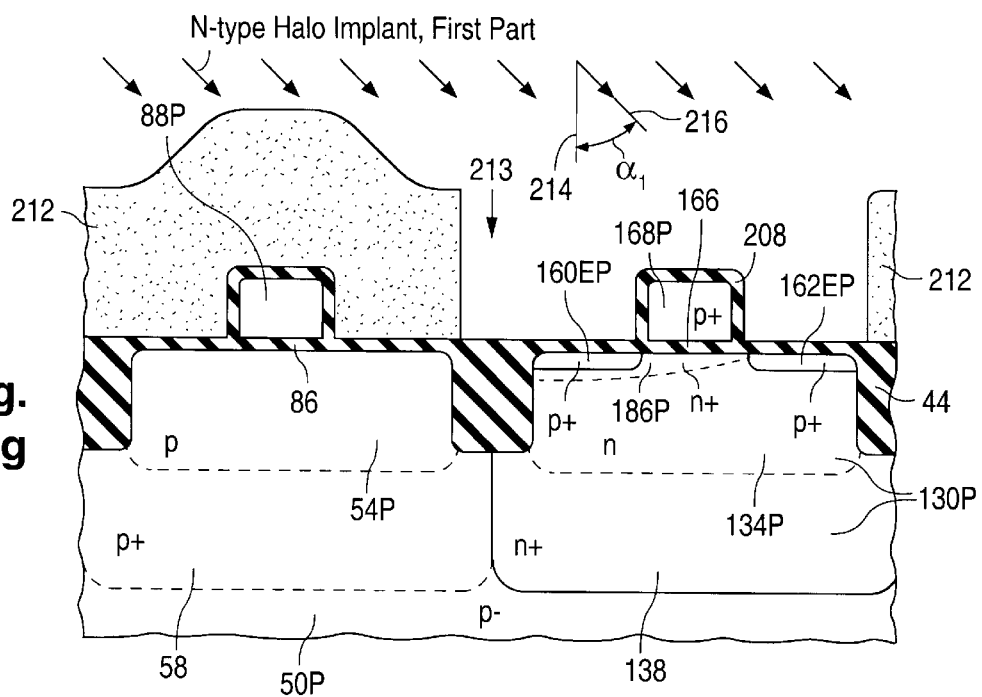
Figure 11H:
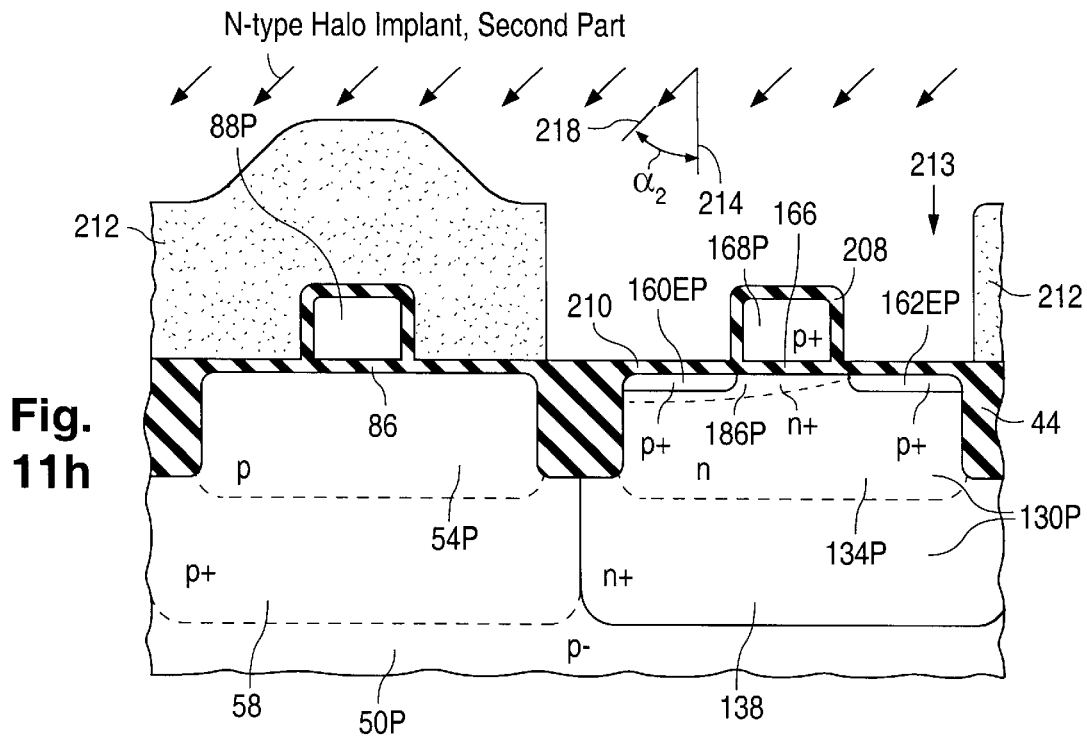

With photoresist mask 212 in place, a halo doping operation is performed to introduce an n-type halo dopant into the intended location for channel zone 164 (144) of p-channel IGFET 122 (120) at a heavy dosage. The n-type halo doping operation is done in multiple parts, or steps, to define a heavily doped n-type precursor halo pocket portion 186P (180P) in upper body-material portion 134P (132P) and to define at least one other heavily doped n-type precursor halo pocket portion elsewhere in the semiconductor structure. FIGS. 11g and 11h respectively illustrate examples of two parts of the n-type halo doping operation.

For short-channel IGFET 122, n+ halo pocket 186P extends laterally from (the location for) source/drain extension 160EP at least partway to (the location for) source/drain extension 162EP at a progressively decreasing net n-type dopant concentration. Halo pocket 186P also extends at least partway across (the location for) extension 160EP. For long-channel IGFET 120, n+ halo pocket 180P (not shown) extends laterally from (the location for) source/drain extension 140EP partway, but not all the way, to (the location for) source/drain extension 142EP at a progressively decreasing net n-type dopant concentration. Halo pocket 180P also extends at least partway across (the location for) extension 140EP. The difference between halo pockets 186P and 180P is that halo pocket 186P extends further percentage-wise across the distance between extensions 160EP and 162EP than halo pocket 180P does across the distance between extensions 140EP and 142EP. During the n-type halo doping operation, an electrically inconsequential portion of the n-type halo dopant may enter extension 162EP (142EP) at a location (not indicated) spaced laterally apart from halo pocket 186P (180P).

The n-type halo doping operation is performed by angled ion implantation from multiple different angular orientations in such a way that ions of a species of the n-type halo dopant pass in an angled manner through mask opening 213, through the uncovered material of dielectric layer 210, and into upper body-material portion 134P (132P) close to the lower edge of largely only one of the two transverse sides of gate electrode 168P (148P). FIG. 11g illustrates an example of a first part of the n-type halo doping operation at one of the angular orientations. FIG. 11h depicts an example of a second part of the n-type halo doping at another of the angular orientations.

Ions of the n-type halo dopant species impinge on photoresist mask 212 and opening 213 during both parts of the n-type halo doping operation. In the exemplary sequence of FIGS. 11g and 11h, the location and shape (or size) of mask opening 213 are arranged so that the ions pass close to the lower edge of the left-hand transverse side of gate electrode 168P (148P) and into the intended location for channel zone 164 (144) during the first part of the n-type halo doping. See FIG. 11g. Due to the angular nature of the ion implantation in the first part of the n-type halo doping, gate electrode 168P (148P) in combination with the portion of dielectric layer 208 situated along electrode 168P (148P) prevents the ions from passing close to the lower edge of the right-hand transverse side of electrode 168P (148P).

The location and shape of mask opening 213 are also arranged so that photoresist mask 212, gate electrode 168P (148P), and the adjoining portion of dielectric layer 208 block any electrically significant amount of ions of the n-type halo dopant species from entering the location for channel zone 164 (144) during the second part of the n-type halo doping implantation. See FIG. 11h. In particular, photoresist 212 substantially blocks (shadows) the ions from passing close to the lower edge of the right-hand side of electrode 168P (148P) during the second part of the n-type halo doping. Due to the angular nature of the implantation in the second part of the n-type halo doping, electrode 168P (148P) in combination with the adjoining portion of layer 208 prevents the ions from passing close to the lower edge of the left-hand side of electrode 168P (148P).

The net result of the two parts of the n-type halo doping operation illustrated in FIGS. 11g and 11h is that an electrically significant amount of the ions of the n-type halo dopant species enter the location for channel zone 164 (144) after passing close to the lower edge of largely only the left-hand one of the two transverse sides of gate electrode 168P (148P). Consequently and as indicated by the asymmetrical shape of halo pocket 186P, the channel-zone location is doped more heavily n-type at its left-hand end than at its right-hand end.

Inasmuch as shadowing by photoresist mask 212 substantially prevents ions of the n-type halo dopant species from passing close to the lower right-hand edge of gate electrode 168P (148P) and entering the location for channel zone 164 (144) during the second part of the n-type halo doping operation, the second part of the n-type halo implantation does not have any significant electrical effect on IGFET 122 (120). However, the second part of the n-type halo implantation is normally utilized in doping the intended location for the channel zone of at least one other p-channel IGFET being formed elsewhere in the semiconductor structure as discussed below in connection with FIG. 14. If no other such p-channel IGFET is being provided in a particular implementation of the semiconductor structure, the second part of the n-type halo implantation can be deleted.

Angled ion implantation, as utilized in the n-type halo doping operation described here and in the p-type halo doping operation described below, is characterized by an average tilt angle α and an average azimuthal (rotational) angle β. Tilt angle α is measured relative to a vertical line 214 extending generally perpendicular to the upper semiconductor surface. Azimuthal angle β is measured in a plane extending generally parallel to the upper semiconductor surface. Also, angle β is measured from some reference line in that plane. An understanding of the roles of angles α and β is facilitated with the assistance of FIGS. 12a, 12b, and 13.

Figure 12A:
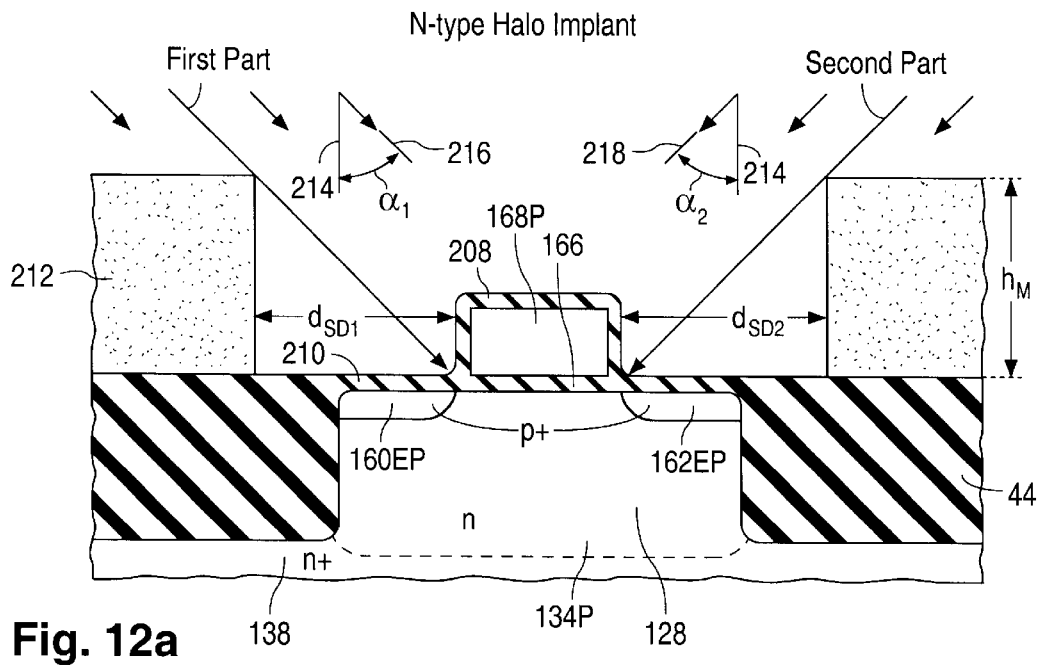
FIGS. 12a and 12b are front cross-sectional views for a p-channel IGFET model of how photoresist mask shadowing affects angled halo ion implantation.
Figure 12B:
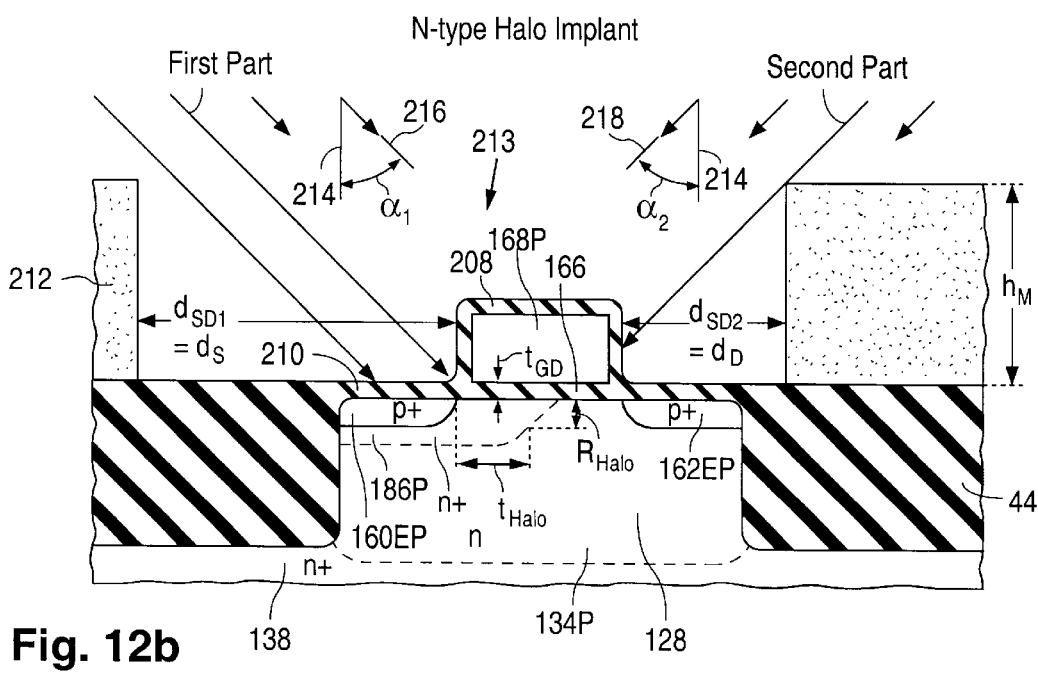

FIGS. 12a and 12b present a model of how shadowing by photoresist mask 212 affects angled ion implantation of a p-channel IGFET when ions of the n-type halo dopant species impinge on mask 212 from two opposite azimuthal orientations. FIG. 12a models the situation in which mask 212 has an opening whose dimensions are of such a nature that the intended location of the channel zone of the p-channel IGFET under fabrication is just at the verge of receiving n-type halo dopant. FIG. 12b models the situation in which the p-channel IGFET under fabrication is IGFET 122. The shape and location of mask opening 213 in FIG. 12b are of such a nature that the location of channel zone 164 is asymmetrically halo doped in the manner described above. To facilitate comparison between FIGS. 12a and 12b, the various regions of the p-channel IGFET in FIG. 12a are labeled with the reference symbols utilized for the corresponding regions of IGFET 122.

Figure 13:
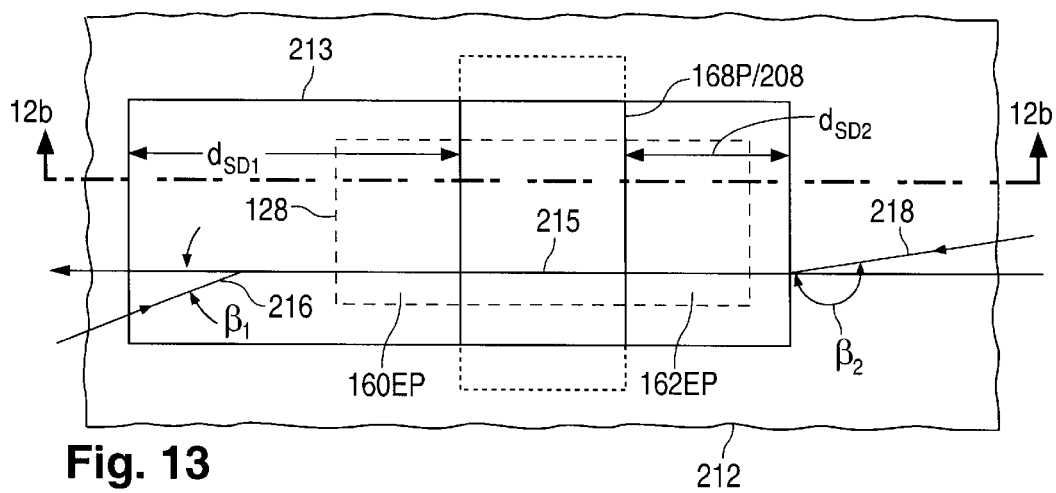
FIG. 13 is a layout view of the p-channel IGFET having the asymmetrically doped channel zone in FIG. 12b. The cross section of FIG. 12b is taken through plane 12b–12b in FIG. 13.

FIG. 13 presents a layout view of the structure of FIG. 12b for the general case in which ions of the n-type halo dopant species impinge on photoresist mask 212 from orientations close to, but not necessarily at, the two opposite azimuthal orientations. Azimuthal measurement in FIG. 13 is made from a reference line 215 extending in the longitudinal direction for IGFET 122. The positive direction for reference line 215 is from the location of source/drain zone 162EP to the location of source/drain zone 160EP. This definition is arbitrary and can be reversed.

FIGS. 12a, 12b, and 13 model both parts of the n-type halo implantation. Tilt and azimuthal parameters for the first and second parts of the n-type halo implantation are respectively indicated by the subscripts "1" and "2" applied to reference symbols $\alpha$ and $\beta$.

With the foregoing in mind, the first part of the n-type halo implantation entails directing ions of the n-type halo dopant species toward photoresist mask 212 at a first average tilt angle $\alpha_1$ of at least 15°, normally at least 25°, preferably at least 35°, along paths that originate higher than mask 212 and laterally beyond the left-hand transverse mask side defined by opening 213. The paths of the ions during the first part of the n-type halo implantation are at a first average azimuthal angle $\beta_1$ which normally differs (plus or minus) from 0° by no more than 60°, preferably differs from 0° by no more than 45°, and typically differs from 0° by 30–35°.

The second part of the n-type halo implantation entails directing ions of the n-type halo dopant species toward photoresist mask 212 at a second average tilt angle $\alpha_2$ of at least 15°, normally at least 25°, preferably at least 35°, along paths that originate higher than mask 212 and laterally beyond the right-hand transverse mask side defined by opening 213. The paths of the ions during the second part of the n-type halo implantation are at a second average azimuthal angle $\beta_2$ which normally differs from 180° by no more than 60°, preferably differs from 180° by no more than 45°, and typically differs from 180° by 30–35°.

FIGS. 11g, 11h, 12a, 12b depict the angled implantation arrangement in which azimuthal angles $\beta_1$ and $\beta_2$ respectively are 0° and 180°. This arrangement is typically preferred if no significant amount of undesired ion channeling occurs when ions of the n-type halo dopant species enter the semiconductor body. Should a significant amount of undesired ion channeling occur when angles $\beta_1$ and $\beta_2$ respectively are 0° and 180°, different $\beta_1$ and $\beta_2$ values are utilized to reduce the ion channeling. Setting angles $\beta_1$ and $\beta_2$ at values that respectively differ from 0° and 180° by 30–35° typically avoids ion channeling.

During the first part of the n-type halo implantation, ions of the n-type halo dopant species impinge on photoresist mask 212 generally parallel to, i.e., approximately parallel on the average to, a first principal impingement axis 216 which is at tilt angle $\alpha_1$ to vertical line 214. See FIGS. 11g and 12b for the exemplary case in which azimuthal angle $\beta_1$ is 0°. Principal impingement axis 216 is at azimuthal angle $\beta_1$ to reference line 215 as depicted in FIG. 13.

During the second part of the n-type halo implantation, ions of the n-type halo dopant species impinge on photoresist mask 212 generally parallel to a second principal impingement axis 218 which is at tilt angle $\alpha_2$ to vertical line 214. See FIGS. 11h and 12b for the exemplary case in which azimuthal angle $\beta_2$ is 180°. Principal impingement axis 218 is at azimuthal angle $\beta_2$ to reference line 215 as shown in FIG. 13.

Tilt angles $\alpha_1$ and $\alpha_2$ are usually close to each other. Specifically, angles $\alpha_1$ and $\alpha_2$ are normally within 10° of each other, preferably within 5° of each other, and typically approximately equal to each other. Azimuthal angles $\beta_1$ and $\beta_2$ typically differ from each other by approximately 180°. In that case, principal impingement axes 216 and 218 cross each other at an axial angle approximately equal to the sum of tilt angles $\alpha_1$ and $\alpha_2$. Also, azimuthal angle $\beta_1$ is then typically 30–35° (or –35––30°) while azimuthal angle $\beta_2$ is typically 210–215° (or 145–150°).

To implement azimuthal angles $\beta_1$ and $\beta_2$, either the semiconductor body can be rotated appropriately about a vertical axis, or the ion implantation beam can be suitably moved. Principal impingement axes 216 and 218 are typically largely fixed during the implantation of the n-type halo dopant. Nonetheless, principal axes 216 and 218 can be varied during the n-type halo dopant implantation.

In the typical situation where azimuthal angles $\beta_1$ and $\beta_2$ respectively differ from 0° and 180°, shadowing by items such as field insulation 44 typically produces some transverse asymmetry, i.e., asymmetry in the direction of the channel width, in the n-type halo doping across halo pocket 186P (180P). The degree of transverse halo asymmetry typically increases with increasing difference between angle $\beta_1$ and 0° and/or with increasing difference between angle $\beta_2$ and 180°.

The transverse halo asymmetry can be partially or wholly overcome by appropriately performing each above-mentioned part of the n-type halo implantation in two parts (or steps). Specifically, part of the n-type halo implantation at azimuthal angle $\beta_1$ is conducted at a $\beta_1$ value greater than 0°, while the remainder of the n-type halo implantation at angle $\beta_1$ is conducted at a $\beta_1$ value less than 0°, both of these $\beta_1$ values meeting the broad specifications given above for angle $\beta_1$. The two $\beta_1$ values may, for example, differ from 0° by approximately equal amounts and thus be approximately equal in magnitude but of opposite sign.

Similarly, part of the n-type halo implantation at azimuthal angle $\beta_2$ is conducted at a $\beta_2$ value greater than 180° while the remainder of the n-type halo implantation at angle $\beta_2$ is conducted at a $\beta_2$ value less than 180°, both of these $\beta_2$ values meeting the broad specifications given above for angle $\beta_2$. The two $\beta_2$ values may, for instance, differ from 180° by approximately equal amounts.

Each of the device regions being subjected to the n-type halo implantation in FIGS. 12a and 12b has a gate electrode structure formed with gate electrode 168P and any material situated along electrode 168P. In the fabrication process of the invention, a portion of dielectric layer 208 is situated along electrode 168P during the n-type halo implantation. Accordingly, the gate electrode structure consists of electrode 168P and the adjoining portion of layer 208 in FIGS. 12a and 12b.

The opening through photoresist mask 212 in FIG. 12a defines two opposite transverse mask sides. Referring to FIG. 12b, opening 213 likewise defines two opposite transverse sides of mask 212 as mentioned above. Item $d_{SD1}$ in FIGS. 12a and 12b is the longitudinal distance from the left-hand transverse side of mask 212 to the nearest transverse side, i.e., the left-hand side, of gate electrode structure 168P/208. Similarly, item $d_{SD2}$ is the longitudinal distance from the right-hand transverse side of mask 212 to the nearest transverse side, i.e., the right-hand side here, of electrode structure 168P/208.

Consider the typical situation in which tilt angles $\alpha_1$ and $\alpha_2$ are the same and are simply designated as tilt angle $\alpha$. Assume that azimuthal angles $\beta_1$ and $\beta_2$ differ by 180° as is typically the case. Let angles $\beta_1$ and $\beta_2$ be generally designated as azimuthal angle $\beta$.

FIG. 12a illustrates the same structure as FIG. 12b except that halo pocket 186P is absent in the structure of FIG. 12a. This occurs because, as indicated above, the mask opening through photoresist mask 212 in FIG. 12a is of such dimensions that the channel-zone location is just on the verge of receiving n-type halo dopant. The threshold condition of FIG. 12a occurs when each of distances $d_{SD1}$ and $d_{SD2}$ is at a threshold value $d_X$ given as:

$$d_X = h_M \tan\alpha \cdot |\cos\beta| \quad (1)$$

where $h_M$ is the height of mask 212 above gate dielectric layer 166. With azimuthal angles $\beta_1$ and $\beta_2$ differing by 180°, it is immaterial whether the $\beta_1$ or $\beta_2$ value is utilized for azimuthal angle $\beta$ in Eq. 1 since $|\cos(180°+\beta)|$ equals $|\cos\beta|$.

Distance $d_{SD2}$ is less than threshold value $d_X$ in the structure of FIGS. 12b and 13. As indicated in FIG. 12b, making distance $d_{SD2}$ this small enables photoresist mask 212 to block ions of the n-type halo dopant species from passing close to the lower right-hand edge of gate electrode structure 168P/208 during the second part of the n-type halo implantation. The ions of the n-type halo dopant species are thus prevented from passing close to the lower right-hand edge of gate electrode 168P and entering the channel-zone location during the second part of the n-type halo implantation. The source/drain zone being formed to the lower right of electrode 168P then normally serves as the drain during IGFET operation.

Let $d_D$ represent the longitudinal distance from gate electrode structure 168P/208 across the location for the drain-acting source/drain zone to photoresist mask 212. Distance $d_D$ than satisfies the relationship:

$$d_D < d_X \quad (2)$$

where threshold value $d_X$ is given from Eq. 1, and distance $d_D$ is $d_{SD2}$ in the implementation of FIGS. 12b and 13.

When part of the n-type halo implantation is performed at two or more $\beta^1$ azimuthal values and thus normally also at two or more $\beta_2$ azimuthal values, the values of angles $\alpha$ and $\beta$ for insertion into Eq. 1 to determine threshold value $d_X$ are those which yield the lowest value for the factor $\tan\alpha\cdot|\cos\beta|$. With tilt angle $\alpha$ being constant, value $d_X$ is determined by the $\beta_1$ value that differs the most from 0°, i.e., the largest $\beta_1$ value, or (equivalently) the $\beta_2$ value that differs the most from 180°.

The source/drain zone being formed to the lower left of gate electrode 168P normally acts as the source during IGFET operation while the source/drain zone formed to the lower right of electrode 168P normally acts as the drain during IGFET operation. Let $d_S$ represent the longitudinal distance from gate electrode structure 168P/208 across the location for the source-acting source/drain zone to photoresist mask 212. Halo pocket 186P is on the verge of being fully defined by the n-type halo implantation, specifically the first part of the n-type halo implantation in the example of FIG. 12b, when distance $d_S$ is just at a transitional value $d_Y$ given as:

$$d_Y = (h_M + t_{GD} + R_{Halo}) \tan\alpha \cdot |\cos\beta| \quad (3)$$

where $t_{GD}$ is the thickness of gate dielectric layer 166, and $R_{Halo}$ is the vertical range (average depth) of the n-type halo implantation below the upper semiconductor surface. Distance $d_S$ then satisfies the relationship:

$$d_S \geq d_Y \quad (4)$$

where distance $d_S$ is $d_{SD1}$ in the example of FIGS. 12b and 13.

The factor $(tr_D + R_{Halo}) \tan\alpha \cdot |\cos\beta|$ in Eq. 3 accounts for the longitudinal thickness $t_{Halo}$ of halo pocket 186P directly after the n-type halo implantation at a depth below the upper semiconductor surface equal to vertical range $R_{Halo}$ of the halo dopant. Longitudinal thickness $t_{Halo}$, here is the distance by which halo pocket 186P extends from precursor source/drain extension 160EP laterally below gate electrode structure 168P/208 at a depth equal to $R_{Halo}$. Atoms of the n-type halo dopant are present across all of longitudinal halo thickness $t_{Halo}$. If factor $(t_{GD} + R_{Halo}) \tan\alpha \cdot |\cos\beta|$ were not present in Eq. 3, atoms of the n-type halo dopant might be present to some degree below gate electrode structure 168P/208 but would normally not be present at the desired concentration across all of thickness $t_{Halo}$.

When part of the n-type halo implantation is performed at two or more $\beta_1$ azimuthal values and therefore normally also at two or more $\beta_2$ azimuthal values, the values of angles $\alpha$ and $\beta$ for insertion into Eq. 3 to determine transitional value $d_Y$ are those which yield the highest value for the factor $\tan\alpha\cdot|\cos\beta|$. With tilt angle $\alpha$ being constant, value $d_Y$ is determined by the $\beta_1$ value that differs the least from 0°, i.e., the smallest $\beta_1$ value, or (equivalently) the $\beta_2$ value that differs the least from 180°.

The mask-opening positioning/sizing criteria established by relationships 1–4 are simplified. Some of the n-type halo dopant species ions invariably pass through the upper corners of photoresist mask 212 and cause it to be partially eroded. Due to this mask penetration/erosion, values $d_X$ and $d_Y$ may be chosen to be slightly smaller than what is determined from Eqs. 1 and 3.

Figure 14:
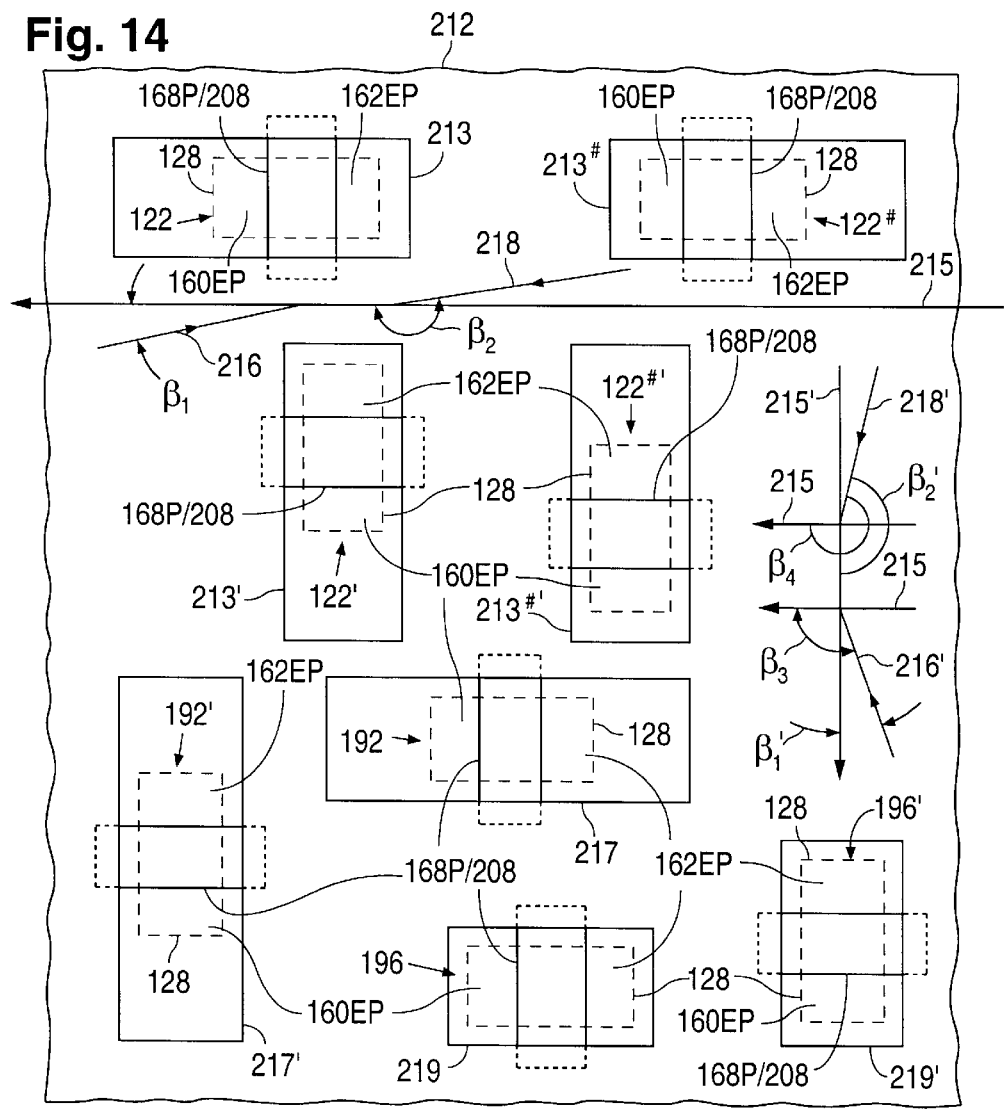
FIG. 14 is a layout view of a masked structure arranged in accordance with the invention to yield various asymmetrical and symmetrical p-channel IGFETs.

FIG. 14 presents a layout view which illustrates how openings through photoresist mask 212 are shaped and positioned for use during the n-type halo implantation in manufacturing various p-channel IGFETs of both the asymmetrical and symmetrical type. These mask openings are all utilized during the p-type source/drain extension implantation for providing each of the IGFETs with source/drain extensions 160EP and 162EP. The openings in mask 212 are indicated by solid line in FIG. 14 as items 213, 213#, 213', 213#', 217, 217', 219, and 219'.

Mask openings 213, 213#, 213', 213#', 217, 217', 219, and 219' are respectively employed in fabricating short p-channel IGFETs 122, 122#, 122', 122#', 192, 192', 196, and 196'. As with IGFET 122, the location of channel zone 164 for each of IGFETs 122#, 122', and 122#' is provided with asymmetrical n-type halo doping. IGFETs 192', 196, and 196', along with IGFET 192, are formed as symmetrical devices. As with IGFET 192, the location of channel zone 164 in IGFET 192' is furnished with symmetrical n-type halo doping. The locations of channel zones 164 in IGFETs 196 and 196' do not receive electrically significant amounts of the n-type halo dopant.

First consider asymmetrical IGFETs 122 and 122#. Mask openings 213 and 213# for IGFETs 122 and 122# appear near the top of FIG. 14. IGFETs 122 and 122# have their channel lengths aligned in substantially the same direction along reference line 215. This direction is referred to as the east-west direction.

Gate electrode structures 168P/208 of IGFETs 122 and 122# are respectively exposed through mask openings 213 and 213#. The orientation of opening 213 relative to structure 168P/208 of IGFET 122# is basically opposite to the orientation of opening 213 relative to structure 168P/208 of IGFET 122. Specifically, distance $d_{SD1}$ from the left-hand side of structure 168P/208 of IGFET 122# to the left-hand transverse mask side defined by opening 2134 implements distance $d_D$ rather than distance $d_S$ as occurs with opening 213 and structure 168P/208 of IGFET 122. Similarly, distance $d_{SD2}$ from the right-hand side of structure 168P/208 of IGFET 122$^{\#}$ to the right-hand mask transverse side defined by opening 213$^{\#}$ implements distance $d_S$ instead of distance $d_D$ as occurs with opening 213 in structure 168P/208 of IGFET 122.

By arranging the location and shape (or size) of mask opening 213$^{\#}$ in the foregoing way, the combination of photoresist mask 212, gate electrode 168P for TGFET 122$^{\#}$, and the adjoining portion of dielectric layer 208 blocks any electrically significant amount of the n-type halo dopant species ions impinging on mask 212 and opening 213$^{\#}$ at angles $\alpha_1$ and $\beta_1$, from entering the intended channel-zone location for IGFET 122$^{\#}$ during the first part of the n-type halo implantation. With the location and shape of opening 213$^{\#}$ so arranged, an electrically significant amount of the n-type halo dopant species ions impinging on mask 212 and opening 213$^{\#}$ at angles $\alpha_2$ and $\beta_2$ enter the channel-zone location for IGFET 122$^{\#}$ during the second part of the n-type halo implantation. The ions entering the channel-zone location of IGFET 122$^{\#}$ pass close to the lower right-hand side of gate electrode structure 168P/208 of IGFET 122$^{\#}$. This is opposite to the location where the n-type halo dopant species ions enter the channel-zone location of IGFET 122.

The net result of the two parts of the n-type halo doping operation is that the channel-zone location of IGFET 122$^{\#}$ is asymmetrically doped but in the opposite manner to what occurs in the channel-zone location of IGFET 122. That is, a heavily doped n-type precursor halo pocket portion 188P (not shown) is furnished to the channel-zone location of IGFET 122$^{\#}$ so that its channel-zone location is doped more heavily at the right-hand end than at the left-hand end. Opposite to what occurs in IGFET 122, source/drain zones 160 and 162 in the final structure of IGFET 122$^{\#}$ normally respectively function permanently as the drain and source during IGFET operation.

Note that the paths of the ions of n-type halo dopant species utilized during the first part of the n-type halo implantation need to originate laterally beyond the left-hand transverse mask sides defined by both of mask openings 213 and 213$^{\#}$ regardless of where openings 213 and 213$^{\#}$ are located in mask 212. Likewise, the paths of the n-type halo dopant species ions during the second part of the n-type halo implantation need to originate laterally beyond the left-hand transverse mask sides defined by both of openings 213 and 213$^{\#}$. Since openings 213 and 213$^{\#}$ may be widely separated rather than close together as indicated in the example of FIG. 14, the ion beam which provides the ions of the n-type halo dopant species invariably originates laterally beyond the semiconductor structure under fabrication.

Moving down FIG. 14, consider asymmetrical IGFETs 122' and 122$^{\#\prime}$ for which the n-type halo doping is performed respectively through mask openings 213' and 213$^{\#\prime}$. IGFETs 122' and 122$^{\#\prime}$ have their channel lengths aligned in substantially the same direction, referred to as the north-south direction, along a reference line 215' extending substantially perpendicular to reference line 215. Gate electrode structures 168P/208 for IGFETs 122' and 122$^{\#\prime}$ are respectively exposed through openings 213' and 213$^{\#\prime}$. Similar to what occurs with IGFETs 122 and 122$^{\#}$, the orientation of opening 213$^{\#\prime}$ relative to structure 168P/208 of IGFET 122$^{\#\prime}$ is basically opposite to the orientation of opening 213' relative to structure 168P/208 of IGFET 122'.

The locations of channel zones 164 for IGFETs 122' and 122$^{\#\prime}$ are not halo doped during the above-mentioned first and second parts of the n-type halo doping operation. Instead, the n-type halo doping operation includes two additional parts, referred to as the third and fourth parts, for introducing the n-type halo dopant into the channel-zone locations for IGFETs 122' and 122$^{\#\prime}$.

The third part of the n-type halo doping operation entails directing ions of the n-type halo dopant species toward photoresist mask 212 and mask openings 213' and 213$^{\#\prime}$ at a third average tilt angle $\alpha_3$ and at a third average azimuthal angle $\beta_3$ along paths that originate higher than mask 212 and laterally beyond the lower (in the layout to FIG. 14) transverse mask sides defined by openings 213' and 213$^{\#\prime}$. As a result, the ions impinge on mask 212 generally parallel to a third principal impingement axis 216' which is at tilt angle $\alpha_3$ to vertical line 214 and at azimuthal angle $\beta_3$ to reference line 215. By performing the third part of the n-type halo dopant in basically the same way as the first part, the intended channel-zone location of IGFET 122' is asymmetrically n-type halo doped to produce halo pocket 186P without introducing an electrically significant amount of the ions into the intended channel-zone location of IGFET 122$^{\#\prime}$.

The fourth part of the n-type halo doping operation entails directing ions of the n-type halo dopant species toward photoresist mask 212 and openings 213' and 213$^{\#\prime}$ at a fourth average tilt angle $\alpha_4$ and at a fourth average azimuthal angle $\beta_4$ along paths that originate higher than mask 212 and laterally beyond the upper (in the layout of FIG. 14) transverse mask sides defined by openings 213' and 213$^{\#\prime}$. The ions thus impinge on photoresist 212 generally parallel to a fourth principal impingement axis 218' which is at tilt angle $\alpha_4$ to vertical line 214 and at azimuthal angle $\beta_4$ to reference line 215. By doing the fourth part of the n-type halo dopant in basically the same manner as the second part, the channel-zone location of IGFET 122$^{\#\prime}$ is asymmetrically n-type halo doped to produce halo pocket 188P without introducing an electrically significant amount of the ions into the channel-zone location for IGFET 122'. At the end of the third and fourth parts of the n-type halo implantation, the channel-zone locations of IGFETs 122' and 122$^{\#\prime}$ are asymmetrically doped in opposite ways as occurs with IGFETs 122 and 122$^{\#}$.

Tilt angles $\alpha_3$ and $\alpha_4$, which are measured from a vertical line such as line 214, are not illustrated in the drawings. However, angles $\alpha_3$ and 4 have the same value specifications as tilt angle $\alpha_1$ and $\alpha_2$. In other words, each of angles $\alpha_3$ and $\alpha_4$ is at least 15°, normally at least 25°, preferably at least 35°.

Azimuthal angles $\beta_3$ and $\beta_4$ are measured from reference line 215 as indicated in FIG. 14. Angles $\beta_3$ and $\beta_4$ are typical respectively in the vicinity of 90° greater than azimuthal angle $\beta_1$ and $\beta_2$. Hence, angle $\beta_3$ normally differs from 90° by no more than 60°, preferably differs from 90° by no more than 45°, and typically differs from 90° by 30–35° to avoid ion channeling. Angle $\beta_4$ normally differs from 270° by no more than 60°, preferably differs from 270° by no more than 45°, and typically differs from 270° by 30–35° to avoid ion channeling. Alternatively, angles $\beta_3$ and $\beta_4$ can be respectively be replaced with azimuthal angles $\beta_1'$ and $\beta_2'$ measured from reference line 215'. Angles $\beta_1'$ and $\beta_2'$ then have the same respective value specifications as angles $\beta_1$ and $\beta_2$.

Next consider IGFETs 192 and 192' whose channel-zone locations are symmetrically halo doped respectively through mask openings 217 and 217'. FIGS. 15$a$ and 15$b$ illustrate how the symmetrical n-type halo doping is provided to IGFET 192. During the above-mentioned first part of the n-type halo implantation, ions of the halo dopant species are directed toward photoresist mask 212 and opening 217 at tilt angle $\alpha_1$ and azimuthal angle $\beta_1$ along paths that originate higher than photoresist mask 212 and laterally beyond the left-hand transverse mask side defined by opening 217. FIG. 15a presents the situation for an arbitrary value of tilt angle $\alpha_1$ when azimuthal angle $\beta_1$ is 0°. An electrically significant amount of the ions passes close to the lower left-hand edge of gate electrode structure 168P/208 of IGFET 192 and into upper body-material portion 134P to form halo pocket 186P.

A complementary action occurs during the second part of the n-type halo implantation. Ions of the n-type halo dopant species are directed toward photoresist mask 212 and mask opening 217 at tilt angle $\alpha_2$ and azimuthal angle $\beta_2$ along paths that originate higher than mask 212 and laterally beyond the right-hand transverse mask side defined by opening 217. FIG. 15b presents the situation for an arbitrary value of tilt angle $\beta_2$ when azimuthal angle $\beta_2$ is 180°. An electrically significant amount of the ions passes close to the lower right-hand edge of gate electrode structure 168P/208 to define a heavily doped n-type precursor halo pocket portion which merges with halo pocket 186P to form halo pocket 184P.

Figure 16:
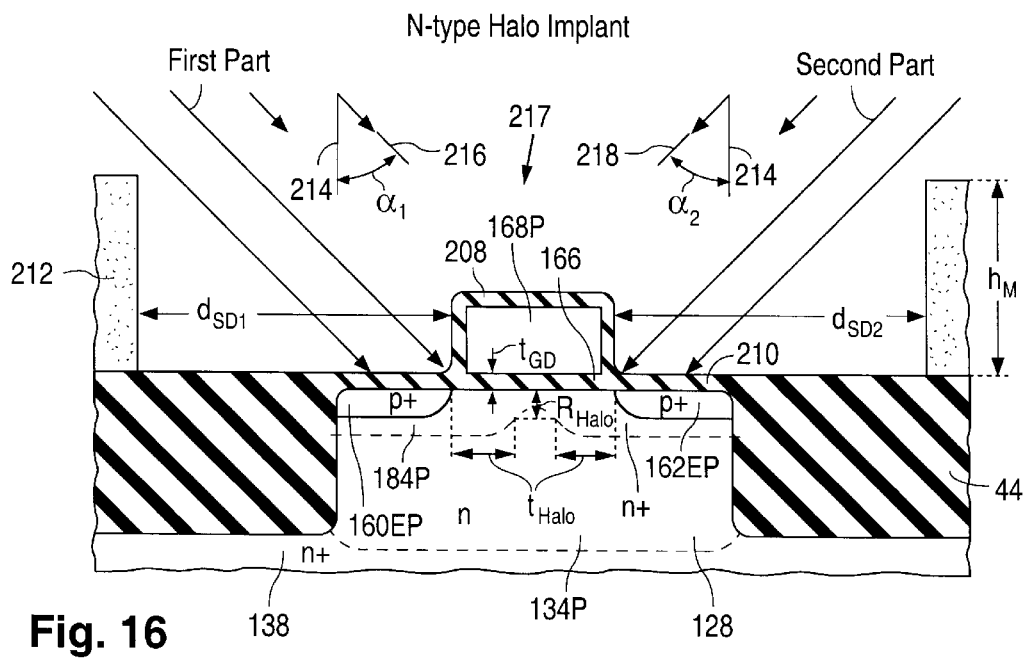
FIGS. 16 and 17 are extensions of the p-channel model of FIG. 12b.

FIG. 16 presents a variation of the model of FIG. 12b for illustrating how opening 217 in photoresist mask 212 is shaped and positioned to enable the channel-zone location of IGFET 192 to be symmetrically halo doped. Both the first and second parts of the n-type halo implantation are modeled in FIG. 16 for the case in which azimuthal angles $\beta_1$ and $\beta_2$ respectively are 0° and 180°. From an examination of FIG. 16, opening 217 and gate electrode structure 168P/208 for IGFET 192 need to satisfy the approximate distance relationship:

$$d_{SD1}, d_{SD2} \geq d_Y \tag{5}$$

where transitional value $d_Y$ is again given from Eq. 3 for an arbitrary value of general azimuthal angle $\beta$.

The channel length of IGFET 192I extends approximately perpendicular to the channel length of IGFET 192. Accordingly, the channel-zone location of IGFET 192' is symmetrically doped in the same way as that of IGFET 192 except that the third and fourth parts of the n-type halo implantation are employed in place of the first and second parts.

The last pair of IGFETs in FIG. 14 consists of symmetrical IGFETs 196 and 196' whose channel-zone locations receive essentially no n-type halo doping. Gate electrode structures 168P/208 of IGFETs 196 and 196' are respectively exposed through mask openings 219 and 219'. Consider IGFET 196. As ions of the n-type halo dopant species are directed toward photoresist mask 212 and opening 219 during both the first and second parts of the n-type halo implantation along paths that originate higher than mask 212 and respectively beyond the left-hand and right-hand transverse mask sides defined by opening 219, the combination of mask 212, gate electrode 168P of IGFET 196, and the adjoining portion of dielectric layer 208 blocks any electrically significant amount of the ions from entering the channel-zone location for IGFET 196.

Figure 17:
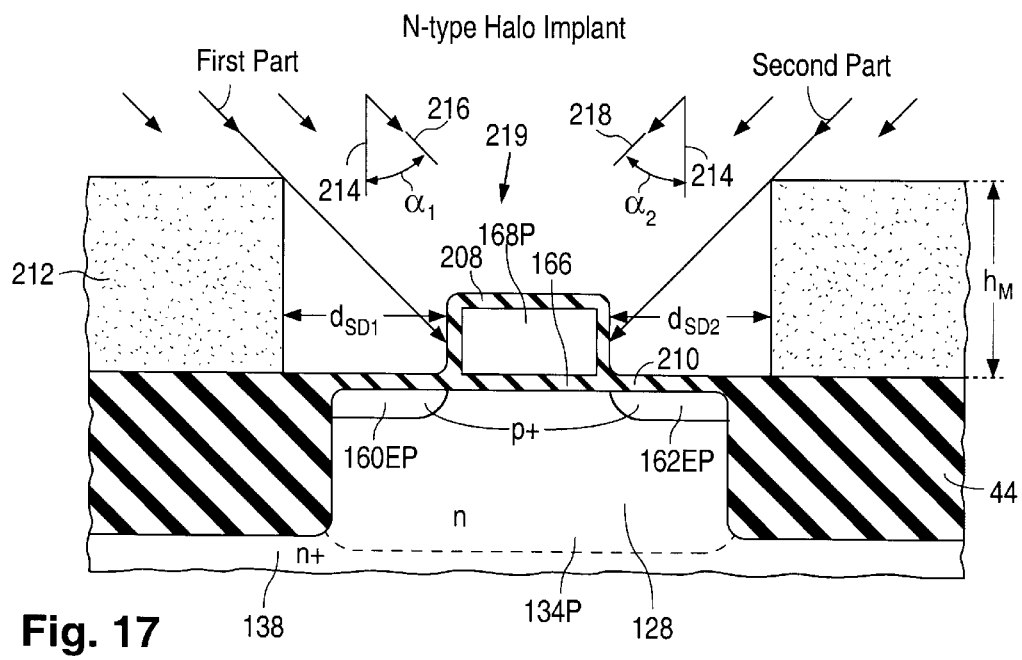

FIG. 17 presents a variation of the model of FIG. 12b for illustrating how opening 219 in photoresist mask 212 is shaped and positioned to enable the channel-zone location of IGFET 196 to avoid receiving any electrically significant amount of the n-type halo dopant. Both the first and second parts of the n-type halo implantation are modeled in FIG. 17 for the case in which azimuthal angles $\beta_1$ and $\beta_2$ respectively are 0° and 180°. From an examination of FIG. 17, opening 219 and gate electrode structure 68P/208 for IGFET 196 need to satisfy the approximate distance relationship:

$$d_{SD1}, d_{SD2} < d_X \tag{6}$$

where threshold value $d_X$ is again given from Eq. 1 for an arbitrary value of general azimuthal angle $\beta$.

The channel length of IGFET 196' extends approximately perpendicular to the channel length of IGFET 196. Hence, avoiding the introduction of any significant amount of the n-type halo dopant into the channel-zone location of IGFET 196' during the third and fourth parts of the n-type halo implantation is accomplished in the same way that introduction of an electrically significant amount of the n-type halo dopant into the channel-zone location of IGFET 196 is avoided in the first and second parts.

Some of the n-type halo dopant species ions impinging on photoresist mask 212 during the third and fourth parts of the n-type halo implantation enter mask openings 213, 213#, 217, and 219. Because these ions impinge on mask 212 generally along vertical planes extending in the north-south direction, gate electrode structures 168P/208 of IGFETs 122, 122#, 192, and 196 largely block them from entering the intended channel-zone locations for IGFETs 122, 122#, 192, and 196. Shadowing by mask 212 also assists in preventing these ions from entering the channel-zone locations for IGFETs 122, 122#, 192, and 196. Likewise, the n-type halo dopant species ions impinging on mask 212 during the first and second parts of the n-type halo implantation are largely blocked from entering the channel-zone locations for IGFETs 122', 122#', 192', and 196'.

The mask-opening layout principles described above and exemplified by the structure of FIG. 14 for the n-type implantation are not limited to short p-channel IGFETS. Mask openings for long p-channel IGFETs can likewise be shaped and positioned according to these principles.

The total dosage of the n-type halo dopant is normally $8 \times 10^{12} - 3 \times 10^{13}$ ions/cm², typically $1.6 \times 10^{13}$ ions/cm², during the first and second parts of the n-type halo implantation. Half of this n-type halo dosage is preferably furnished during each of the first and second parts of the n-type halo doping. Each of tilt angles $\alpha_1$ and $\alpha_2$ is typically 45° for the n-type halo implantation. The same specifications apply to the third and fourth parts of the n-type halo implantation. Using arsenic as the n-type halo dopant, the implantation energy is typically 150 KeV. Photoresist mask 212 is removed after completing the n-type halo implantation.

Figure 11I:
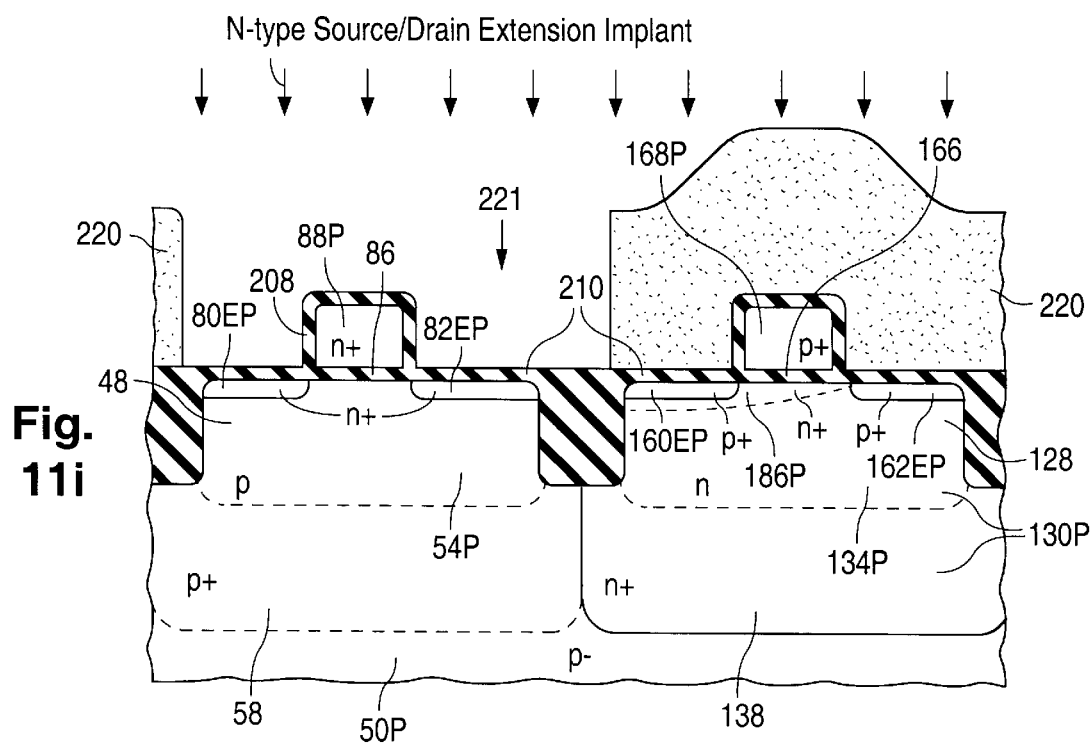

A photoresist mask 220 is formed on the portion of dielectric layers 208 and 210 overlying active region 128 (126). See FIG. 11i. Photoresist mask 220 has an opening 221 above active region 48 where n-channel IGFET 42 is being formed. As shown in FIG. 11i, mask 220 has left-hand and right-hand transverse mask sides (or edges) defined by opening 221. Mask 220 also has an opening, typically separate from mask opening 221 but potentially the same as opening 221, above active region 46 where IGFET 40 is being formed. For simplicity, the mask opening above active region 46 is not identified by a parenthetical reference symbol here.

A pair of laterally separated heavily doped n-type precursor source/drain extensions 80EP and 82EP (60EP and 62EP) for n-channel IGFET 42 (40) are defined by ion implanting a species of an n-type dopant through mask opening 221, through the underlying uncovered portions of surface dielectric layer 210, and into a pair of laterally separated portions of upper body-material portion 54P (52P). The material consisting of photoresist mask 220, field insulation 44, and gate electrode 88P (68P), including the overlying part of seal oxide 208, forms a shield that largely blocks the n-type source/drain extension dopant from simultaneously passing through the upper semiconductor surface section directly underlying the shield. The n-type source/drain extension dopant is typically arsenic at a typical heavy dosage of $5 \times 10^{14}$ ions/cm$^2$ and a typical implantation energy of 20 KeV.

Figure 11J:
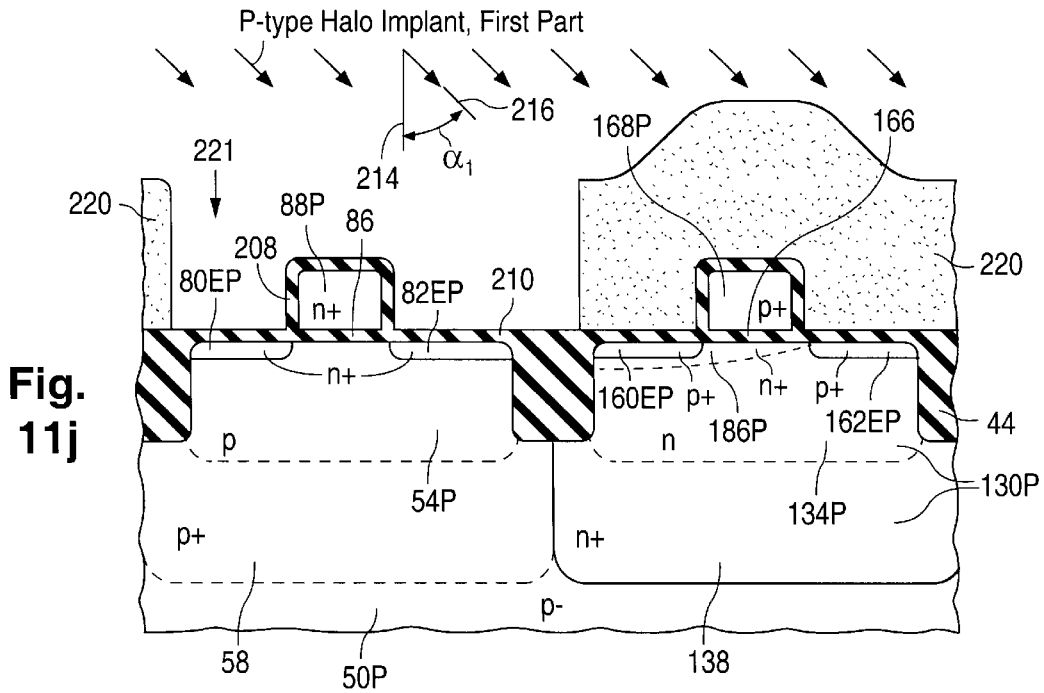
Figure 11K:
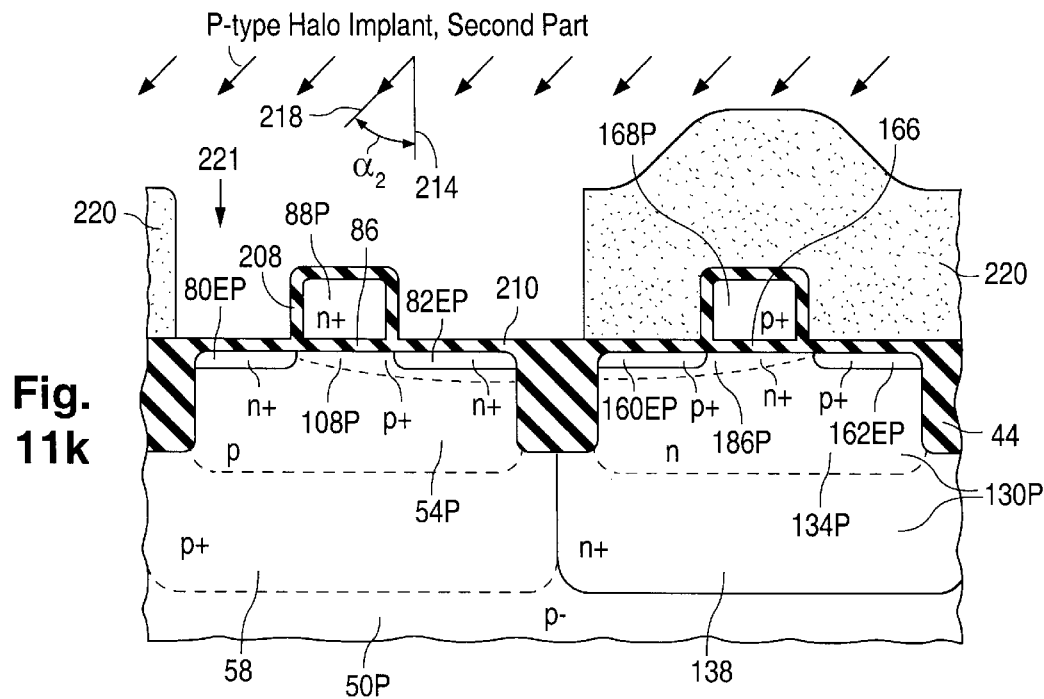

With photoresist mask 220 in place, a halo doping operation is performed to introduce a p-type halo dopant into the intended location for channel zone 84 (64) of IGFET 42 (40) at a heavy dosage. The p-type halo doping operation is done in multiple parts, or steps, to define a heavily doped p-type precursor halo pocket portion 108P (102P) in upper body-material portion 54P (52P) and to define at least one other heavily doped p-type precursor halo pocket portion elsewhere in the semiconductor structure. FIGS. 11j and 11k respectively illustrate examples of two parts of the p-type halo doping operation.

For short-channel IGFET 42, p+ halo pocket 108P extends laterally from (the location for) source/drain extension 82EP at least partway to (the location for) source/drain extension 80EP at a progressively decreasing net p-type dopant concentration. Halo pocket 108P also extends at least partway across (the location) for extension 82EP. For long-channel IGFET 40, p+ halo pocket 102P (not shown) extends laterally from (the location for) source/drain extension 62EP partway, but not all the way, to (the location for) source/drain extension 60EP at a progressively decreasing net p-type dopant concentration. Halo pocket 102P also extends at least partway across (the location for) extension 62EP. The difference between halo pockets 108P and 102P is that halo pocket 108P extends further percentage-wise across the distance between extensions 82EP and 80EP than halo pocket 102P does across the distance between extensions 62EP and 60EP. During the p-type halo doping operation, an electrically inconsequential portion of the p-type halo dopant may enter extension 80EP (60EP) at a location (not indicated) spaced apart from halo pocket 108P (102P).

The p-type halo doping operation is performed by angled ion implantation from multiple different angular orientations in such a way that ions of a species of the p-type halo dopant pass in an angled manner through mask opening 221, through the uncovered material of dielectric layer 210, and into upper body-material portion 54P (52P) close to the lower edge of largely only one of the two transverse sides of gate electrode 88P (68P). FIG. 11j depicts an example of a first part of the p-type halo doping operation at one of the angular orientations. FIG. 11k illustrates an example of a second part of the p-type halo doping at another of the angular orientations.

Ions of the p-type halo dopant impinge on photoresist mask 220 and opening 221 during both parts of the p-type halo doping operation. In the exemplary sequence of FIGS. 11j and 11k, the location and shape (or size) of opening 221 are arranged so that mask 220, gate electrode 88P (68P), and the portion of dielectric layer 208 situated along electrode 88P (68P) block any electrically significant amount of the ions from entering the intended location for channel zone 84 (64) during the first part of the p-type halo doping. In particular, mask 220 substantially blocks (shadows) the ions from passing close to the lower edge of the left-hand transverse side of electrode 88P (68P) during the first part of the p-type halo doping. See FIG. 11j. Due to the angular nature of the implantation in the first part of the p-type halo doping, electrode 88P (68P) in combination with the adjoining portion of the layer 208 prevents the ions from passing close to the lower edge of the right-hand transverse side of electrode 88P (68P).

The location and shape of mask opening 221 are also arranged so that the ions of the p-type halo dopant species pass close to the lower edge of right-hand side of gate electrode 88P (68P) during the second part of the p-type halo doping operation and enter the location for channel zone 84 (64). See FIG. 11k. Due to the angular nature of the implantation in the second part of the p-type halo doping, electrode 88P (68P) in combination with the adjoining portion of dielectric layer 208 prevents the ions from passing close to the lower edge of the left-hand side of electrode 88P (68P).

The net result of the two parts of the p-type halo doping operation illustrated in FIGS. 11j and 11k is that an electrically significant amount of the ions of the p-type halo dopant species enter the location for channel zone 84 (64) after passing close to the lower edge of largely only the right-hand one of the two transverse sides of gate electrode 88P (68P). Accordingly and as indicated by the asymmetrical shape of halo pocket 108P, the location for channel zone 84 (64) is doped more heavily p-type at its right-hand end than at its left-hand end.

Inasmuch as shadowing by photoresist mask 220 substantially prevents ions of the p-type halo dopant species from passing close to the lower left-hand edge of gate electrode 88P (68P) and entering the location for channel zone 84 (64) during the first part of the p-type halo doping operation, the first part of the p-type halo implantation does not have any significant electrical effect on IGFET 42 (40). Similar to what was said above about the second part of the n-type halo implantation, the first part of the p-type halo implantation is normally utilized in doping the intended location for the channel zone of at least one other n-channel IGFET being formed elsewhere in the semiconductor structure. If no other such n-channel IGFET is being provided in a particular implementation of the semiconductor structure, the first part of the p-type halo implantation can be deleted.

Angled ion implantation of the p-type halo dopant is performed in the manner generally described above for the angled implantation of the n-type halo dopant. The models of FIGS. 12a and 12b and the associated layout of FIG. 13 apply to the p-type halo implantation subject to reversing the conductivity types, substituting photoresist mask 220 for photoresist mask 212, and changing mask opening 213 to mask opening 221.

Photoresist mask 220 has left-hand and right-hand transverse mask sides (or edges) defined by opening 221. The longitudinal distance from gate electrode structure 88P/208 to the right-hand opening-defined transverse side of mask 220 is greater than the longitudinal distance from structure 88P/208 to the left-hand opening-defined transverse side of mask 220. Accordingly, distance $d_{SD1}$ from the left-hand transverse mask side to the left-hand transverse side of the gate electrode structure for the p-type halo implantation is distance $d_D$ rather than distance $d_S$ as arises with the n-type halo implantation. Similarly, distance $d_{SD2}$ from the right-hand transverse mask side to the right-hand side of the gate electrode structure for the p-type halo implantation is distance $d_S$ rather than distance $d_D$ as arises with the n-type halo implantation.

Specifically, the first part of the p-type halo implantation entails directing ions of the p-type halo dopant species toward photoresist mask 220 at tilt angle $\alpha_1$ and azimuthal angle $\beta_1$ along paths that originate higher than mask 220 and laterally beyond the left-hand transverse mask side defined by opening 221. FIG. 11j repeats vertical line 214 and first principal impingement axis 216 for tilt angle $\alpha_1$. The second part of the p-type halo implantation entails directing ions of the p-type halo dopant species toward mask 220 at tilt angle $\alpha_2$ and azimuthal angle $\beta_2$ along paths that originate higher than mask 220 and laterally beyond the right-hand transverse mask side defined by opening 221. FIG. 11k repeats vertical line 214 and second principal impingement axis 218 for tilt angle $\alpha_2$.

Angles $\alpha_1$, $\alpha_2$, $\beta_1$, and $\beta_2$ have largely the same value characteristics for the p-type halo implantation as for the n-type halo implantation. For example, each of tilt angles $\alpha_1$ and $\alpha_2$ is at least 15°, normally at least 25°, preferably at least 35°.

For the typical case in which tilt angles $\alpha_1$ and $\alpha_2$ are the same while azimuthal angles $\beta_1$ and $\beta_2$ differ by approximately 180°, halo pocket 108P (102P) is defined during the second part of the p-type halo implantation because distance $d_{SD2}$ is greater than distance $d_{SD1}$ rather than vice versa as occurs in the n-type halo implantation. Relationships 1–4 likewise apply to the p-type halo implantation.

Figure 18A:
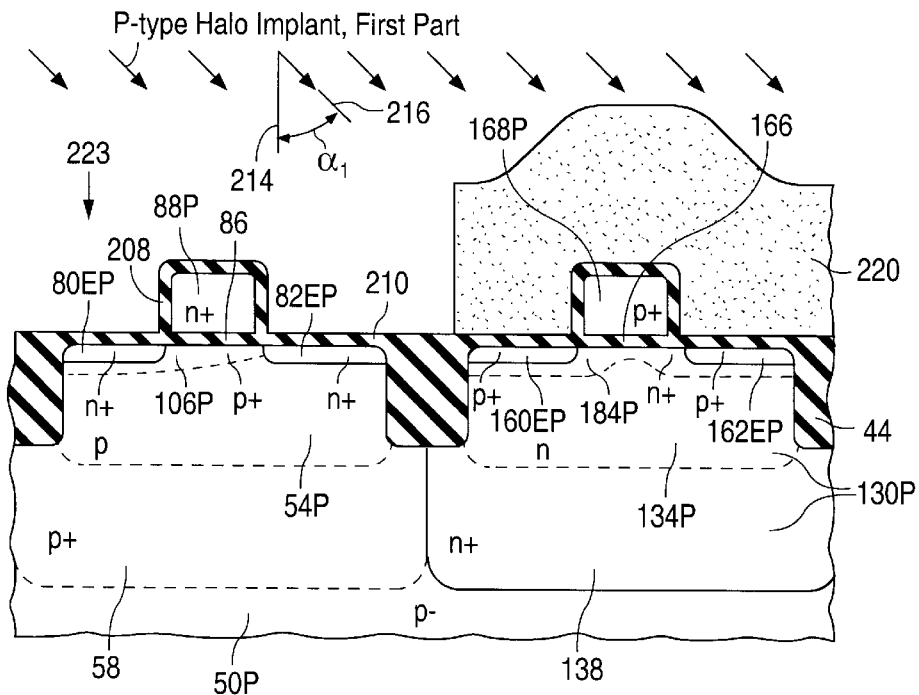
FIGS. 18a and 18b are cross-sectional views which illustrate how the process of FIGS. 11a–11o is utilized in manufacturing the symmetrical n-channel IGFETs of FIGS. 9a and 9b. The cross sections of FIGS. 18a and 18b are respectively produced at the same times as the cross sections of FIGS. 11j and 11k.
Figure 18B:
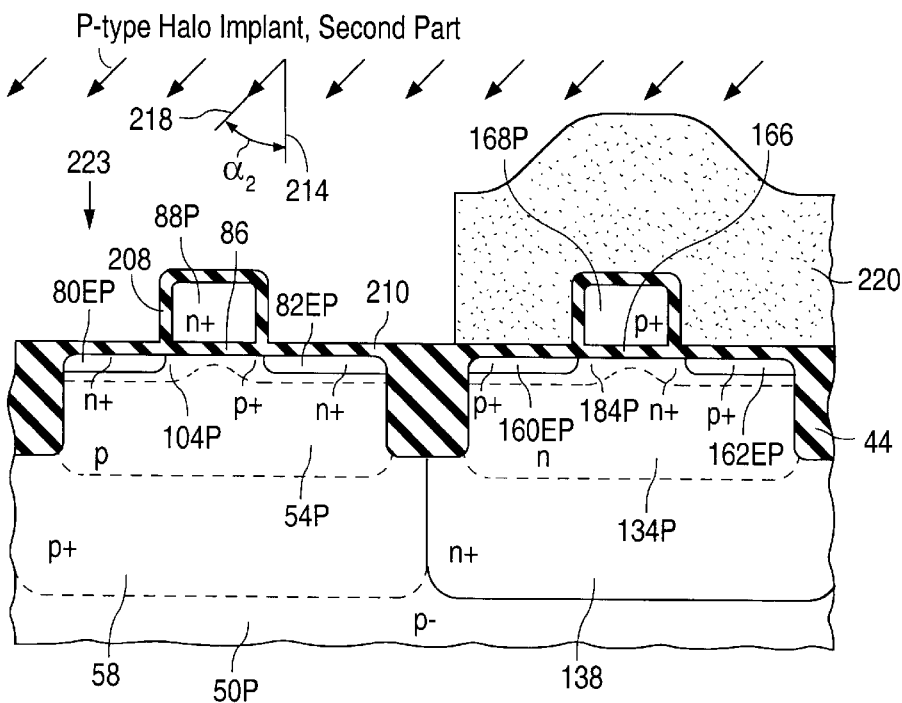

When the semiconductor structure is to contain symmetrical n-channel IGFET 112 (110), its channel-zone location is symmetrically halo doped during the p-type halo implantation. FIGS. 18a and 18b illustrate how the symmetrical p-type halo doping is accomplished for IGFET 112. Photoresist mask 220 has a mask opening 223 above the location for IGFET 112. Relationship 5 applies to distances $d_{SD1}$ and $d_{SD2}$ from the transverse mask sides defined by opening 223 to gate electrode structure 88P/208 for IGFET 112.

During the first part of the p-type halo implantation, ions of the p-type halo dopant species are directed toward photoresist mask 220 and opening 223 at tilt angle $\alpha_1$ and azimuthal angle $\beta_1$ along paths that originate higher than mask 220 and laterally beyond the left-hand transverse mask side defined by opening 223. FIG. 18a presents the situation for an arbitrary value of tilt angle $\alpha_1$ when azimuthal angle $\beta_1$ is 0°. An electrically significant amount of the ions passes close to the lower left-hand edge of gate electrode structure 88P/208 of IGFET 112 and enter upper body-material portion 54P to form a heavily doped p-type precursor halo pocket portion 106P.

A complementary action occurs during the second part of the p-type halo implantation. Ions of the p-type halo dopant species are directed toward photoresist mask 220 and opening 223 at tilt angle $\alpha_2$ and azimuthal angle $\beta_2$ along paths that originate higher than mask 220 and laterally beyond the right-hand transverse mask side defined by opening 223. FIG. 18b presents the situation for an arbitrary value of tilt angle $\alpha_2$ when azimuthal angle $\beta_2$ is 180°. An electrically significant amount of the ions passes close to the lower right-hand edge of gate electrode 88P to define a heavily doped p-type precursor halo pocket portion which merges with halo pocket 106P to form a heavily doped p-type precursor symmetrical halo pocket portion 104P.

Similar to what was presented above for symmetrical p-channel IGFET 196, the semiconductor structure can be provided with a symmetrical n-channel IGFET having no halo doping by applying relationship 6 to an opening provided through photoresist mask 220 for introducing the n-type source/drain extension dopant into the semiconductor body.

The semiconductor structure can be provided with asymmetrical and/or symmetrical n-channel IGFETs whose channel lengths extend in both the east-west and north-south directions by utilizing the principles presented above in connection with FIG. 14. In that case, the p-type halo dopant implantation includes two additional parts, referred to as the third and fourth parts.

The third part of the p-type halo dopant implantation entails directing ions of the p-type halo dopant species toward photoresist mask 220 and its mask openings at tilt angle $\alpha_3$ and azimuthal angle $\beta_3$ along paths that originate higher than mask 220 and typically beyond the semiconductor structure under fabrication. The fourth part of the p-type halo implantation similarly entails directing p-type halo dopant species ions toward$_S$ mask 220 and its mask openings at tilt angle $\alpha_4$ and azimuthal angle $\beta_4$ along paths that originate higher than mask 220 and typically beyond the semiconductor structure under fabrication. Angles $\alpha_3$, $\alpha_4$, $\beta_3$, and $\beta_4$ for the p-type halo implantation have largely the same value characteristics as prescribed above for the n-type halo implantation.

The total dosage of the p-type halo dopant species is normally $8\times10^{12}$–$1.5\times10^{13}$ ions/cm$^2$, typically $1\times10^{13}$ ions/cm$^2$, during the first and second parts of the p-type halo implantation. Half of this p-type halo dosage is preferably furnished during each of the first and second parts of parts of the p-type halo implantation. Each of tilt angles $\alpha_1$ and $\alpha_2$ is typically 40° for the p-type halo implantation. The same specifications apply to the third and fourth parts of the p-type halo implantation. With the p-type halo dopant consisting of boron in the form of boron difluoride, the implantation energy is typically 75 KeV. Photoresist mask 220 is removed after completing the p-type halo implantation.

The order for performing the two or four parts of the n-type halo implantation or the two or four parts of the p-type halo implantation is arbitrary and can be modified. Although each of the halo doping operations is described here as being performed in two or four parts respectively corresponding to two or four angular orientations, portions of any part of either halo doping operation can be respectively performed before and after part or all of at least one other part of that halo doping operation.

The n-type halo doping operation can be performed before the p-type source/drain extension doping operation. Photoresist mask 212 is then created before the n-type halo doping and removed after the p-type source/drain extension doping. Similarly, the p-type halo doping operation can be performed before the n-type source/drain extension doping operation. In this case, photoresist mask 220 is created before the p-type halo doping and removed after the n-type source/drain extension doping. In addition, the combination of the n-type source/drain extension doping, the p-type halo doping, and the formation/removal of mask 220 can be performed before the combination of the p-type source/drain extension doping, the n-type halo doping, and the formation/removal of mask 212.

After optionally performing an extended-time furnace anneal, dielectric spacer pair 90 and 92 (70 and 72) for IGFET 42 (40) and dielectric spacer pair 170 and 172 (150 and 152) for IGFET 122 (120) are provided respectively along the transverse sidewalls of precursor gate electrodes 88P (68P) and 168P (148P). See FIG. 11l. Each gate sidewall spacer 90, 92, 170, or 172 (70, 72, 150, or 152) typically consists of a main silicon nitride portion situated on a tetraethyl orthosilicate footer which overlies portions of layers 208 and 210. The portions of layers 210 and 208 not covered by gate sidewall spacers 90, 92, 170, and 172 (70, 72, 150, and 152) are partially, but not totally, removed. Items 222 and 224 in FIG. 11l respectively indicate the uncovered remainders of layers 210 and 208.

A photoresist mask 226 is formed on sidewall spacers 170 and 172 (150 and 152) and on the portions of dielectric layers 222 and 224 overlying active region 128 (126) as shown in FIG. 11m. N++ main source/drain portions 80M and 82M (60M and 62M) for n-channel IGFET 42 (40) are defined by ion implanting arsenic at a typical very heavy dosage of 7×10$^{15}$ ions/cm$^2$ and a typical implantation energy of 50 KeV through the uncovered portions of dielectric layer 222 and into upper body-material portion 54P (52P).

When n-type source/drain zones 80 and 82 (60 and 62) for IGFET 42 (40) are to have graded-junction characteristics, lower source/drain portions (not shown) more lightly doped than n++ main source/drain portions 80M and 82M (60M and 62M) are defined by ion implanting phosphorus at a typical heavy dosage of 3×10$^{13}$ ions/cm$^3$ and a typical implantation energy of 60 KeV into body-material portion 54P (52P). The material consisting of photoresist 226, field insulation 44, gate electrode 88P (68P), and spacers 90 and 92 (70 and 72) forms a shield that largely blocks the two n-type dopant species for main portions 80M and 82M (60M and 62M) and the lower source/drain portions from simultaneously passing through the upper semiconductor surface section directly underlying the shield.

Main source/drain portions 80M and 82M (60M and 62M) are doped much heavier than, and extend deeper into upper body-material portion 54P (52P) than, precursor source/drain extensions 80EP and 82EP (60EP and 62EP). Hence, the remainders of precursor extensions 80EP and 82EP (60EP and 62EP) now respectively constitute n+ source/drain extensions 80E and 82E (60E and 62E). Similarly, the p-type remainders of precursor body material 50P, precursor upper body-material portion 54P (52P), and precursor halo pocket 108P (102P) now respectively constitute p-type body material 50, p-type upper body-material portion 54 (52), and p+ asymmetrical halo pocket 108 (102). Also, precursor gate electrode 88P (68P) is now n++ gate electrode 88 (68).

After removing photoresist 226, a photoresist mask 228 is formed on sidewall spacers 90 and 92 (70 and 72) and on the portion of dielectric layers 222 and 224 overlying active region 48 (46). See FIG. 11n. P++ main source/drain portions 160M and 162M (140M and 142M) for p-channel IGFET 122 (120) are defined by ion implanting boron in the form of boron difluoride at a typical very heavy dosage of 5×10$^{15}$ ions/cm$^2$ and a typical implantation energy of 25 KeV through the uncovered portions of dielectric layer 222 and into upper body-material portion 134P (132P).

When source/drain zones 160 and 162 (140 and 142) of IGFET 122 (120) are to have graded-junction characteristics, lower source/drain portions (not shown) more lightly doped than p++ main source/drain portions 160M and 162M (140M and 142M) are defined by ion implanting elemental boron at a typical heavy dosage of 4×10$^{13}$ ions/cm$^2$ and a typical implantation energy of 25 KeV through the uncovered portions of dielectric layer 222 and into body-material portion 134P (132P). The material formed with photoresist 228, field insulation 44, precursor gate electrode 168P (148P), and spacers 170 and 172 (150 and 152) forms a shield that largely blocks the p-type source/drain dopants for main portions 160M and 162M (140M and 142M) and the lower source/drain portions from simultaneously passing through the upper semiconductor surface section directly underlying the shield.

Main source/drain portions 160M and 162M (140M and 142M) are doped much heavier than, and extend deeper into upper body-material portion 134P (132P) than, precursor source/drain extensions 160EP and 162EP (140EP and 142EP). Hence, the remainders of precursors extensions 160EP and 162EP (140EP and 142EP) now respectively constitute p+ source/drain extensions 160E and 162E (140E and 142E). Similarly, the n-type remainders of precursor upper body-material portion 134P (132P) and precursor extended halo pocket 186P now respectively constitute n-type upper body-material portion 134 (132) and n+ extended halo pocket 186 (180). Also, precursor gate electrode 168P (148P) is now p++ gate electrode 168 (148).

After removing photoresist 228, a capping layer (not shown) of dielectric material is formed on top of the structure. A final thermal anneal is performed to repair lattice damage and activate the implanted source/drain and halo dopants. The final anneal is of such a nature that, at the end of the anneal, gate electrode 88 (68) extends slightly over source/drain extensions 80E and 82E (160E and 162E), and gate electrode 168 (148) extends slightly over source/drain extensions 160E and 162E (140E and 142E). The final anneal is typically an RTA at 1075° C. for 12 sec. in a non-reactive environment, typically nitrogen. Although the above-mentioned halo and source/drain implantation steps define source/drain zones 80, 82, 160, and 162 (60, 62, 140, and 142) and halo pockets 108 and 186 (102 and 180), the final anneal completes the formation of these regions.

The thin layers of dielectric material, including dielectric layers 222 and 224, are removed along the upper semiconductor surface and along the top surfaces of gate electrodes 88 (68) and 168 (148). Metal silicide layers 94, 96, 98, 174, 176, and 178 (74, 76, 78, 154, 156, and 168) consisting of cobalt silicide are respectively formed along the upper surfaces of gate electrode 88 (68), main source/drain portions 80M and 82M (60M and 62M), gate electrode 168 (148), and main source/drain portions 160 and 162M (140 and 142M) as shown in FIG. 11o. In subsequent process operations (not illustrated in the drawings), an electrical interconnect system is formed on top of the structure.

Experimental Program

Asymmetrical and symmetrical IGFETs were fabricated from semiconductor wafers to experimentally examine various aspects of the invention. The numerical values for the process and device parameters utilized in manufacturing these IGFETs were based on process and device computer simulations performed with the DIOS-ISE (process) and DESSIS-ISE (device) simulators using their default process and material coefficients as appropriate. See (a) Strecker, *DIOS-ISE*, ISE TCAD Manuals, Release 5, Vol. 3, Integrated Systems Engineering, 1997, and (b) Escoffier et al, *DESSIS-ISE*, ISE TCAD Manuals, Release 5, Vol. 5, Integrated Systems Engineering, 1997.

As used below in connection with an IGFET, the term "drawn channel length" means the value of the length of the IGFET's gate electrode as drawn on the mask used to define the gate electrode. The drawn channel length, represented by symbol $L_{DR}$, invariably differs from both the actual gate length and actual channel length L. However, drawn channel length $L_{DR}$ is a very useful experimental parameter because actual channel length L is generally difficult to measure precisely.

Figure 19:
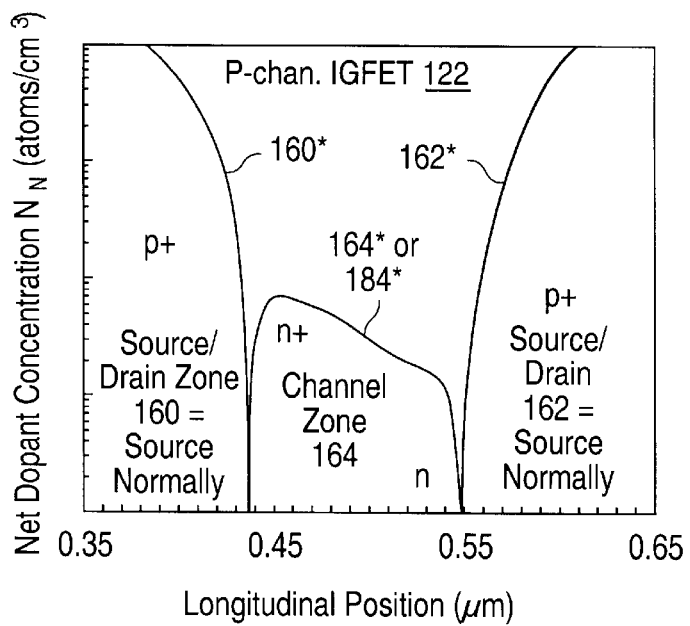
FIG. 19 is an exemplary graph of net dopant concentration along the upper semiconductor surface as a function of longitudinal position for a computer simulation of an asymmetrical p-channel IGFET manufacturable according to the invention.

FIG. 19 presents a computer simulation of the net dopant concentration along the upper semiconductor surface for an implementation of short asymmetrical p-channel IGFET 122 manufactured in accordance with the fabrication process of FIG. 11 to have a channel length of approximately 0.15 μm. For the simulation of FIG. 19, the n-type halo dopant was arsenic. Each of tilt angles $\alpha_1$ and $\alpha_2$ was 450. Azimuthal angles $\beta_1$ and $\beta_2$ respectively were 33° and 213°. Curve segments 160*, 162*, 164*, and 186* respectively represent the net surface dopant concentrations of components 160, 162, 164, and 186.

For the simulation of FIG. 19, the net dopant concentration of asymmetrical channel zone 164 reaches a local surface maximum close to source/drain zone 160 as indicated by curve segment 164* or 186*. The net surface dopant concentration drops progressively in moving from the location of the local surface maximum to source/drain zone 162. Source/drain zone 160 normally serves permanently as the source, while source/drain zone 162 normally serves permanently as the drain.

A parameter that characterizes the performance of an enhancement-mode IGFET is the ratio of drive current to leakage current. In terms of current densities, this ratio equals $I_{ON}/I_{OFF}$, where $I_{ON}$ is the drive (on) current per unit drain width, and $I_{OFF}$ is the leakage (off) current per unit drain width. Drive current density $I_{ON}$ is the drain current density when the IGFET is turned fully on with gate-to-source voltage $V_{GS}$ equal to drain-to-source $V_{DS}$ and with drain voltage $V_D$ at drain supply voltage $V_{DD}$. Leakage current density $I_{OFF}$ is the drain current density when the IGFET is turned off with gate-to-source voltage $V_{GS}$ set at zero and with drain voltage $V_D$ at drain supply voltage $V_{DD}$.

Increasing the magnitude of drive current density $I_{ON}$ enables an enhancement-mode IGFET to switch faster. Decreasing the magnitude of leakage current density $I_{OFF}$ leads to less standby power consumption. Hence, increasing ratio $I_{ON}/I_{OFF}$ is normally desirable.

The current-voltage ("I-V") performance of the simulated implementation of p-channel IGFET 122 having the surface dopant profile of FIG. 19 was examined in two modes: (a) a normal mode in which source/drain zones 160 and 162 are operated in the normal manner respectively as source and drain and (b) a reverse mode in which zones 160 and 162 are operated respectively as drain and source. In the normal mode, halo pocket 186 is situated primarily along the source. Accordingly, the term "halo-source" is utilized to identify the normal mode. The term "halo-drain" is employed to identify the reverse mode in which halo pocket 186 is situated primarily along the drain.

Figure 20:
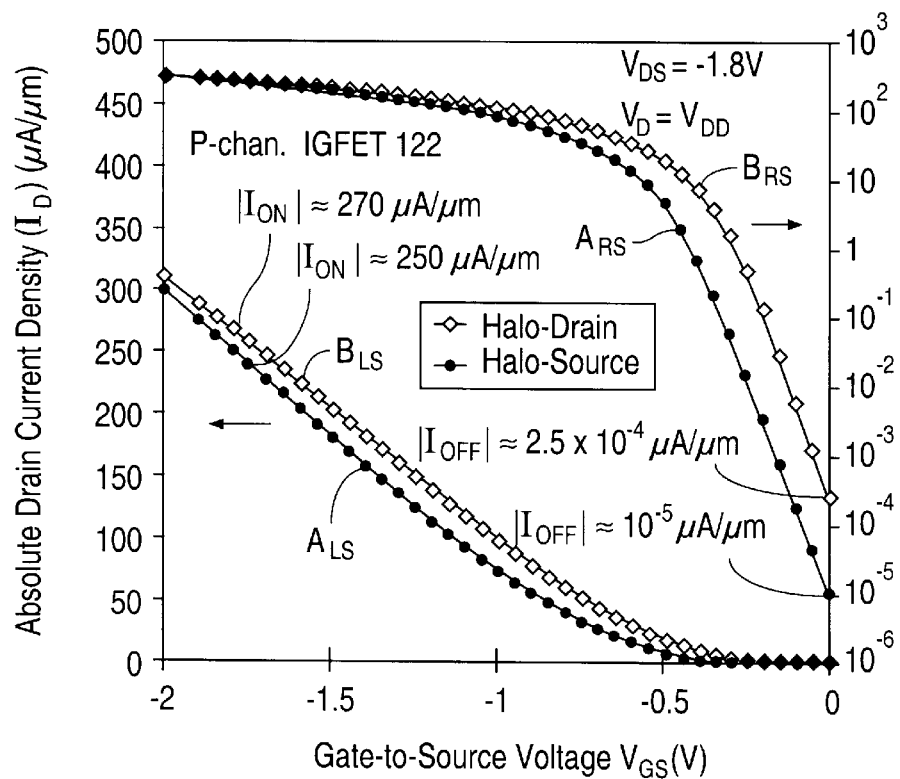
FIG. 20 is an exemplary graph of absolute drain current density as a function of gate-to-source voltage for a computer simulation of the asymmetrical p-channel IGFET having the surface dopant profile of FIG. 19.

The results of the I-V simulation are presented in FIG. 20 which illustrates how the absolute value (magnitude) of the drain current density $I_D$ varied with gate-to-source voltage $V_{GS}$ for the normal and reverse modes. Drain-to-source voltage $V_{DS}$ was $-1.8$ V with drain voltage $V_D$ set at $V_{DD}$ (also $-1.8$ V) in the I-V simulation of FIG. 20. Drain current density $I_D$ is the drain current per unit channel width. Curves $A_{LS}$ and $A_{RS}$ in FIG. 20 present the simulated I-V performance for the normal (halo-source) mode. Curves $B_{LS}$ and $B_{RS}$ present the simulated I-V performance for the reverse (halo-drain) mode.

The $I_D$ information along the vertical axis in FIG. 20 is presented at two scales, a linear scale to the left and a logarithmic scale to the right. Curves $A_{LS}$ and $B_{LS}$ respectively illustrate the simulated I-V performance for the normal and reverse modes at the left-hand linear $I_D$ scale. Curves $A_{RS}$ and $B_{RS}$ respectively illustrate the simulated I-V performance for the normal and reverse modes at the right-hand logarithmic $I_D$ scale.

As indicated by curves $A_{LS}$ and $B_{LS}$ in FIG. 20, the values of drive current density $I_{ON}$ were comparable when the simulated implementation of p-channel IGFET 122 was operated in the normal and reverse modes. Drive current density $I_{ON}$ was approximately 250 μA/μm for the normal mode and just slightly higher, approximately 270 μA/μm, for the reverse mode. On the other hand, curves $A_{RS}$ and $B_{RS}$ show that leakage current density $I_{OFF}$ for the simulation of IGFET 122 was approximately an order of magnitude higher in the reverse mode than in the normal mode. The net result is that ratio $I_{ON}/I_{OFF}$ for the simulated IGFET was approximately an order of magnitude greater in the normal mode than in the reverse mode.

Figure 21:
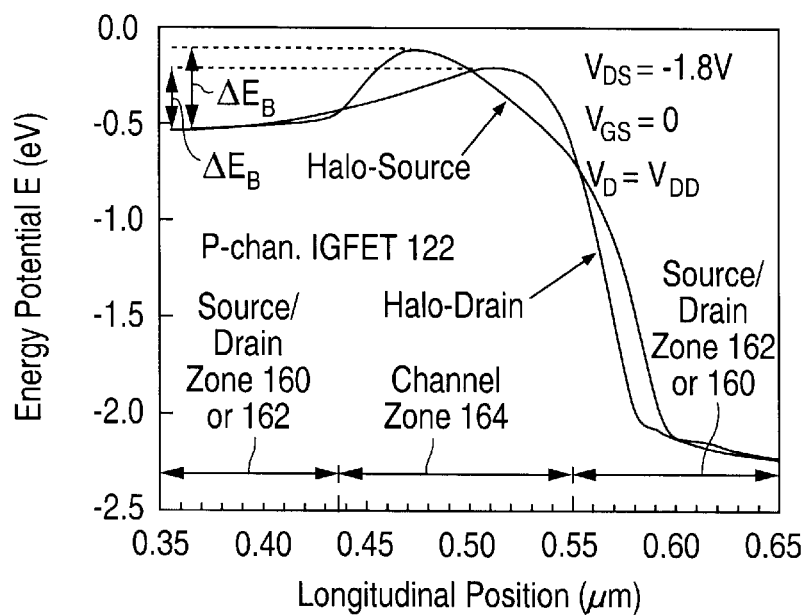
FIG. 21 is an exemplary graph of surface energy as a function of longitudinal position for a computer simulation of the asymmetrical p-channel IGFET having the surface dopant profile of FIG. 19.

One reason for the $I_{OFF}$ difference between the normal and reverse modes can be understood with the assistance of FIG. 21 which illustrates how the energy E varied along the upper semiconductor surface at the $I_{OFF}$ condition (gate-to-source voltage $V_{GS}$ set at zero with drain voltage $V_D$ being $V_{DD}$) for the implementation of p-channel IGFET 122 having the surface dopant profile of FIG. 19. Surface energy E is presented in FIG. 21 at a $V_{DS}$ value of $-1.8$ V. As FIG. 21 shows, the surface energy barrier $\Delta E_B$ that holes must overcome to travel from the source to the drain at the $I_{OFF}$ condition is less for the reverse (halo-drain) mode than for the normal (halo-source) mode. Consequently, leakage current density $I_{OFF}$ is greater for the reverse mode than for the normal mode.

The computer-simulated I-V performance of the implementation of asymmetrical short p-channel IGFET 122 having the surface dopant profile of FIG. 19 was compared to the computer-simulated I-V performance of a corresponding implementation of symmetrical short-channel IGFET 192 manufactured in accordance with the process of FIG. 11 to have the same doping/dimensional characteristics as the simulation of IGFET 122 except that the simulation of IGFET 192 had symmetrical halo doping, the dosage of which was reduced so that the two simulated IGFETs had substantially the same threshold voltage. The results of the comparison are presented in FIG. 22 which illustrates how the absolute value of drain current density $I_D$ varied with gate-to-source voltage $V_{GS}$ for the two simulated IGFET implementations. For the simulations of FIG. 22, drain-to-source voltage $V_{DS}$ was again $-1.8$ V with drain voltage $V_D$ being $V_{DD}$.

Figure 22:
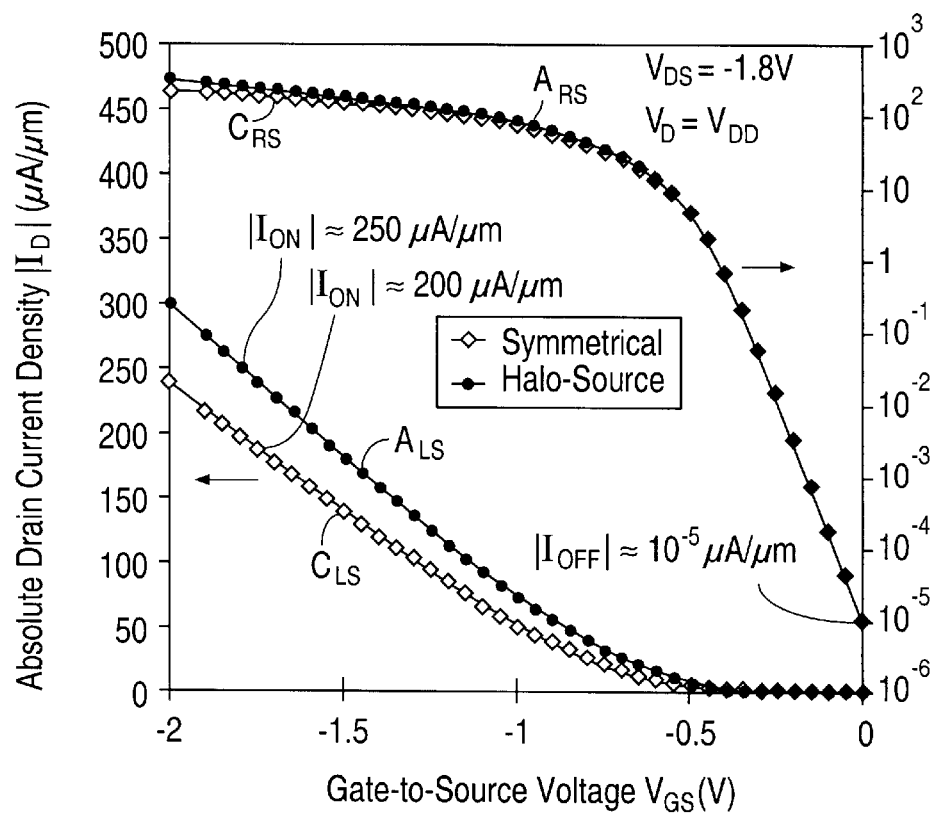
FIG. 22 is an exemplary graph of absolute drain current density as a function of gate-to-source voltage for a computer simulation of (a) the asymmetrical p-channel IGFET having the surface dopant profile of FIG. 19 and (b) a generally comparable symmetrical halo-doped p-channel IGFET.

Curves $A_{LS}$ and $A_{RS}$, which respectively repeat curves $A_{LS}$ and $A_{RS}$ in FIG. 20, again present the simulated I-V performance for the implementation of asymmetrical IGFET 122 having the surface dopant profile of FIG. 19. Curves $C_{LS}$ and $C_{RS}$ in FIG. 22 present the simulated I-V performance for the indicated implementation of symmetrical IGFET 192. As in FIG. 20, the $I_D$ information along the vertical axis in FIG. 22 is presented at both a linear scale and a logarithmic scale. Curves $A_{LS}$ and $C_{LS}$ illustrate the simulated I-V performance at the left-hand linear scale. Curves $A_{RS}$ and $C_{RS}$ illustrate the simulated I-V performance at the right-hand logarithmic scale.

As FIG. 22 shows, the magnitudes of leakage current density $I_{OFF}$ were substantially the same, approximately $1\times10^{-5}$ μA/μm, for the two IGFET implementations. However, the $I_{ON}$ magnitude for the implementation of asymmetrical IGFET 122 was significantly higher than the $I_{ON}$ magnitude for the implementation of symmetrical IGFET 192. In particular, the magnitude of drive current density $I_{ON}$ for the implementation of asymmetrical IGFET 122 was approximately 250 μA/μm. The magnitude of drive current density $I_{ON}$ for the corresponding implementation of symmetrical IGFET 192 was approximately 200 μA/μm. Consequently, the asymmetrical IGFET implementation achieved approximately a 25% higher magnitude in drive current density $I_{ON}$. Since the $I_{OFF}$ magnitudes were approximately the same for the two IGFET implementations, ratio $I_{ON}/I_{OFF}$ was approximately 25% higher for the implementation of asymmetrical IGFET 122 than for the otherwise comparable implementation of symmetrical IGFET 192. In short, the simulation indicated that the asymmetrical IGFET should be able to switch fast relative to the symmetrical IGFET without requiring additional standby power.

Halo implants were applied to complementary-IGFET wafers in accordance with the invention to produce both asymmetrical and symmetrical IGFETs during the experimental program. The wafers were processed according to the fabrication method of FIG. 11 but without graded-junction characteristics. By using the mask-shadowing technique of the invention, approximately one half of the total halo dosage provided to the symmetrical IGFETs was blocked from entering the corresponding asymmetrical IGFETs.

Each wafer was laid out so that the channel-length directions of the n-channel and p-channel IGFETs whose parameters were measured during the experimental program extended parallel to one another. The halo implants, both n-type and p-type, were performed at azimuthal angles $\beta_1$, $\beta_3$, $\beta_2$, and $\beta_4$ respectively of approximately 33°, 123°, 213°, and 303° to a reference line extending in the direction of the channel lengths of these IGFETs. Each wafer also included n-channel and p-channel IGFETs whose channel-length directions extended perpendicular to the channel-length directions of the IGFETs whose parameters were measured. Although all of the wafers were processed to create both n-channel and p-channel IGFETs, the experimental discussion below deals solely with the p-channel IGFETs.

Except as otherwise indicated, each of the data points on an experimental curve described below represents the average of multiple measurements. For example, each experimentally measured value of threshold voltage $V_T$ at a given value of drawn channel length $L_{DR}$ for a particular $V_T(L_{DR})$ curve is the average of multiple values of threshold voltage $V_T$ at the given $L_{DR}$ value.

Figure 23:
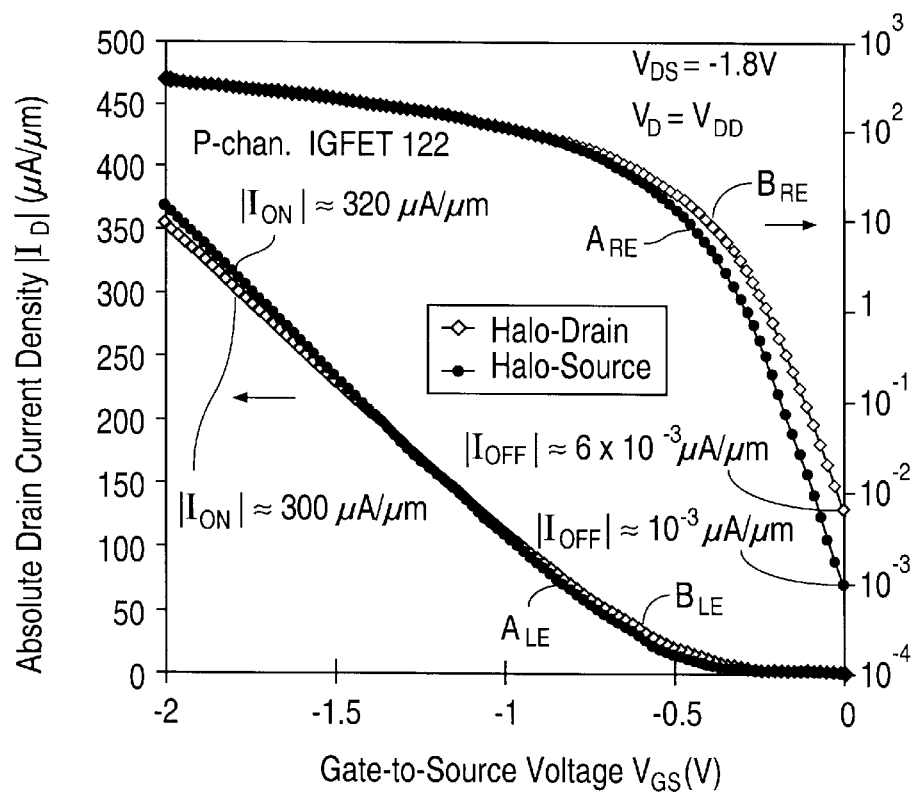
FIG. 23 is an experimental graph of absolute drain current density as a function of gate-to-source voltage for an asymmetrical p-channel IGFET manufactured according to the invention.

The I-V characteristics of an asymmetrical p-channel IGFET which implemented IGFET 122 were examined in both the normal (halo-source) and reverse (halo-drain) modes described above for the computer simulations. FIG. 23 depicts how the absolute value of drain current density $I_D$ experimentally varied with gate-to-source $V_{GS}$ when the asymmetrical p-channel IGFET was operated in the normal and reverse modes. As in the computer simulation, gate-to-drain voltage $V_{DS}$ was −1.8 V with drain voltage $V_D$ being $V_{DD}$ (again, −1.8 V). Curves $AL_E$ and $A_{RE}$ in FIG. 23 present the experimentally measured I-V performance for the normal mode. Curves $B_{LE}$ and $B_{RE}$ present the experimentally measured I-V performance for the reverse mode.

As with FIG. 20, the $I_D$ information along the vertical axis in FIG. 23 is presented at a linear scale to the left and at a logarithmic scale to the right. Curves $A_{LE}$ and $B_{LE}$ respectively illustrate the I-V performance for the normal and reverse modes at the left-hand linear $I_D$ scale. Curves $A_{RE}$ and $B_{RE}$ respectively illustrate the I-V performance for the normal and reverse modes at the right-hand logarithmic scale.

Curves $A_{LE}$ and $B_{LE}$ in FIG. 23 show that the magnitudes of drive current density $I_{ON}$ were comparable when the actual implementation of p-channel IGFET 122 was operated in the normal and reverse modes. The magnitude of drive current density $I_{ON}$ was approximately 320 µA/µm for the normal mode and slightly lower, approximately 300 µA/µm, for the reverse mode. Both of these experimental $I_{ON}$ magnitudes are higher than the corresponding computer-simulated $I_{ON}$ magnitudes of FIG. 20.

As indicated by curves $A_{RE}$ and $B_{RE}$ in FIG. 23, the magnitude of leakage current density $I_{OFF}$ for the reverse mode was nearly an order of magnitude greater than the magnitude of leakage current density $I_{OFF}$ for the normal mode. Although the actual $I_{OFF}$ magnitudes were somewhat greater than the computer simulated $I_{OFF}$ magnitudes, the experimental $I_{OFF}$ values generally confirm the overall computer simulation. Similar to what the computer simulation predicted, ratio $I_{ON}/I_{OFF}$ was nearly an order of magnitude greater for the actual implementation of p-channel IGFET 122 in the normal mode than in the reverse mode.

Figure 24:
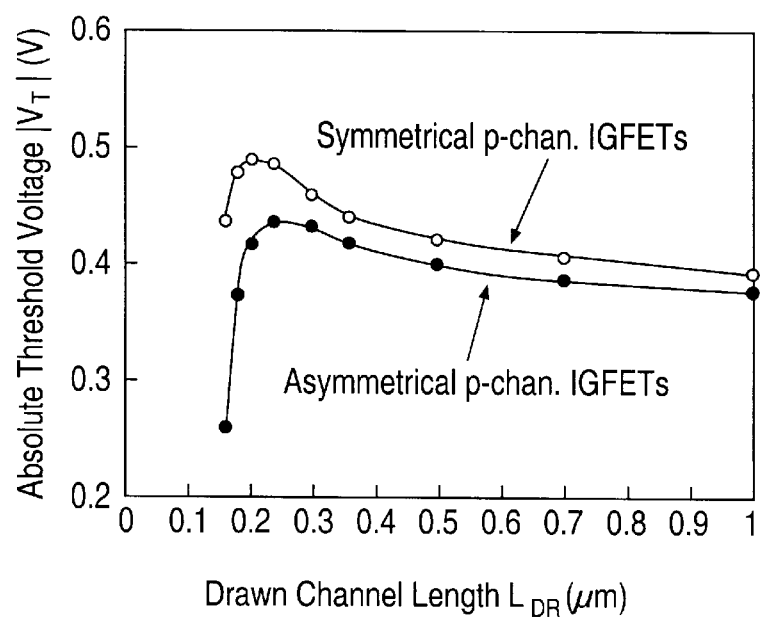
FIG. 24 is an experimental graph of absolute threshold voltage as a function of drawn channel length for asymmetrical and symmetrical p-channel IGFETs manufactured according to the invention.

FIG. 24 illustrates how the absolute value of threshold voltage $V_T$ experimentally varied with drawn channel length $L_{DR}$ for asymmetrical and symmetrical p-channel IGFETs manufactured according to the invention. Because the symmetrical p-channel IGFETs received approximately twice the total n-type halo dosage as the asymmetrical p-channel IGFETs, the average net dopant concentration along the upper semiconductor surface was greater in the channel zones of the symmetrical p-channel IGFETs than in the channel zones of the asymmetrical p-channel IGFETs. As a result, the $V_T$ magnitude at any given value of drawn channel length $L_{DR}$ was greater for the symmetrical p-channel IGFETs than for the asymmetrical p-channel IGFETs.

Aside from the $V_T$ difference, FIG. 24 shows that the undesirable short-channel effect of threshold voltage roll-off was alleviated nearly as much in the asymmetrical p-channel IGFETs as in the symmetrical p-channel IGFETs. Specifically, roll-off of threshold voltage was shifted to significantly lower channel length generally in accordance with the principles described in Bulucea et al, U.S. patent application Ser. No. 09/540,442, cited above.

Figure 25:
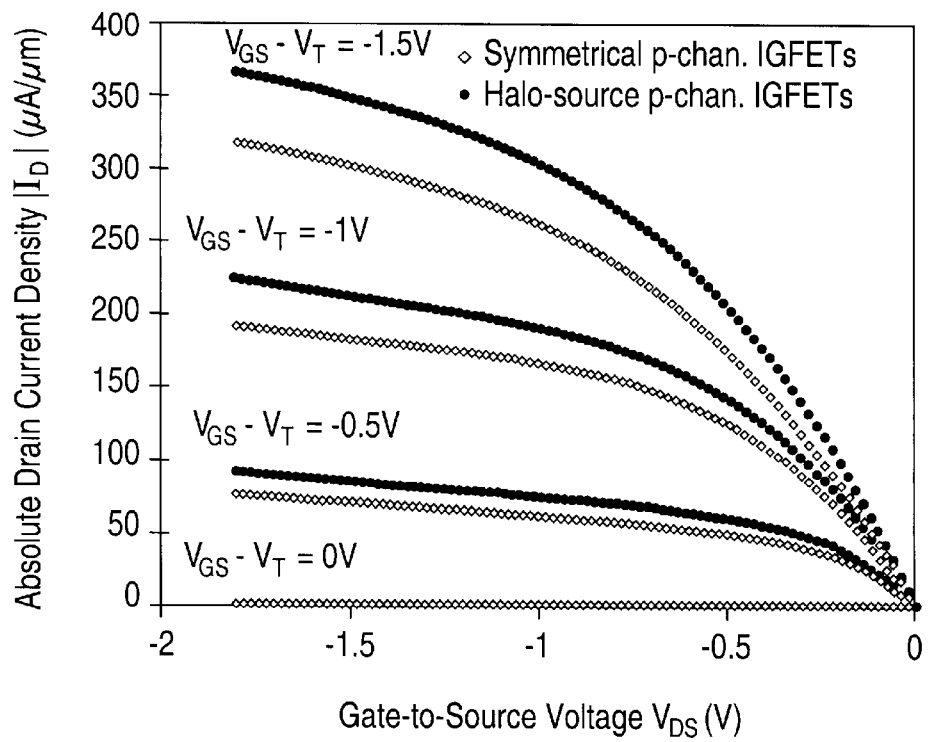
FIG. 25 is an experimental graph of absolute drain current density as a function of drain-to-source voltage at various values of the difference between the gate-to-source and threshold voltages for an asymmetrical p-channel IGFET and a comparable symmetrical p-channel IGFET manufactured according to the invention.

The experimental I-V performance of an asymmetrical p-channel IGFET was compared to the experimental I-V performance of a comparable symmetrical p-channel IGFET. The results of the comparison are presented in FIG. 25 which illustrates how the absolute value of drain current density $I_D$ varied as a function of drain-to-source voltage $V_{DS}$ at various magnitudes of gate overdrive voltage difference $V_{GS}-V_T$. The asymmetrical p-channel IGFET was operated in its normal (halo-source) mode. As FIG. 25 shows, the asymmetrical p-channel IGFET exhibited a greater magnitude of drain current density $I_D$ than the symmetrical p-channel IGFET at any negative value of gate overdrive difference $V_{GS}-V_T$. Hence, the asymmetrical p-channel IGFET had better I-V performance than its symmetrical p-channel counterpart.

Figure 26:
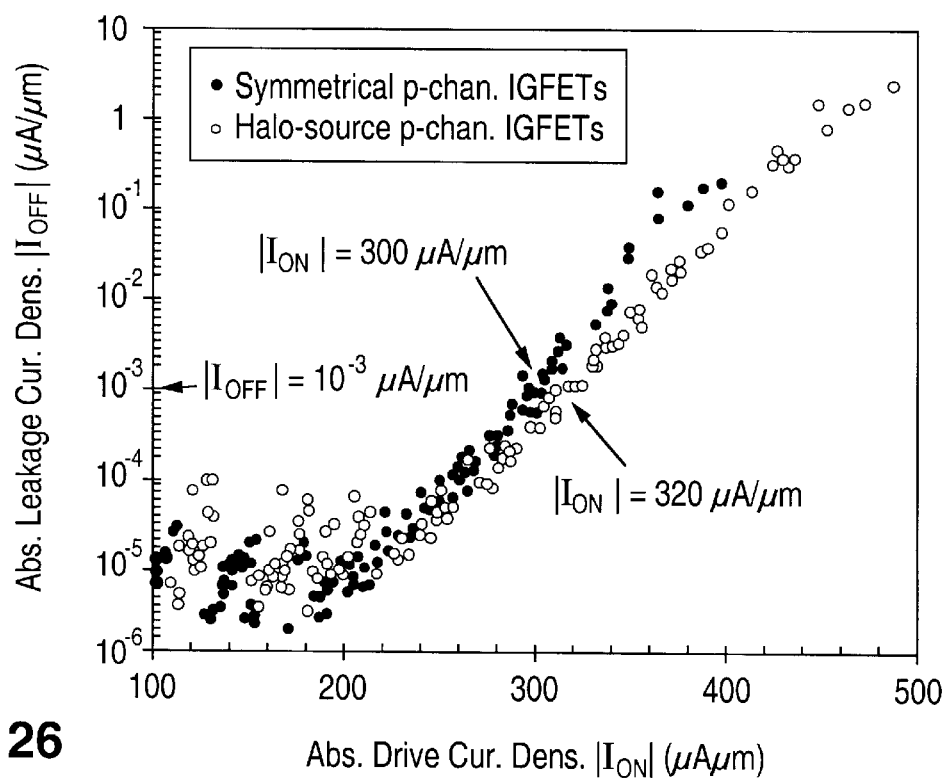
FIG. 26 is an experimental graph of absolute leakage current density as a function of absolute drive current density for asymmetrical and symmetrical p-channel IGFETs manufactured according to the invention.

FIG. 26 illustrates how the absolute value of leakage current density $I_{OFF}$ experimentally varied with the absolute value of drive current density $I_{ON}$ for asymmetrical (halo-source) and symmetrical p-channel IGFETs. At a nominal $I_{OFF}$ magnitude of $10^{-3}$ µA/µm, the magnitude of drive current density $I_{ON}$ was significantly higher for the asymmetrical p-channel IGFETs than for the symmetrical p-channel IGFETs. In particular, the $I_{ON}$ magnitude for the symmetrical p-channel IGFETs was approximately 300 µA/µm at the nominal $I_{OFF}$ value. The $I_{ON}$ magnitude for the asymmetrical p-channel IGFETs was approximately 320 µA/µm at the nominal $I_{OFF}$ value and thus was approximately 7% greater than the corresponding $I_{ON}$ value for the symmetrical p-channel IGFETs. In short, the asymmetrical IGFETs of the invention demonstrated notable improvement over their symmetrical counterparts.

Variations

While the invention has been described with reference to particular embodiments, this description is solely for the purpose of illustration and is not to be construed as limiting the scope of the invention claim below. For example, a source/drain extension more lightly doped than the main portions of the source/drain zones in the present asymmetrical IGFETs may be provided only along the main source/drain portion that normally functions permanently as the drain.

Photoresist masks 212 and 220 utilized during the halo doping operations may be replaced with masks consisting of actinic (radiation-sensitive) material, e.g., electron-sensitive or ion-sensitive material, other than photoresist. Even further, masks 212 and 220 can be replaced with hard masking (non-actinic) material which is suitably patterned, e.g., by using photolithography.

When the present semiconductor structure contains like-polarity IGFETs whose channel lengths extend approximately perpendicular to each other and when the halo implantation for these IGFETs is conducted in four parts at azimuthal angles that respectively differ from 0°, 90°, 180°, and 270° relative to a reference line extending in the longitudinal direction of one of the IGFETs, the angled ion implantation at each consecutive pair of azimuthal angles typically at least partially overcomes transverse halo asymmetry that would otherwise result from utilizing only two opposite ones of the azimuthal angles. In such a case, preferred values for the azimuthal angles may be 45°, 135°, 225°, and 315°.

The fabrication process of the invention can be combined with one or more other process modules to produce semiconductor structures having gate dielectric layers of two or more significantly different thicknesses. Taking note that the fabrication process of FIG. 11 at a typical gate dielectric thickness of 4 nm forms a low-voltage process module, a high-voltage process module at a greater typical gate dielectric thickness, e.g., 7 nm, can be combined with the fabrication process of FIG. 11 at the typical gate dielectric thickness of 4 nm. Various modifications and applications may thus be made by those skilled in the art without departing from the true scope and spirit of the invention as defined in the appended claims.

We claim:

1. A method comprising the steps of:
   furnishing a gate electrode generally above, and vertically separated by gate dielectric material from, an intended channel-zone location in a semiconductor body along its upper surface;
   providing a mask over the semiconductor body and the gate electrode such that the mask has a mask opening which at least partially overlies the gate electrode and which defines opposite first and second transverse mask sides located laterally beyond the gate electrode and any material situated on opposite transverse sides of the gate electrode;
   performing one of (a) directing first ions of a species of a primary semiconductor dopant toward the mask and mask opening at a first average tilt angle of at least 15° along paths that originate laterally beyond the first transverse mask side such that an electrically significant amount of the first ions passes through the mask opening and enters the channel-zone location and (b) directing second ions of the species of the primary dopant toward the mask and mask opening at a second average tilt angle of at least 15° along paths that originate laterally beyond the second transverse mask side such that the mask, the gate electrode, and any material along the gate electrode substantially block any electrically significant amount of the second ions from entering the channel-zone location, the tilt angles being measured from a perpendicular to a plane extending generally along the body's upper surface; and
   performing the other of the directing steps.

2. A method as in claim 1 wherein the channel-zone location and the primary dopant are of the same conductivity type.

3. A method as in claim 1 wherein the gate electrode and any material situated on the gate electrode's transverse sides are further away from the first transverse mask side than from the second transverse mask side.

4. A method as in claim 1 wherein the tilt angles are within 10° of each other.

5. A method as in claim 1 wherein the tilt angles are approximately equal.

6. A method as in claim 1 wherein each of the tilt angles is at least 25°.

7. A method as in claim 1 wherein:
   the paths of the first ions are roughly parallel; and
   the paths of the second ions are roughly parallel and at a non-zero angle to the paths of the first ions.

8. A method as in claim 1 wherein:
   the first ions impinge on the mask generally parallel to a first principal impingement axis;
   the second ions impinge on the mask generally parallel to a second principal impingement axis different from the first principal impingement axis.

9. A method as in claim 8 wherein:
   each principal axis is at an azimuthal angle, as measured in the plane extending along the body's upper surface, to a channel-length direction for the channel-zone location;
   the azimuthal angle for the first principal axis differs from 0° by no more than 60°; and
   the azimuthal angle for the second principal axis differs from 180° by no more than 60°.

10. A method as in claim 9 wherein:
    the azimuthal angle for the first principal axis differs from 0° by no more than 45°; and
    the azimuthal angle for the second principal axis differs from 180° by no more than 45°.

11. A method as in claim 9 wherein the principal axes cross each other at an axial angle approximately equal to the sum of the first and second tilt angles.

12. A method as in claim 1 wherein the channel-zone location and the primary dopant are of a first conductivity type, the method further including the step of introducing first semiconductor dopant of a second conductivity type opposite to the first conductivity type through the mask opening, past the gate electrode, and into the semiconductor body to at least partially define a pair of laterally separated source/drain zones using the mask, the gate electrode, and any material along the gate electrode as a dopant-blocking shield.

13. A method as in claim 12 further including, subsequent to substantially removing the mask, the steps of:
    providing spacer material over the gate electrode's transverse sides;
    providing a further mask over the semiconductor body, gate electrode, and spacer material such that the further mask has a further mask opening which at least partially overlies the gate electrode and spacer material and which extends laterally beyond the gate electrode and spacer material; and
    introducing second semiconductor dopant of the second conductivity type through the further mask opening, past the gate electrode and spacer material, and into the semiconductor body to further define the source/drain zones using the further mask, the gate electrode, and the spacer material as a dopant-blocking shield.

14. A method as in claim 13 wherein the semiconductor body and the gate electrode comprise silicon, the method further including the step of forming metal silicide layers along the gate electrode and source/drain zones.

15. A method as in claim 1 wherein the step of directing the second ions includes introducing the second ions into the semiconductor body at a location spaced apart from the channel-zone location.

16. A method as in claim 1 wherein the mask comprises actinic material.

17. A method comprising the steps of:
furnishing primary and additional gate electrodes for respective primary and additional like-polarity field-effect transistors above, and vertically separated by gate dielectric material from, respective laterally separated primary and additional intended channel-zone locations in a semiconductor body along its upper surface;
providing a mask over the semiconductor body and the gate electrodes such that the mask has at least one mask opening which at least partially overlies the gate electrodes, which defines opposite first and second primary transverse mask sides located laterally beyond the primary gate electrode and any material situated on opposite transverse sides of the primary gate electrode, and which defines opposite first and second additional transverse mask sides located laterally beyond the gate electrode and any material situated on opposite transverse sides of the additional gate electrode; and
directing first ions of a species of a primary semiconductor dopant toward the mask and each mask opening at a first average tilt angle of at least 15° along paths that originate laterally beyond the two first transverse mask sides such that an electrically significant amount of the first ions passes through one such mask opening and enters the primary channel-zone location and such that the mask, the additional gate electrode, and any material situated along the additional gate electrode substantially block any electrically significant amount of the first ions from entering the additional channel-zone location, the first tilt angle being measured from a perpendicular to a plane extending generally along the semiconductor body's upper surface.

18. A method as in claim 17 wherein the channel-zone locations and the primary dopant are of the same conductivity type.

19. A method as in claim 17 further including the step of directing second ions of the species of the primary dopant toward the mask and each mask opening at a second average tilt angle of at least 15° along paths that originate laterally beyond the two second transverse mask sides such that the mask, the primary gate electrode, and any material along the primary gate electrode substantially block any electrically significant amount of the second ions from entering the primary channel-zone location and such that an electrically significant amount of the second ions passes through one such mask opening and enters the additional channel-zone location, the second tilt angle being measured from a perpendicular to a plane extending generally along the body's upper surface.

20. A method as in claim 19 wherein:
the primary gate electrode and any material situated on the primary gate electrode's transverse sides are further away from the first primary transverse mask side than from the second primary transverse mask side; and
the additional gate electrode and any material situated on the additional gate electrode's transverse sides are further away from the second additional transverse mask side than from the first additional transverse mask side.

21. A method as in claim 19 wherein the tilt angles are within 10° of each other.

22. A method as in claim 19 wherein the tilt angles are approximately equal.

23. A method as in claim 19 wherein:
the paths of the first ions are roughly parallel; and
the paths of the second ions are roughly parallel and at a non-zero angle to the paths of the first ions.

24. A method as in claim 19 wherein:
the first ions impinge on the mask generally parallel to a first principal impingement axis; and
the second ions impinge on the mask generally parallel to a second principal impingement axis different from the first principal axis.

25. A method as in claim 24 wherein:
the channel-zone locations both extend longitudinally in largely a single channel-length direction;
each principal axis is at an azimuthal angle, as measured in a plane extending generally along the body's upper surface, to the channel-length direction;
the azimuthal angle for the first principal axis differs from 0° by no more than 60°; and
the azimuthal angle for the second principal axis differs from 180° by no more than 60°.

26. A method as in claim 17 further including the step of directing second ions of the species of the primary dopant toward the mask and each mask opening at a second average tilt angle of at least 15° along paths that originate laterally beyond the two second transverse mask sides such that an electrically significant amount of the second ions passes through at least one such mask opening and enters each channel-zone location, the second tilt angle being measured from a perpendicular to a plane extending generally along the body's upper surface.

27. A method as in claim 17 further including the step of directing ions of the species of the primary dopant toward the mask and each mask opening at a second average tilt angle of at least 15° along paths that originate laterally beyond the two second transverse mask sides such that the mask, the gate electrodes, and any material along the gate electrodes substantially block any electrically significant amount of the second ions from entering either channel-zone location, the second tilt angle being measured from a perpendicular to a plane extending generally along the body's upper surface.

28. A method as in claim 27 wherein the step of directing the second ions includes introducing the second ions into the semiconductor body at a location spaced apart from both channel-zone locations.

29. A method as in claim 17 wherein the at least one mask opening comprises a pair of laterally separated mask openings, each at least partially overlying a different one of the gate electrodes and extending laterally beyond that gate electrode and any material situated on that gate electrode's transverse sides.

30. A method as in claim 17 wherein the channel-zone locations and the primary dopant are of a first conductivity type, the method further including the step of introducing first semiconductor dopant of a second conductivity type opposite to the first conductivity type through at least one such mask opening, past the gate electrodes' transverse sides, and into the semiconductor body to at least partially define a pair of laterally separate source/drain zones of each transistor using the mask, the gate electrodes, and any material along the gate electrodes as a dopant-blocking shield.

31. A method as in claim 30 further including, subsequent to removing the mask, the steps of:

providing spacer material over the gate electrodes' transverse sides;

providing a further mask over the semiconductor body and the gate electrodes such that the further mask has at least one further mask opening which at least partially overlies the gate electrodes and spacer material and which extends laterally beyond the gate electrodes and spacer material; and introducing second semiconductor dopant of the second conductivity type through the at least one further mask opening, past the spacer material, and into the semiconductor body to further define the source/drain zones of each transistor using the further mask, the gate electrodes, and the spacer material as a dopant-blocking shield.

32. A method as in claim 17 wherein:

the primary gate electrode and any material situated on the primary gate electrode's transverse sides is further away from the first primary transverse mask side than from the second primary transverse mask side; and the additional gate electrode and any material situated on the additional gate electrode's transverse sides is farther away from the second additional transverse mask side than from the first additional transverse mask side.

33. A method as in claim 19 wherein the at least one mask opening comprises a pair of laterally separated mask openings, each at least partially overlying a different one of the gate electrodes and extending laterally beyond that gate electrode and any material situated on that gate electrode's transverse sides.

34. A method as in claim 19 wherein the channel-zone locations and the primary dopant are of a first conductivity type, the method further including the step of introducing first semiconductor dopant of a second conductivity type opposite to the first conductivity type through at least one such mask opening, past the gate electrodes' transverse sides, and into the semiconductor body to at least partially define a pair of laterally separate source/drain zones of each transistor using the mask, the gate electrodes, and any material along the gate electrodes as a dopant-blocking shield.

35. A method as in claim 34 further including, subsequent to removing the mask, the steps of:

providing spacer material over the gate electrodes' transverse sides;

providing a further mask over the semiconductor body and the gate electrodes such that the further mask has at least one further mask opening which at least partially overlies the gate electrodes and spacer material and which extends laterally beyond the gate electrodes and spacer material; and introducing second semiconductor dopant of the second conductivity type through the at least one further mask opening, past the spacer material, and into the semiconductor body to further define the source/drain zones of each transistor using the further mask, the gate electrodes, and the spacer material as a dopant-blocking shield.

36. A method as in claim 34 wherein the at least one mask opening comprises a pair of laterally separated mask openings, each at least partially overlying a different one of the gate electrodes and extending laterally beyond that gate electrode and any material situated on that gate electrode's transverse sides.

37. A method comprising the steps of:

furnishing primary and additional gate electrodes for respective primary and additional like-polarity field-effect transistors above, and vertically separated by gate dielectric material from, respective laterally separated primary and additional intended channel-zone locations in a semiconductor body along its upper surface, the two channel-zone locations having respective substantially parallel channel-length directions;

providing a mask over the semiconductor body and the gate electrodes such that the mask has at least one mask opening which at least partially overlies the gate electrodes, which defines opposite first and second primary transverse mask sides located laterally beyond the primary gate electrode and any material situated on opposite transverse sides of the primary gate electrode, and which defines opposite first and second additional transverse mask sides located laterally beyond the gate electrode and any material situated on opposite transverse sides of the additional gate electrode; and directing first ions of a species of a primary semiconductor dopant toward the mask and each mask opening at a first average tilt angle of at least 15° along paths that originate laterally beyond the two first transverse mask sides such that an electrically significant amount of the first ions passes through one such mask opening and enters the primary channel-zone location and such that the mask, the additional gate electrode, and any material situated along the additional gate electrode substantially block any electrically significant amount of the first ions from entering the additional channel-zone location, the first tilt angle being measured from a perpendicular to a plane extending generally along the semiconductor body's upper surface.

38. A method as in claim 37 wherein the channel-zone locations and the primary dopant are of the same conductivity type.

39. A method as in claim 37 further including the step of directing second ions of the species of the primary dopant toward the mask and each mask opening at a second average tilt angle of at least 15° along paths that originate laterally beyond the two second transverse mask sides such that the mask, the primary gate electrode, and any material along the primary gate electrode substantially block any electrically significant amount of the second ions from entering the primary channel-zone location and such that an electrically significant amount of the second ions passes through one such mask opening and enters the additional channel-zone location, the second tilt angle being measured from a perpendicular to a plane extending generally along the body's upper surface.

40. A method as in claim 39 wherein:

the primary gate electrode and any material situated on the primary gate electrode's transverse sides are further away from the first primary transverse mask side than from the second primary transverse mask side; and the additional gate electrode and any material situated on the additional gate electrode's transverse sides are further away from the second additional transverse mask side than from the first additional transverse mask side.

41. A method as in claim 39 wherein the tilt angles are within 10° of each other.

42. A method as in claim 37 wherein the at least one mask opening comprises a pair of laterally separated mask openings, each at least partially overlying a different one of the gate electrodes and extending laterally beyond that gate electrode and any material situated on that gate electrode's transverse sides.

43. A method as in claim 38 wherein the channel-zone locations and the primary dopant are of a first conductivity type, the method further including the step of introducing first semiconductor dopant of a second conductivity type opposite to the first conductivity type through at least one such mask opening, past the gate electrodes' transverse sides, and into the semiconductor body to at least partially define a pair of laterally separate source/drain zones of each transistor using the mask, the gate electrodes, and any material along the gate electrodes as a dopant-blocking shield.

44. A method as in claim 43 further including, subsequent to removing the mask, the steps of:

provinding spacer material over the gate electrodes' transverse sides;

providing a further mask over the semiconductor body and the gate electrodes such that the further mask has at least one further mask opening which at least partially overlies the gate electrodes and spacer material and which extends laterally beyond the gate electrodes and spacer material; and introducing second semiconductor dopant of the second conductivity type through the at least one further mask opening, past the spacer material, and into the semiconductor body to further define the source/drain zones of each transistor using the further mask, the gate electrodes, and the spacer material as a dopant-blocking shield.

* * * * *